US012585840B2

(12) United States Patent
Khan et al.

(10) Patent No.: US 12,585,840 B2
(45) Date of Patent: Mar. 24, 2026

(54) METHODS AND APPARATUS FOR DESIGNING DATACENTER FACILITIES

(71) Applicant: Rakuten Symphony, Inc., Tokyo (JP)

(72) Inventors: Azim Khan, Indore (IN); Utkarsh Chouhan, Indore (IN); Suyash Tiwari, Indore (IN); Shiva Shrivastava, Indore (IN)

(73) Assignee: RAKUTEN SYMPHONY, INC., Tokyo (JP)

( * ) Notice: Subject to any disclaimer, the term of this patent is extended or adjusted under 35 U.S.C. 154(b) by 1001 days.

(21) Appl. No.: 17/772,556

(22) PCT Filed: Jan. 26, 2022

(86) PCT No.: PCT/US2022/013781
§ 371 (c)(1),
(2) Date: Apr. 28, 2022

(87) PCT Pub. No.: WO2023/146515
PCT Pub. Date: Aug. 3, 2023

(65) Prior Publication Data
US 2024/0202384 A1     Jun. 20, 2024

(51) Int. Cl.
*G06F 30/18*     (2020.01)

(52) U.S. Cl.
CPC .................................... *G06F 30/18* (2020.01)

(58) Field of Classification Search
CPC .......... G06F 30/18; G06F 30/13; G06F 30/12; G06F 2111/00–2119/22; G06Q 10/06; G06Q 10/103; G06Q 50/08
See application file for complete search history.

(56) References Cited

U.S. PATENT DOCUMENTS

| | | | | |
|---|---|---|---|---|
| 2012/0253710 A1* | 10/2012 | Lehmann | .................. | G06F 1/26 |
| | | | | 713/300 |
| 2014/0352231 A1* | 12/2014 | Crosby, Jr. | ........... | H05K 7/1497 |
| | | | | 52/79.8 |
| 2022/0269635 A1* | 8/2022 | Nakanelua | .............. | G06F 30/27 |

OTHER PUBLICATIONS

International Search Report dated May 3, 2022, issued in International Application No. PCT/US2022/013781.
Written Opinion dated May 3, 2022, issued in International Application No. PCT/US2022/013781.

* cited by examiner

*Primary Examiner* — Rehana Perveen
*Assistant Examiner* — Troy A Maust
(74) *Attorney, Agent, or Firm* — Sughrue Mion, PLLC

(57)     ABSTRACT

Methods, apparatuses, and computer-readable mediums for designing a datacenter facility include receiving a first request to create a first facility; loading a set of predefined templates comprising at least one of a site template and a rack template; associating, with the first facility, one or more instances of at least one predefined template of the set of predefined templates; determining cable connectivity information of the first facility; displaying a first graphical representation of the first facility indicating the respective locations of the set of equipment associated with the first facility; generating one or more hostnames for addressable equipment of the set of equipment associated with the first facility; submitting the first facility for approval; and notifying the facility designer whether the first facility has been approved by the facility manager.

20 Claims, 39 Drawing Sheets

Figure 3:
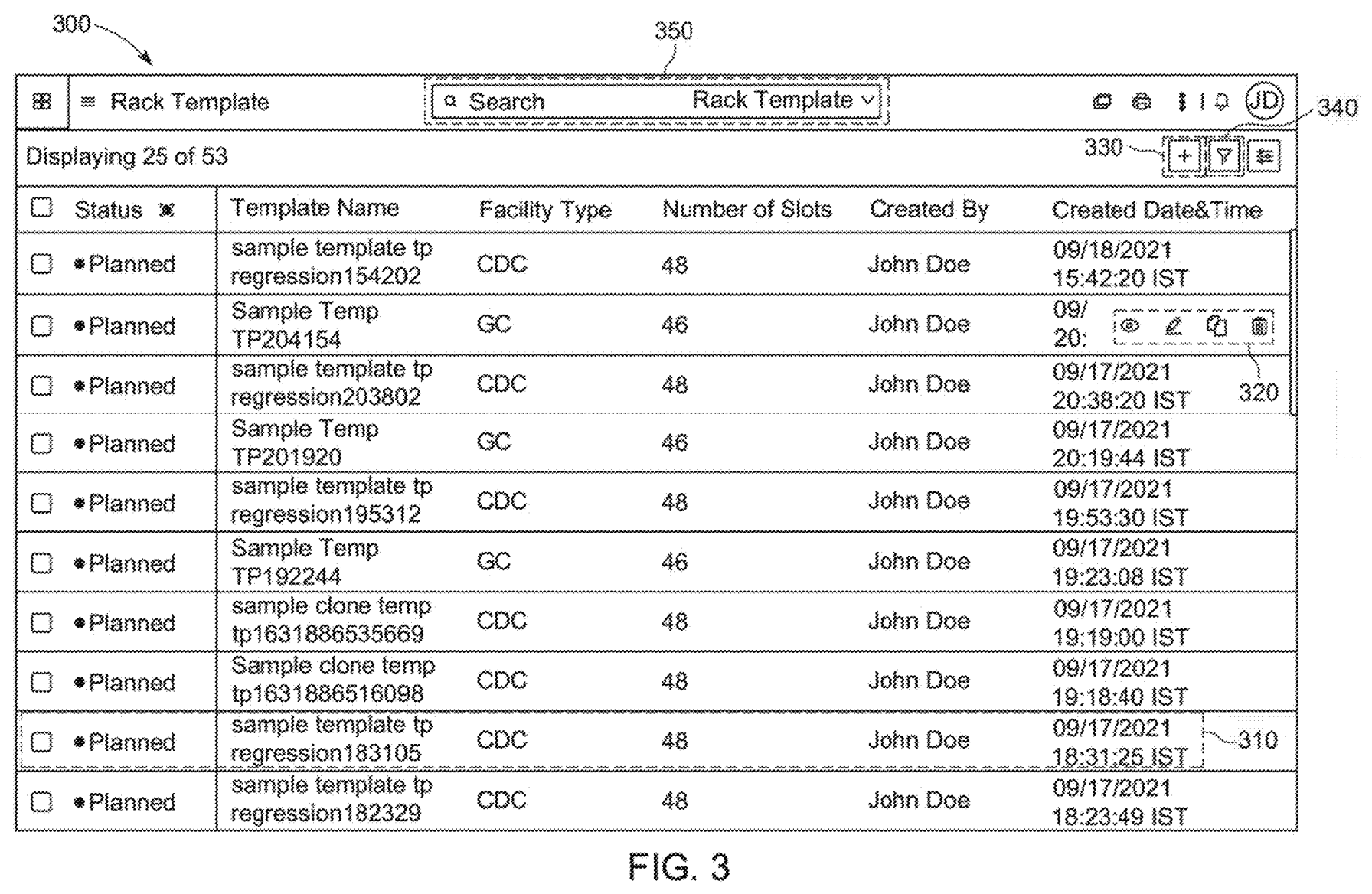

| Status ⚹ | Template Name | Facility Type | Number of Slots | Created By | Created Date&Time |
|---|---|---|---|---|---|
| ☐ ●Planned | sample template tp regression154202 | CDC | 48 | John Doe | 09/18/2021 15:42:20 IST |
| ☐ ●Planned | Sample Temp TP204154 | GC | 46 | John Doe | 09/ 20: |
| ☐ ●Planned | sample template tp regression203802 | CDC | 48 | John Doe | 09/17/2021 20:38:20 IST |
| ☐ ●Planned | Sample Temp TP201920 | GC | 46 | John Doe | 09/17/2021 20:19:44 IST |
| ☐ ●Planned | sample template tp regression195312 | CDC | 48 | John Doe | 09/17/2021 19:53:30 IST |
| ☐ ●Planned | Sample Temp TP192244 | GC | 46 | John Doe | 09/17/2021 19:23:08 IST |
| ☐ ●Planned | sample clone temp tp1631886535669 | CDC | 48 | John Doe | 09/17/2021 19:19:00 IST |
| ☐ ●Planned | Sample clone temp tp1631886516098 | CDC | 48 | John Doe | 09/17/2021 19:18:40 IST |
| ☐ ●Planned | sample template tp regression183105 | CDC | 48 | John Doe | 09/17/2021 18:31:25 IST |
| ☐ ●Planned | sample template tp regression182329 | CDC | 48 | John Doe | 09/17/2021 18:23:49 IST |

☰ Rack Template

Displaying 25 of 53

🔍 Search    Rack Template ⌄

Figure 10:
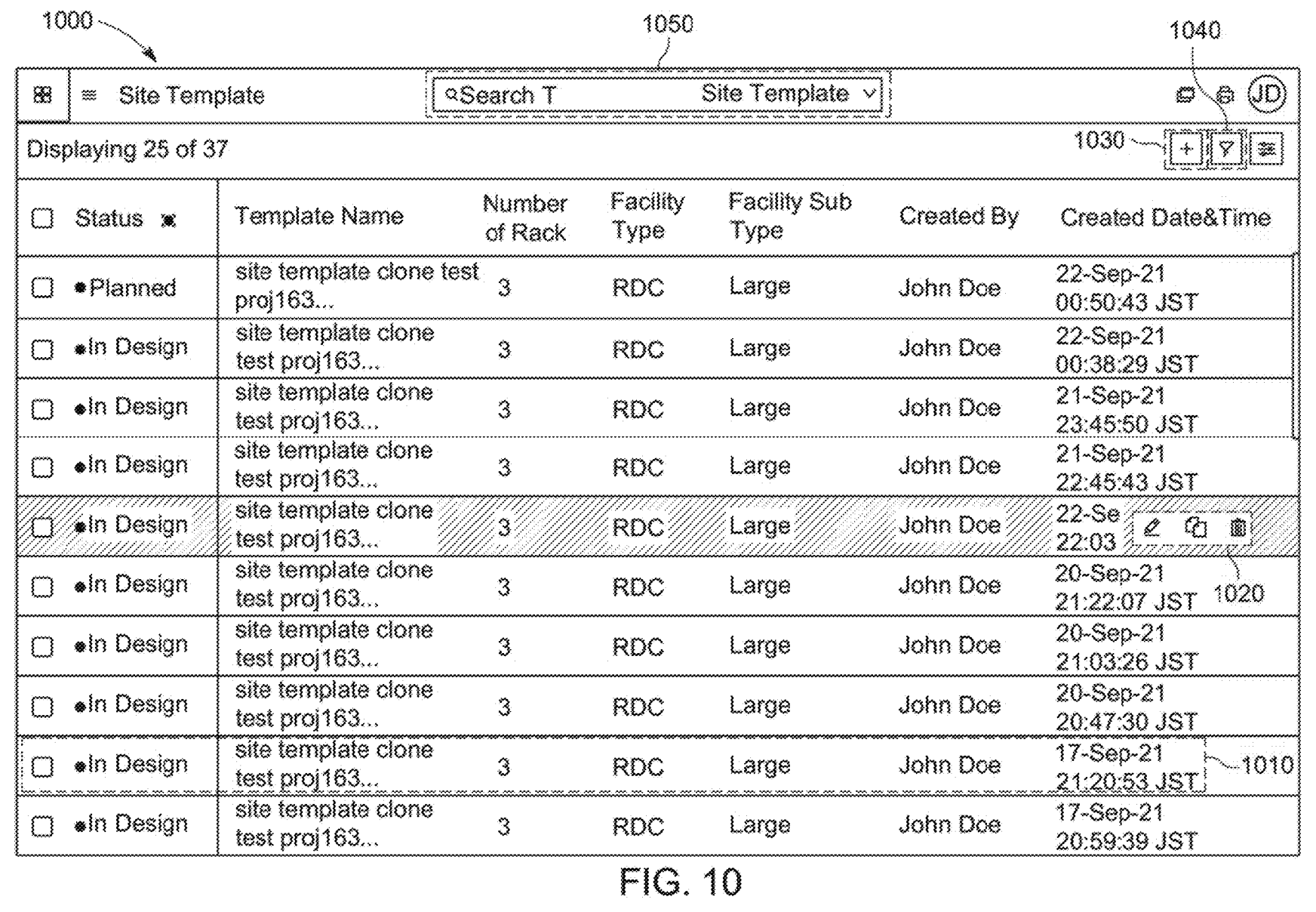

≡ Site Template

Displaying 25 of 37

1030

Site Template ∨

Search T

| Status ✱ | Template Name | Number of Rack | Facility Type | Facility Sub Type | Created By | Created Date&Time |
|---|---|---|---|---|---|---|
| ●Planned | site template clone test proj163... | 3 | RDC | Large | John Doe | 22-Sep-21 00:50:43 JST |
| ●In Design | site template clone test proj163... | 3 | RDC | Large | John Doe | 22-Sep-21 00:38:29 JST |
| ●In Design | site template clone test proj163... | 3 | RDC | Large | John Doe | 21-Sep-21 23:45:50 JST |
| ●In Design | site template clone test proj163... | 3 | RDC | Large | John Doe | 21-Sep-21 22:45:43 JST |
| ●In Design | site template clone test proj163... | 3 | RDC | Large | John Doe | 22-Se 22-03 |
| ●In Design | site template clone test proj163... | 3 | RDC | Large | John Doe | 20-Sep-21 21:22:07 JST |
| ●In Design | site template clone test proj163... | 3 | RDC | Large | John Doe | 20-Sep-21 21:03:26 JST |
| ●In Design | site template clone test proj163... | 3 | RDC | Large | John Doe | 20-Sep-21 20:47:30 JST |
| ●In Design | site template clone test proj163... | 3 | RDC | Large | John Doe | 17-Sep-21 21:20:53 JST |
| ●In Design | site template clone test proj163... | 3 | RDC | Large | John Doe | 17-Sep-21 20:59:39 JST |

= Facilities

Displaying 100 of 160

Q Search Faci    Facilities ∨

1430    1440

⊞ ⊚ ⊙ ⊗ ⊗ ⊚ ⊚ (JD)

+ ▽ ≡

| | Status ✕ | Facility Name ✕ | Facility ID | Facility Type | Facility Sub Type | Phase | City 1420 |
|---|---|---|---|---|---|---|---|
| ☐ | In Design | Sample Facility 001 | ID_001 | CDC | Small | - | Anytown |
| ☐ | In Design | Sample Facility 002 | ID_002 | CDC | Small | - | Anytown ✎ |
| ☐ | In Design | Sample Facility 003 | ID_003 | CDC | Small | ' | First town |
| ☐ | In Design | Sample Facility 004 | ID_004 | CDC | Small | ' | First town |
| ☐ | In Design | Sample Facility 005 | ID_005 | CDC | Small | ' | First town |
| ☐ | In Design | Sample Facility 006 | ID_006 | GC | Small | ' | Second town |
| ☐ | In Design | Sample Facility 007 | ID_007 | RDC | medium | ' | Third Town |
| ☐ | In Design | Sample Facility 008 | ID_008 | CDC | Small | ' | Third Town 1410 |
| ☐ | In Design | Sample Facility 009 | ID_009 | GC | Small | ' | Fourth town |
| ☐ | In Design | Sample Facility 010 | ID_010 | RDC | Small | ' | Fourth town |
| ☐ | In Design | Sample Facility 011 | ID_011 | CDC | Small | ' | Fifth town |

| | Status | Facility Name | Facility ID | Facility Type | Facility Sub Type | Phase | City |
|---|---|---|---|---|---|---|---|
| ☐ | In Design | Sample Facility 001 | ID_001 | RDC | Small | Phase 1-3 | Anytown |
| ☐ | In Design | Sample Facility 002 | ID_002 | CDC | Medium | - | Anytown |
| ☐ | In Design | Sample Facility 003 | ID_003 | RDC | Small | - | First Town |
| ☐ | In Design | Sample Facility 004 | ID_004 | RDC | Small | - | First Town |
| ☐ | In Design | Sample Facility 005 | ID_005 | GC | Medium | - | First Town |
| ☐ | In Design | Sample Facility 006 | ID_006 | GC | Medium | - | Second Town |
| ☐ | In Design | Sample Facility 007 | ID_007 | RDC | Small | - | Third Town |
| ☐ | In Design | Sample Facility 008 | ID_008 | RDC | Medium | Phase 1 | Third Town |
| ☐ | In Design | Sample Facility 009 | ID_009 | RDC | Medium | Phase 1 | Fourth Town |
| ☐ | In Design | Sample Facility 0010 | ID_0010 | RDC | Medium | Phase 1 | Fourth Town |
| ☐ | In Design | Sample Facility 0011 | ID_0011 | RDC | Medium | Phase 1 | Fifth Town |
| ☐ | In Design | Sample Facility 0012 | ID_0012 | GC | Small | - | Fifth Town |

Facilities

Q Search          Facilities ∨

Displaying 25 of 60

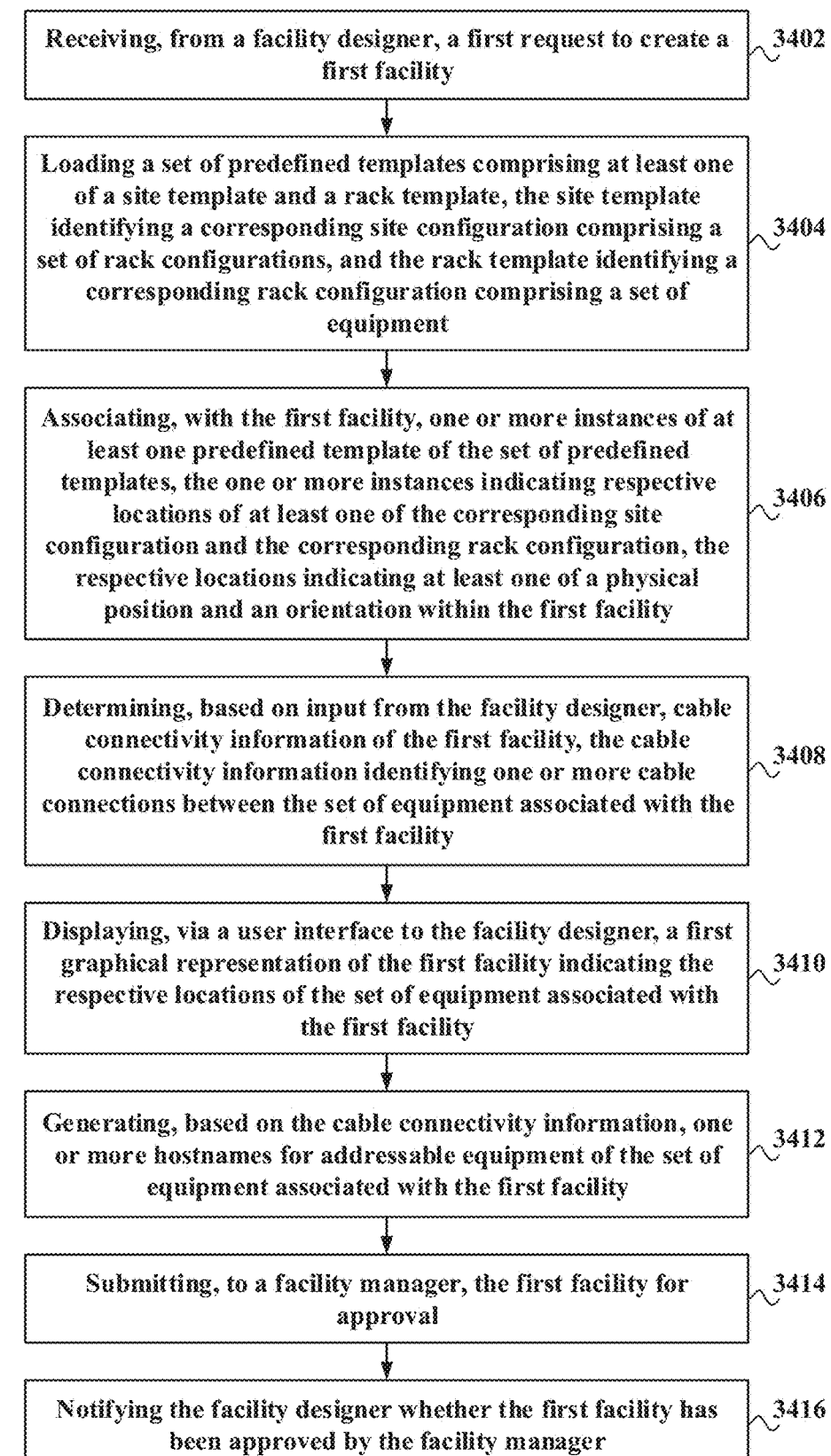

3400

Receiving, from a facility designer, a first request to create a first facility — 3402

Loading a set of predefined templates comprising at least one of a site template and a rack template, the site template identifying a corresponding site configuration comprising a set of rack configurations, and the rack template identifying a corresponding rack configuration comprising a set of equipment — 3404

Associating, with the first facility, one or more instances of at least one predefined template of the set of predefined templates, the one or more instances indicating respective locations of at least one of the corresponding site configuration and the corresponding rack configuration, the respective locations indicating at least one of a physical position and an orientation within the first facility — 3406

Determining, based on input from the facility designer, cable connectivity information of the first facility, the cable connectivity information identifying one or more cable connections between the set of equipment associated with the first facility — 3408

Displaying, via a user interface to the facility designer, a first graphical representation of the first facility indicating the respective locations of the set of equipment associated with the first facility — 3410

Generating, based on the cable connectivity information, one or more hostnames for addressable equipment of the set of equipment associated with the first facility — 3412

Submitting, to a facility manager, the first facility for approval — 3414

Notifying the facility designer whether the first facility has been approved by the facility manager — 3416

Figure 35:
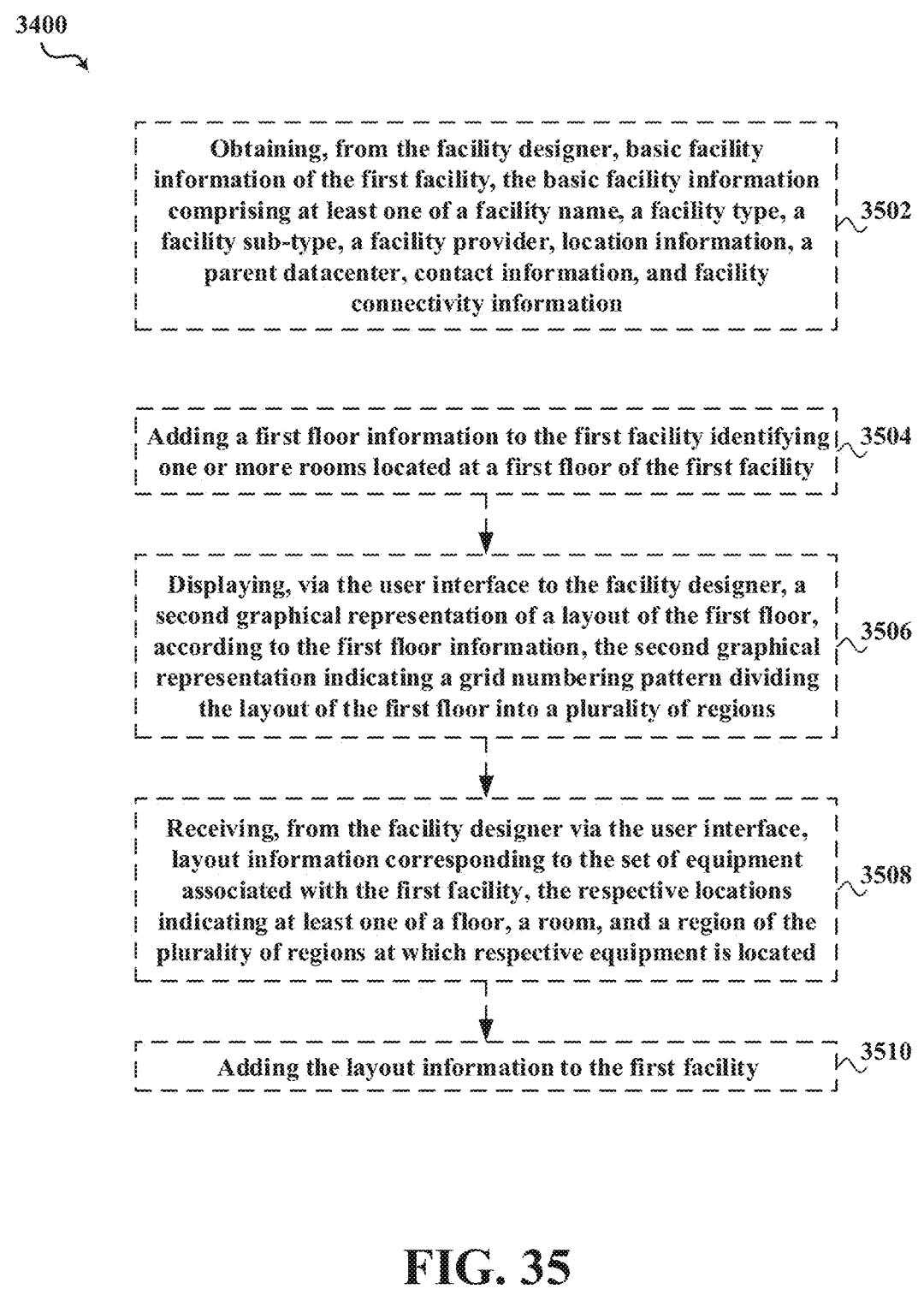

Obtaining, from the facility designer, basic facility information of the first facility, the basic facility information comprising at least one of a facility name, a facility type, a facility sub-type, a facility provider, location information, a parent datacenter, contact information, and facility connectivity information — 3502

Adding a first floor information to the first facility identifying one or more rooms located at a first floor of the first facility — 3504

Displaying, via the user interface to the facility designer, a second graphical representation of a layout of the first floor, according to the first floor information, the second graphical representation indicating a grid numbering pattern dividing the layout of the first floor into a plurality of regions — 3506

Receiving, from the facility designer via the user interface, layout information corresponding to the set of equipment associated with the first facility, the respective locations indicating at least one of a floor, a room, and a region of the plurality of regions at which respective equipment is located — 3508

Adding the layout information to the first facility — 3510

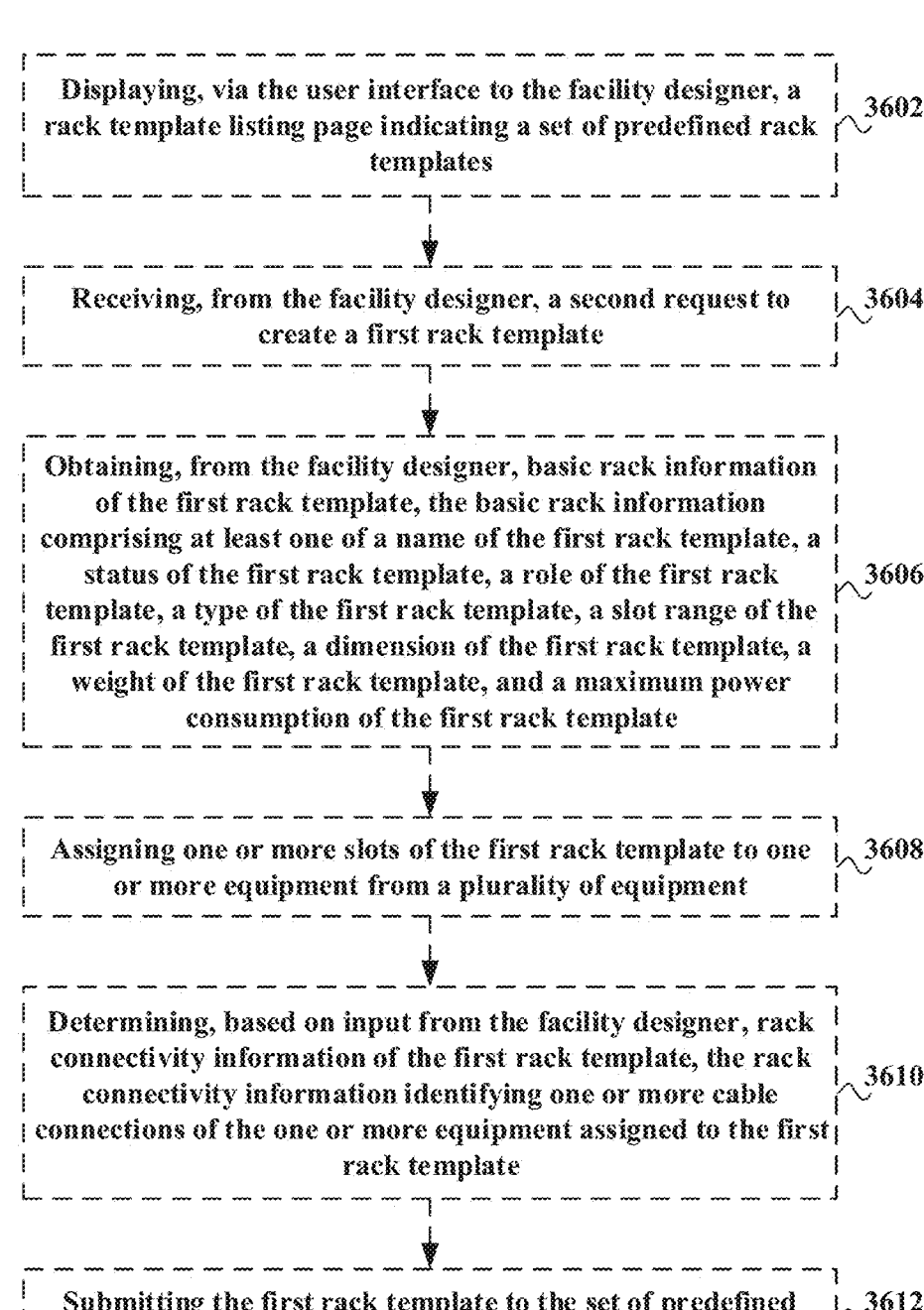

Displaying, via the user interface to the facility designer, a rack template listing page indicating a set of predefined rack templates    3602

Receiving, from the facility designer, a second request to create a first rack template    3604

Obtaining, from the facility designer, basic rack information of the first rack template, the basic rack information comprising at least one of a name of the first rack template, a status of the first rack template, a role of the first rack template, a type of the first rack template, a slot range of the first rack template, a dimension of the first rack template, a weight of the first rack template, and a maximum power consumption of the first rack template    3606

Assigning one or more slots of the first rack template to one or more equipment from a plurality of equipment    3608

Determining, based on input from the facility designer, rack connectivity information of the first rack template, the rack connectivity information identifying one or more cable connections of the one or more equipment assigned to the first rack template    3610

Submitting the first rack template to the set of predefined rack templates    3612

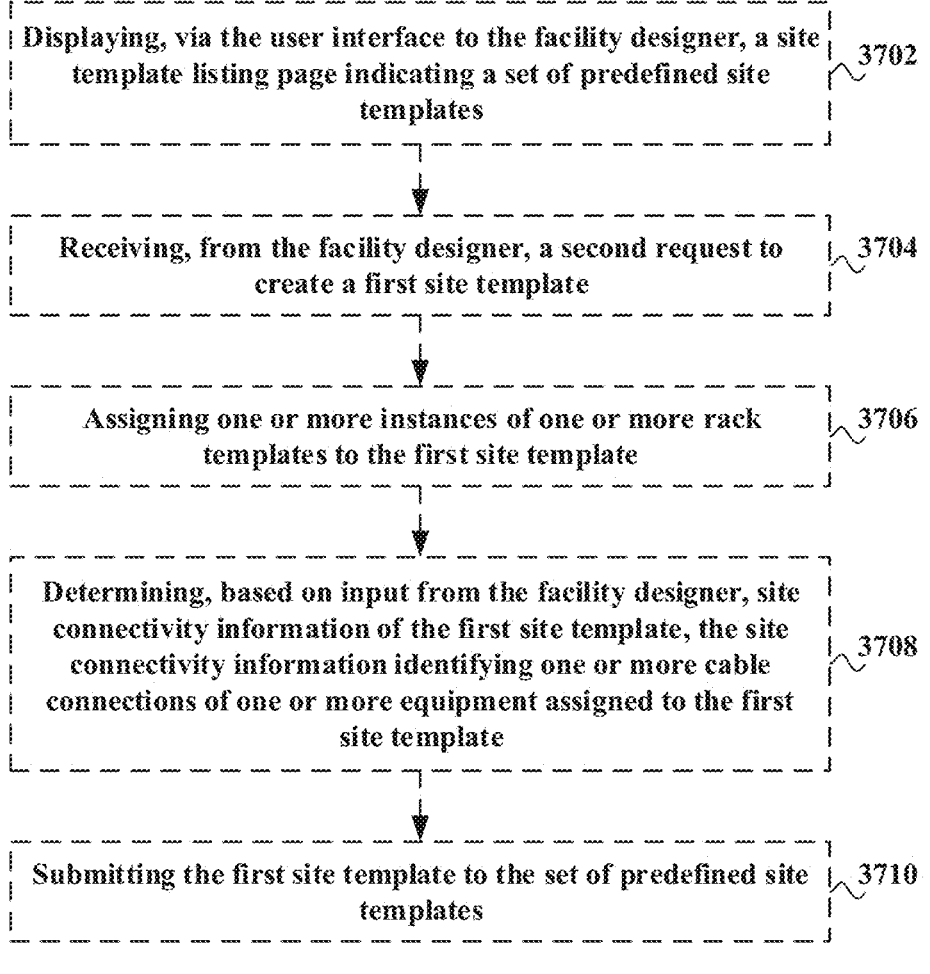

Displaying, via the user interface to the facility designer, a site template listing page indicating a set of predefined site templates     3702

Receiving, from the facility designer, a second request to create a first site template     3704

Assigning one or more instances of one or more rack templates to the first site template     3706

Determining, based on input from the facility designer, site connectivity information of the first site template, the site connectivity information identifying one or more cable connections of one or more equipment assigned to the first site template     3708

Submitting the first site template to the set of predefined site templates     3710

FIG. 37

3400

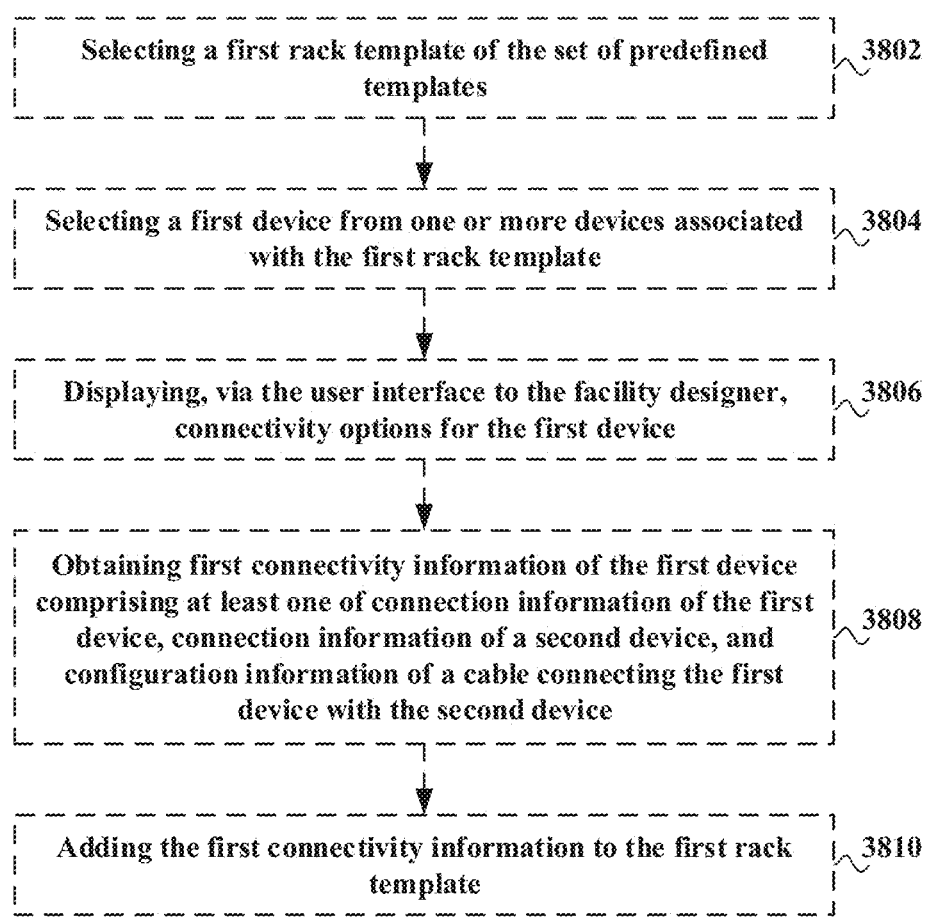

Selecting a first rack template of the set of predefined templates    3802

Selecting a first device from one or more devices associated with the first rack template    3804

Displaying, via the user interface to the facility designer, connectivity options for the first device    3806

Obtaining first connectivity information of the first device comprising at least one of connection information of the first device, connection information of a second device, and configuration information of a cable connecting the first device with the second device    3808

Adding the first connectivity information to the first rack template    3810

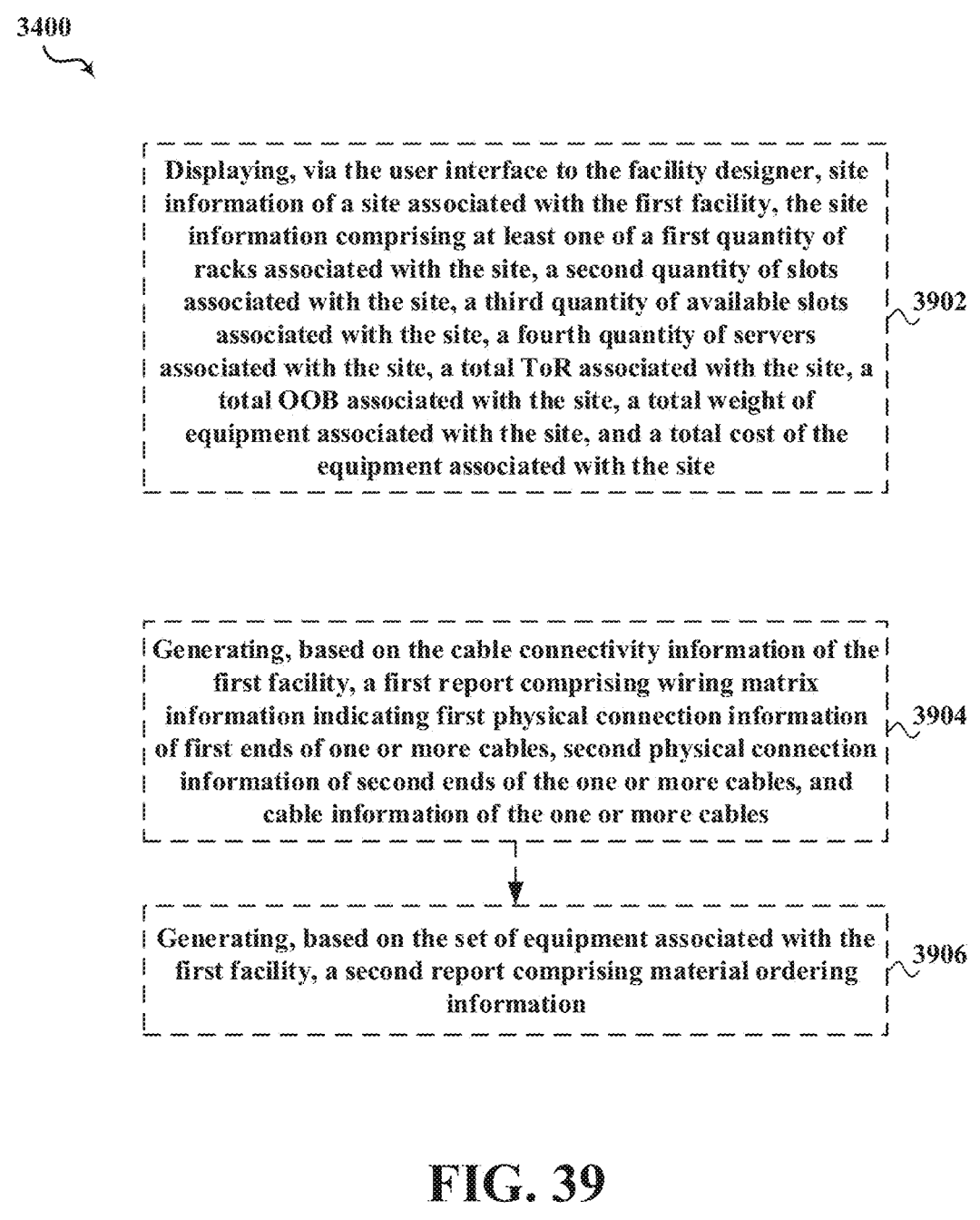

Displaying, via the user interface to the facility designer, site
information of a site associated with the first facility, the site
information comprising at least one of a first quantity of
racks associated with the site, a second quantity of slots
associated with the site, a third quantity of available slots     3902
associated with the site, a fourth quantity of servers
associated with the site, a total ToR associated with the site, a
total OOB associated with the site, a total weight of
equipment associated with the site, and a total cost of the
equipment associated with the site Generating, based on the cable connectivity information of the
first facility, a first report comprising wiring matrix
information indicating first physical connection information     3904
of first ends of one or more cables, second physical connection
information of second ends of the one or more cables, and
cable information of the one or more cables Generating, based on the set of equipment associated with the
first facility, a second report comprising material ordering     3906
information

FIG. 39

METHODS AND APPARATUS FOR DESIGNING DATACENTER FACILITIES

CROSS REFERENCE TO RELATED APPLICATIONS

This application is a National Stage of International Application No. PCT/US2020/013781 filed Jan. 26, 2022.

BACKGROUND

Technical Field

The present disclosure relates to design of datacenter facilities, and particularly to methods and apparatus for creating and managing site templates and rack templates.

Description of Related Art

Conventionally, design and management of datacenter facilities may need to be performed manually. For example, a facility designer may need to manually determine placement of equipment within the facility and/or connections between the devices of the facility. As such, equipment location and/or connectivity information may only be ascertained by physically going on-site to the facility. Consequently, approval of a datacenter facility design may be difficult to obtain prior to commissioning and building of the facility. In addition, faults in the commissioning of the facility, such as a fault in a connection and/or a device, may be difficult to identify without a representation and/or visualization of the layout and the connection configurations of the facility.

Thus, there exists a need for improvements in the design and management of datacenter facilities. In particular, there is a need for methods and apparatuses for designing and managing datacenter facilities using site templates and rack templates. Improvements are presented herein. These improvements may also be applicable to the design and management of other facility types.

SUMMARY

The following presents a simplified summary of one or more embodiments of the present disclosure in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments of the present disclosure in a simplified form as a prelude to the more detailed description that is presented later.

Methods, apparatuses, and non-transitory computer-readable mediums for designing a datacenter facility are disclosed by the present disclosure.

According to embodiments, a method for designing a datacenter facility includes receiving, from a facility designer, a first request to create a first facility. The method further includes loading a set of predefined templates comprising at least one of a site template and a rack template. The site template identifies a corresponding site configuration comprising a set of rack configurations. The rack template identifies a corresponding rack configuration comprising a set of equipment. The method further includes associating, with the first facility, one or more instances of at least one predefined template of the set of predefined templates. The one or more instances indicate respective locations of at least one of the corresponding site configuration and the corresponding rack configuration. The respective locations indicate at least one of a physical position and an orientation within the first facility. The method further includes determining, based on input from the facility designer, cable connectivity information of the first facility. The cable connectivity information identifies one or more cable connections between the set of equipment associated with the first facility. The method further includes displaying, via a user interface to the facility designer, a first graphical representation of the first facility indicating the respective locations of the set of equipment associated with the first facility. The method further includes generating, based on the cable connectivity information, one or more hostnames for addressable equipment of the set of equipment associated with the first facility. The method further includes submitting, to a facility manager, the first facility for approval. The method further includes notifying the facility designer whether the first facility has been approved by the facility manager.

According to embodiments, an apparatus for designing a datacenter facility includes a memory storage storing computer-executable instructions, and a processor communicatively coupled to the memory storage. The processor is configured to execute the computer-executable instructions and cause the apparatus to receive, from a facility designer, a first request to create a first facility. The computer-executable instructions, when executed by the processor, further cause the apparatus to load a set of predefined templates comprising at least one of a site template and a rack template. The site template identifies a corresponding site configuration comprising a set of rack configurations. The rack template identifies a corresponding rack configuration comprising a set of equipment. The computer-executable instructions, when executed by the processor, further cause the apparatus to associate, with the first facility, one or more instances of at least one predefined template of the set of predefined templates. The one or more instances indicate respective locations of at least one of the corresponding site configuration and the corresponding rack configuration. The respective locations indicate at least one of a physical position and an orientation within the first facility. The computer-executable instructions, when executed by the processor, further cause the apparatus to determine, based on input from the facility designer, cable connectivity information of the first facility. The cable connectivity information identifies one or more cable connections between the set of equipment associated with the first facility. The computer-executable instructions, when executed by the processor, further cause the apparatus to display, via a user interface to the facility designer, a first graphical representation of the first facility indicating the respective locations of the set of equipment associated with the first facility. The computer-executable instructions, when executed by the processor, further cause the apparatus to generate, based on the cable connectivity information, one or more hostnames for addressable equipment of the set of equipment associated with the first facility. The computer-executable instructions, when executed by the processor, further cause the apparatus to submit, to a facility manager, the first facility for approval. The computer-executable instructions, when executed by the processor, further cause the apparatus to notify the facility designer whether the first facility has been approved by the facility manager.

According to embodiments, a non-transitory computer-readable medium includes computer-executable instructions for designing a datacenter facility by an apparatus. The computer-executable instructions, when executed by at least one processor of the apparatus, cause the apparatus to receive, from a facility designer, a first request to create a first facility. The computer-executable instructions, when executed by at least one processor of the apparatus, further cause the apparatus to load a set of predefined templates comprising at least one of a site template and a rack template. The site template identifies a corresponding site configuration comprising a set of rack configurations. The rack template identifies a corresponding rack configuration comprising a set of equipment. The computer-executable instructions, when executed by at least one processor of the apparatus, further cause the apparatus to associate, with the first facility, one or more instances of at least one predefined template of the set of predefined templates. The one or more instances indicate respective locations of at least one of the corresponding site configuration and the corresponding rack configuration. The respective locations indicate at least one of a physical position and an orientation within the first facility. The computer-executable instructions, when executed by at least one processor of the apparatus, further cause the apparatus to determine, based on input from the facility designer, cable connectivity information of the first facility. The cable connectivity information identifying one or more cable connections between the set of equipment associated with the first facility. The computer-executable instructions, when executed by at least one processor of the apparatus, further cause the apparatus to display, via a user interface to the facility designer, a first graphical representation of the first facility indicating the respective locations of the set of equipment associated with the first facility. The computer-executable instructions, when executed by at least one processor of the apparatus, further cause the apparatus to generate, based on the cable connectivity information, one or more hostnames for addressable equipment of the set of equipment associated with the first facility. The computer-executable instructions, when executed by at least one processor of the apparatus, further cause the apparatus to submit, to a facility manager, the first facility for approval. The computer-executable instructions, when executed by at least one processor of the apparatus, further cause the apparatus to notify the facility designer whether the first facility has been approved by the facility manager.

Additional embodiments will be set forth in the description that follows and, in part, will be apparent from the description, and/or may be learned by practice of the presented embodiments of the disclosure.

BRIEF DESCRIPTION OF THE DRAWINGS

The above and other aspects, features, and aspects of embodiments of the disclosure will be apparent from the following description taken in conjunction with the accompanying drawings, in which:

FIG. 3 is an example of a rack template listing page, in accordance with various embodiments of the present disclosure;

FIG. 10 is an example of a site template listing page, in accordance with various embodiments of the present disclosure;

FIG. 14 is an example of facility listing page, in accordance with various embodiments of the present disclosure;

5

Figure 27:
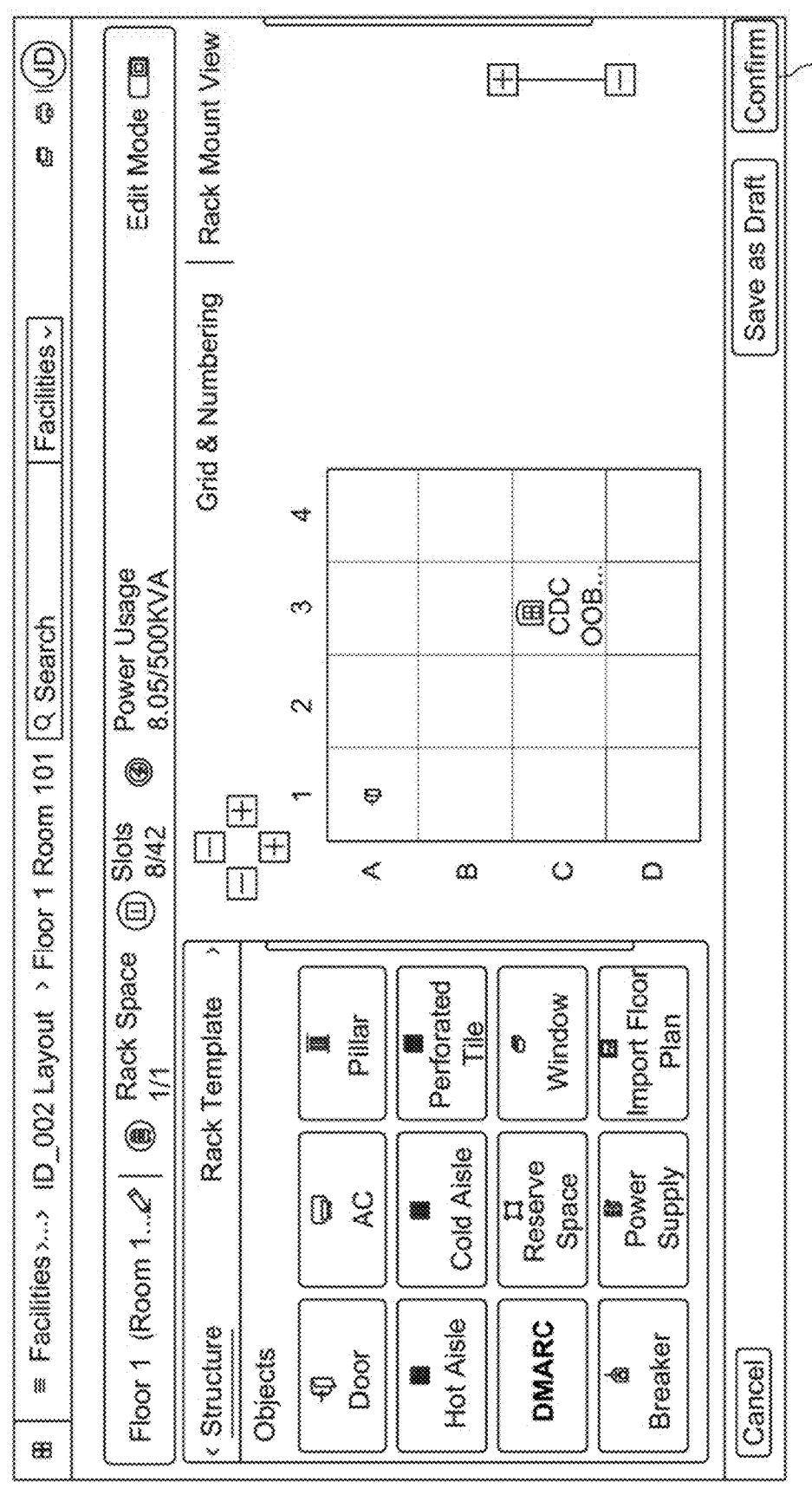
Figure 28:
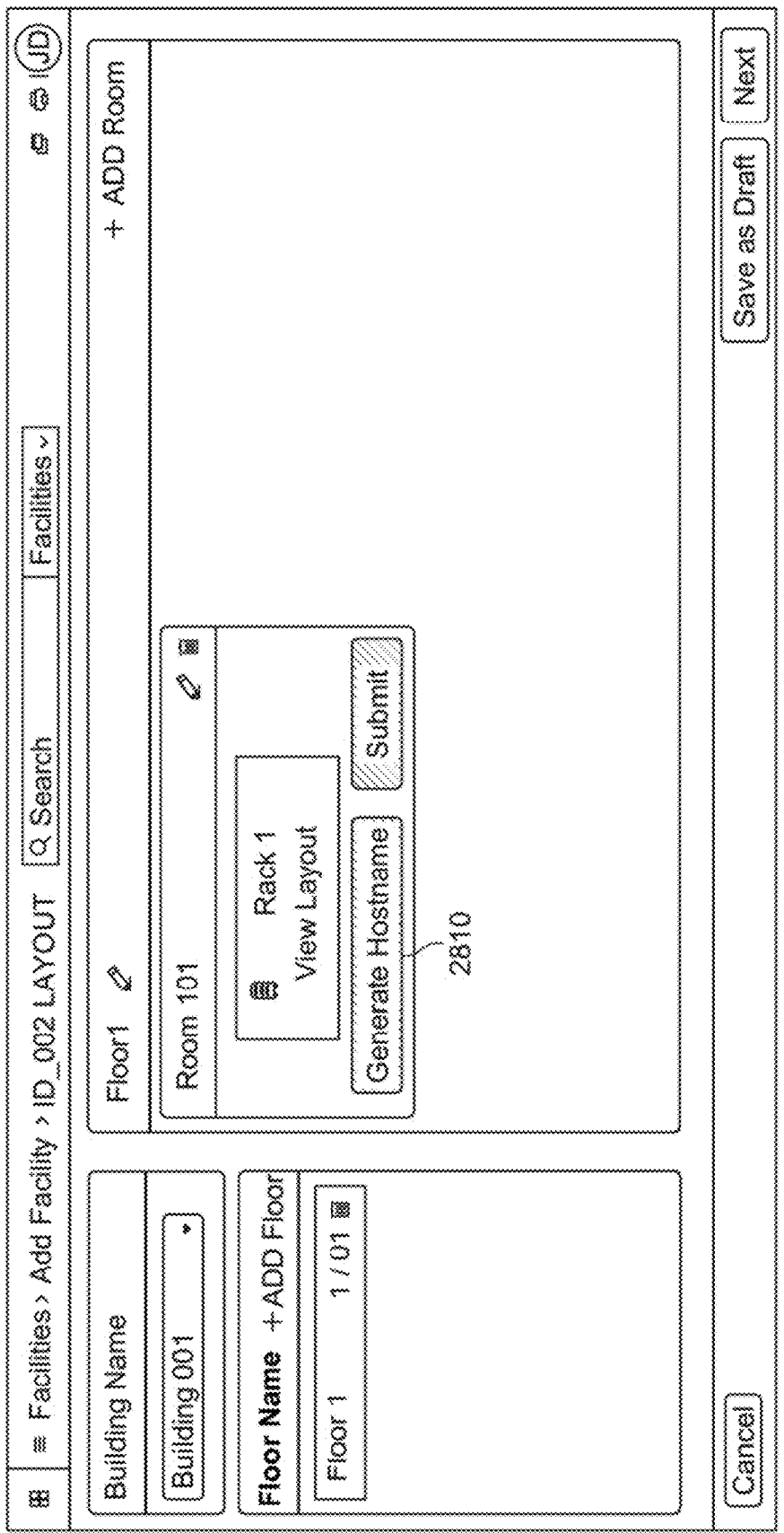
Figure 30:
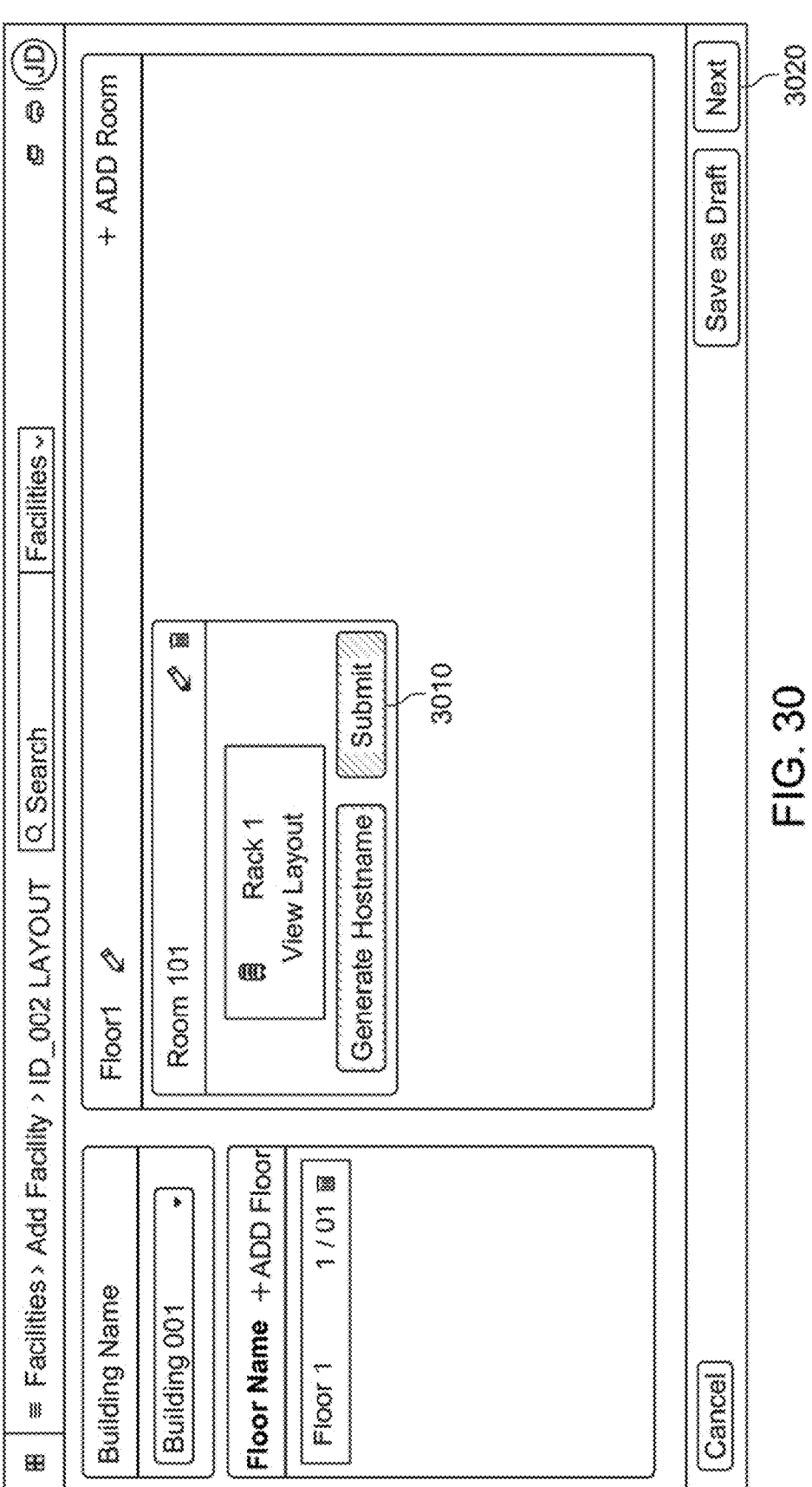
Figure 33:
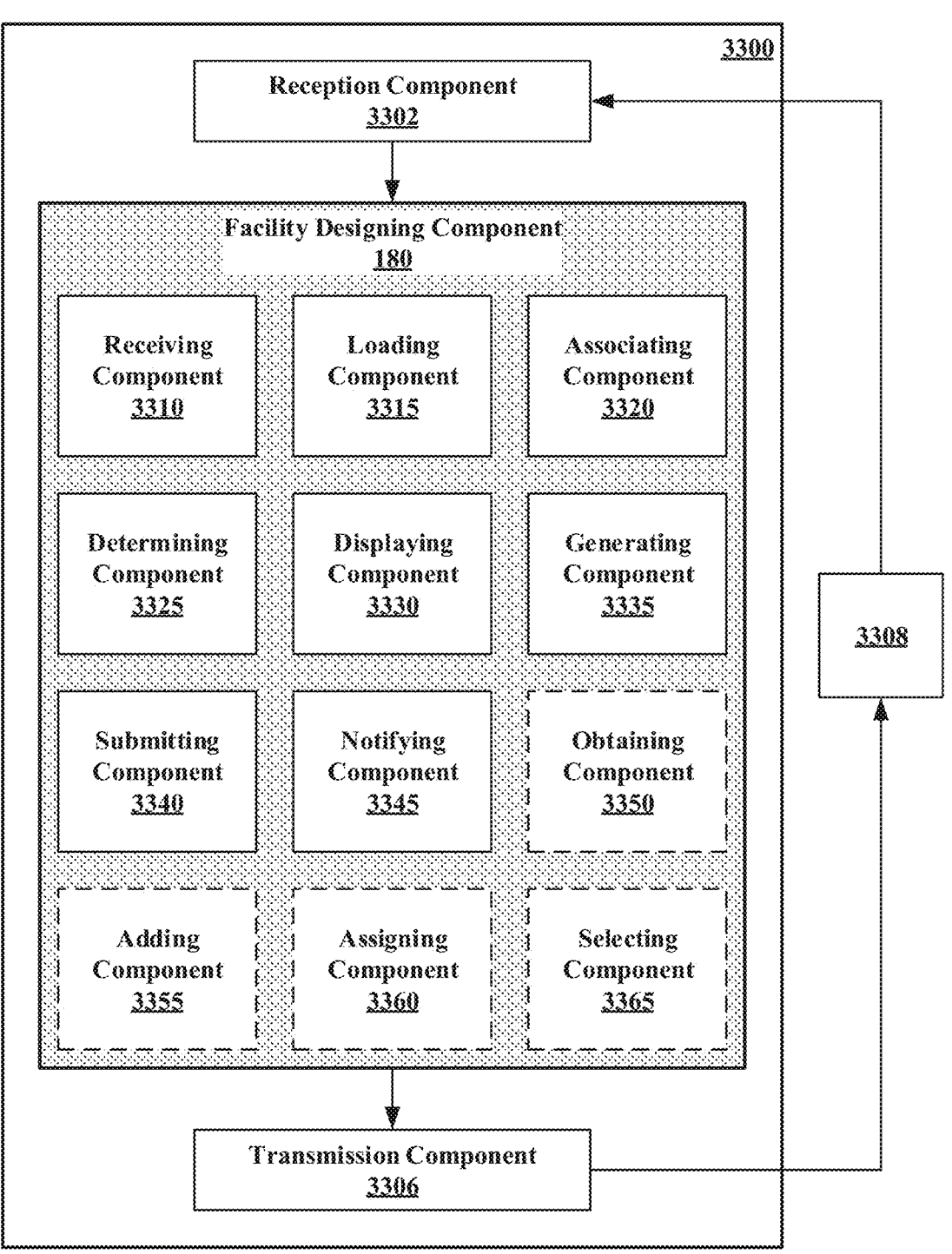

FIG. 27 is an example of a third user interface for defining a room layout of a facility, in accordance with various embodiments of the present disclosure;

FIG. 28 is an example of a first user interface for generating hostnames of a facility, in accordance with various embodiments of the present disclosure;

Figure 29:
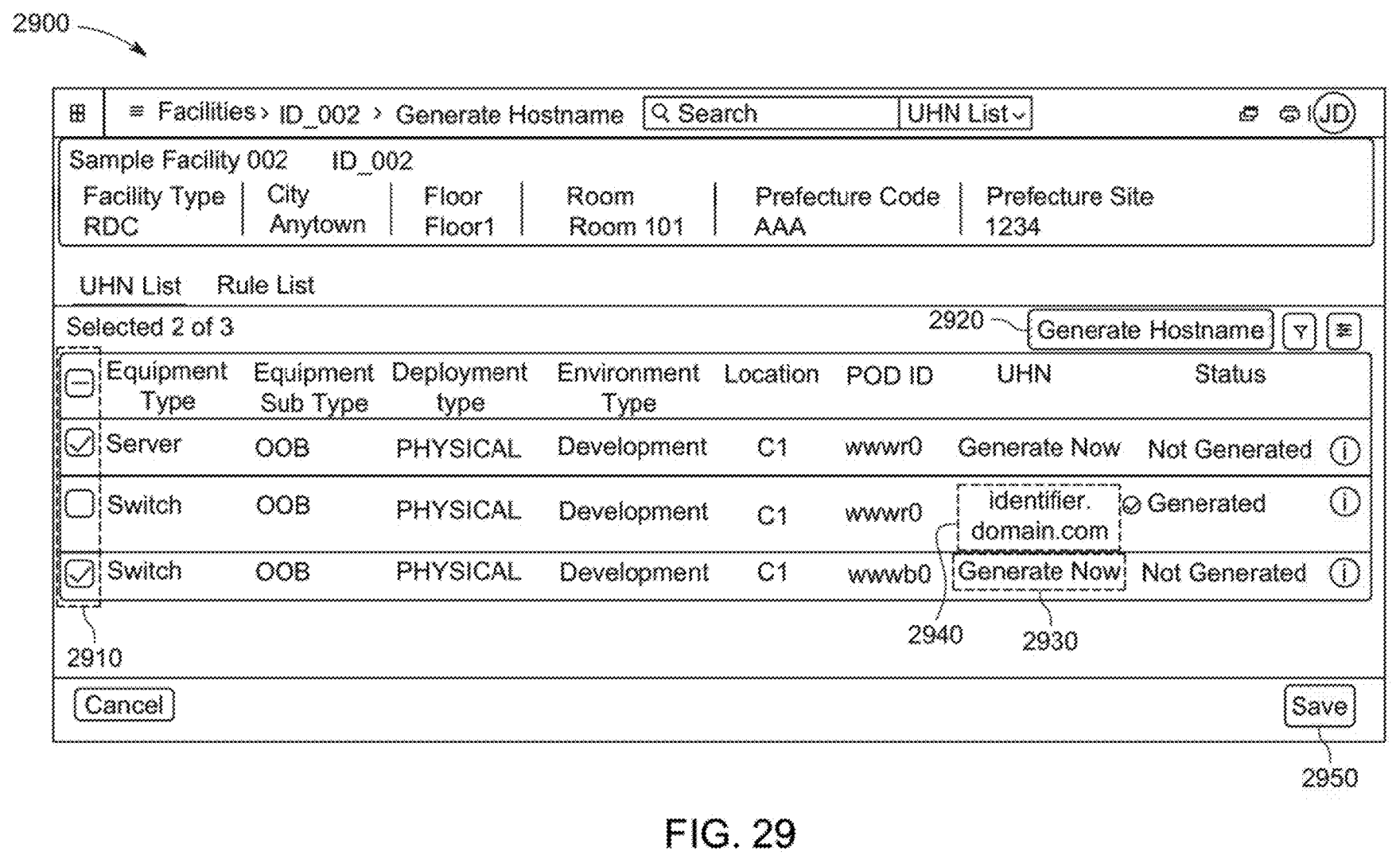

FIG. 29 is an example of a second user interface for generating hostnames of a facility, in accordance with various embodiments of the present disclosure;

FIG. 30 is an example of a user interface for submitting a design of a facility, in accordance with various embodiments of the present disclosure;

FIG. 31 is an example of a first user interface for approving a design of a facility, in accordance with various embodiments of the present disclosure;

Figure 32:
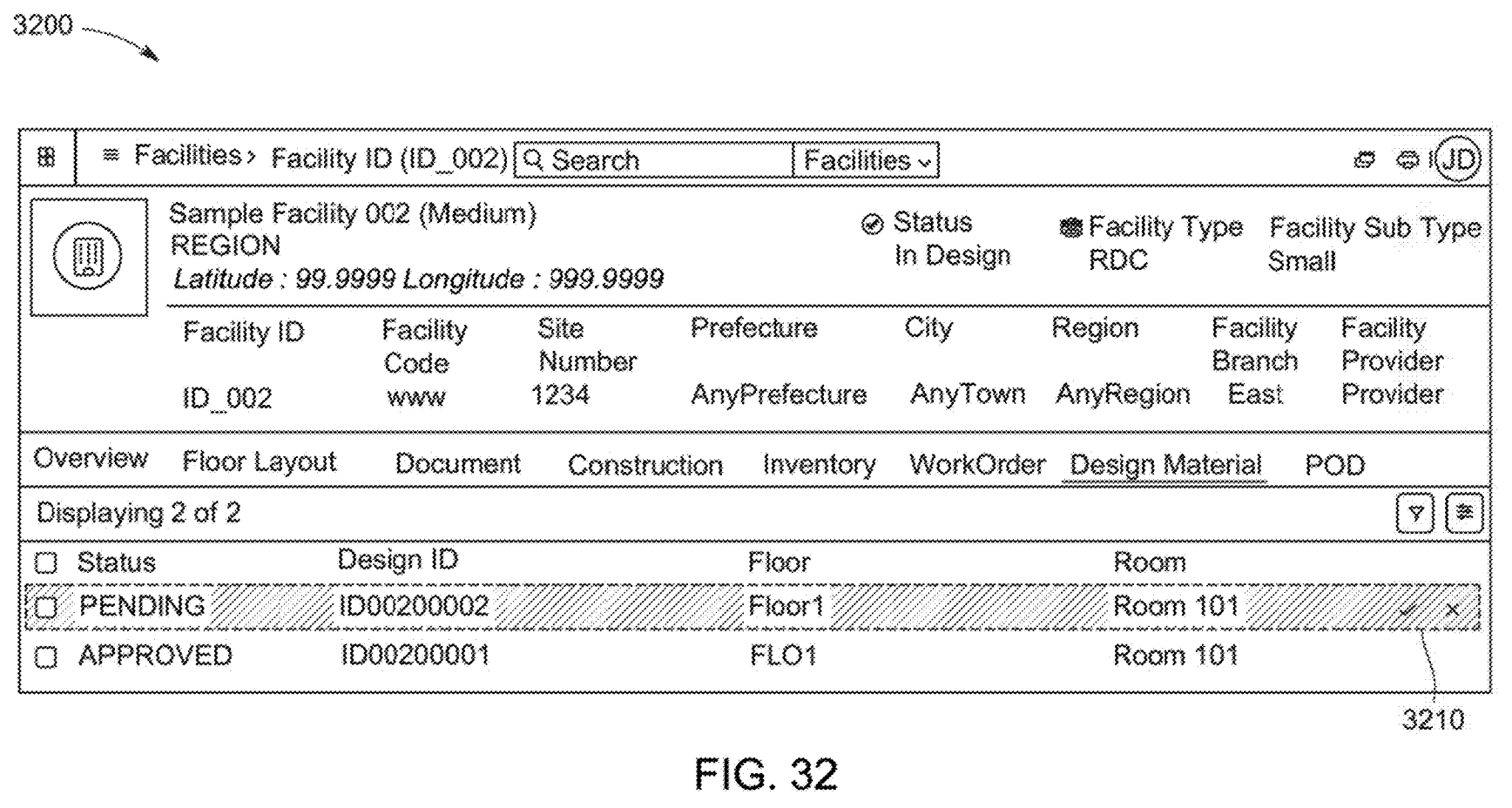

FIG. 32 is an example of a second user interface for approving a design of a facility, in accordance with various embodiments of the present disclosure;

FIG. 33 is a block diagram of an example apparatus for designing datacenter facilities, in accordance with various embodiments of the present disclosure;

FIG. 34 is flowchart of an example method of designing datacenter facilities by an apparatus, in accordance with various embodiments of the present disclosure;

FIG. 35 is a flowchart of first additional or optional steps for the example method of designing datacenter facilities by an apparatus, in accordance with various embodiments of the present disclosure;

FIG. 36 is a flowchart of second additional or optional steps for the example method of designing datacenter facilities by an apparatus, in accordance with various embodiments of the present disclosure;

FIG. 37 is a flowchart of third additional or optional steps for the example method of designing datacenter facilities by an apparatus, in accordance with various embodiments of the present disclosure;

FIG. 38 is a flowchart of fourth additional or optional steps for the example method of designing datacenter facilities by an apparatus, in accordance with various embodiments of the present disclosure;

FIG. 39 is a flowchart of fifth additional or optional steps for the example method of designing datacenter facilities by an apparatus, in accordance with various embodiments of the present disclosure.

DETAILED DESCRIPTION

The following detailed description of example embodiments refers to the accompanying drawings. The same reference numbers in different drawings may identify the same or similar elements.

The foregoing disclosure provides illustration and description, but is not intended to be exhaustive or to limit the implementations to the precise form disclosed. Modifications and variations are possible in light of the above disclosure or may be acquired from practice of the implementations. Further, one or more features or components of one embodiment may be incorporated into or combined with another embodiment (or one or more features of another embodiment). Additionally, in the flowcharts and descriptions of operations provided below, it is understood that one or more operations may be omitted, one or more operations may be added, one or more operations may be performed simultaneously (at least in part), and the order of one or more operations may be switched.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Also, as used herein, the terms "has," "have," "having," "include," "including," or the like are intended to be open-ended terms. Further, the phrase "based on" is intended to mean "based, at least in part, on" unless explicitly stated otherwise. Furthermore, expressions such as "at least one of [A] and [B]" or "at least one of [A] or [B]" are to be understood as including only A, only B, or both A and B.

Reference throughout this specification to "one embodiment," "an embodiment," or similar language means that a particular feature, structure, or characteristic described in connection with the indicated embodiment is included in at least one embodiment of the present solution. Thus, the phrases "in one embodiment", "in an embodiment," and similar language throughout this specification may, but do not necessarily, all refer to the same embodiment.

Furthermore, the described features, advantages, and characteristics of the present disclosure may be combined in any suitable manner in one or more embodiments. One skilled in the relevant art will recognize, in light of the description herein, that the present disclosure can be practiced without one or more of the specific features or advantages of a particular embodiment. In other instances, additional features and advantages may be recognized in certain embodiments that may not be present in all embodiments of the present disclosure.

Design and management of datacenter facilities may have conventionally been performed manually. For example, layout of equipment in a rack and/or layout of racks within a facility may have been performed manually. Such conventional techniques may not provide for prior approval of datacenter designs. Alternatively or additionally, the conventional techniques may not provide for ease in fault detection if or when a fault connection or a device fault occurs.

Example embodiments of the present disclosure provide for methods and apparatuses for datacenter facility design and management that may provide for creation of datacenter facility designs using predefined rack templates and/or site templates. The datacenter facility designs may provide a visual representation of floors and/or rooms in the datacenter facility, as well as, layout of racks and equipment within the datacenter facility. Example embodiments of the present disclosure may further provide for report generation of the datacenter facility that may facilitate construction, commissioning, and management of the datacenter facility. Further, example embodiments presented herein may improve modeling, allocation, and provisioning of equipment at a datacenter facility.

Figure 1:
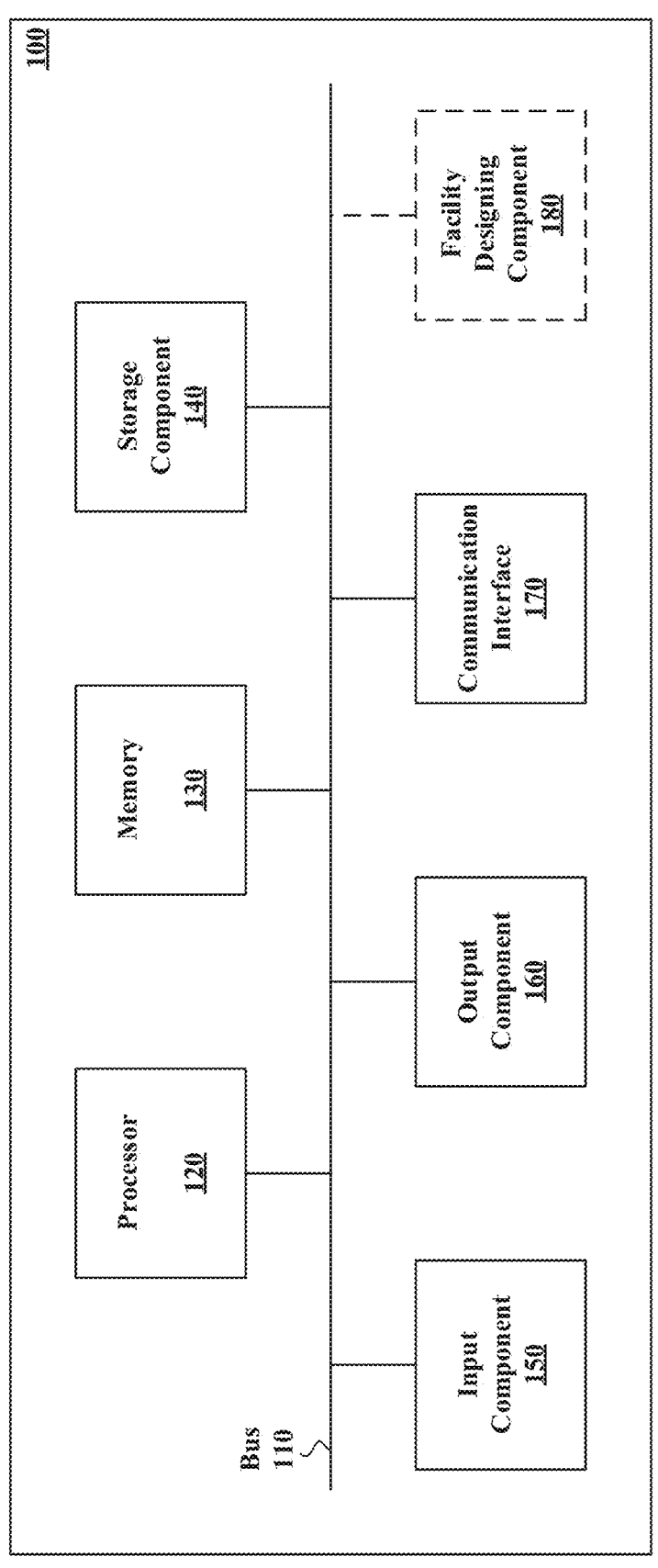
FIG. 1 is a diagram of an example device for designing datacenter facilities, in accordance with various embodiments of the present disclosure.

FIG. 1 is diagram of an example device for designing datacenter facilities. Device 100 may correspond to any type of known computer, server, or data processing device. For example, the device 100 may comprise a processor, a personal computer (PC), a printed circuit board comprising a computing device, a mini-computer, a mainframe computer, a microcomputer, a telephonic computing device, a wired/wireless computing device (e.g., a smartphone, a personal digital assistant (PDA)), a laptop, a tablet, a smart device, a wearable device, or any other similar functioning device.

In some embodiments, as shown in FIG. 1, the device 100 may include a set of components, such as a processor 120, a memory 130, a storage component 140, an input component 150, an output component 160, a communication interface 170, and a facility designing component 180. The set of components of the device 100 may be communicatively coupled via a bus 110.

The bus 110 may comprise one or more components that permit communication among the set of components of the device 100. For example, the bus 110 may be a communication bus, a cross-over bar, a network, or the like. Although the bus 110 is depicted as a single line in FIG. 1, the bus 110 may be implemented using multiple (two or more) connections between the set of components of device 100. The disclosure is not limited in this regard.

The device 100 may comprise one or more processors, such as the processor 120. The processor 120 may be implemented in hardware, firmware, and/or a combination of hardware and software. For example, the processor 120 may comprise a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), a general purpose single-chip or multi-chip processor, or other programmable logic device, discrete gate or transistor logic, discrete hardware components, or any combination thereof designed to perform the functions described herein. A general purpose processor may be a microprocessor, or any conventional processor, controller, microcontroller, or state machine. The processor 120 also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function.

The processor 120 may control overall operation of the device 100 and/or of the set of components of device 100 (e.g., the memory 130, the storage component 140, the input component 150, the output component 160, the communication interface 170, the facility designing component 180).

The device 100 may further comprise the memory 130. In some embodiments, the memory 130 may comprise a random access memory (RAM), a read only memory (ROM), an electrically erasable programmable ROM (EEPROM), a flash memory, a magnetic memory, an optical memory, and/or another type of dynamic or static storage device. The memory 130 may store information and/or instructions for use (e.g., execution) by the processor 120.

The storage component 140 of device 100 may store information and/or computer-readable instructions and/or code related to the operation and use of the device 100. For example, the storage component 140 may include a hard disk (e.g., a magnetic disk, an optical disk, a magneto-optic disk, and/or a solid state disk), a compact disc (CD), a digital versatile disc (DVD), a universal serial bus (USB) flash drive, a Personal Computer Memory Card International Association (PCMCIA) card, a floppy disk, a cartridge, a magnetic tape, and/or another type of non-transitory computer-readable medium, along with a corresponding drive.

The device 100 may further comprise the input component 150. The input component 150 may include one or more components that permit the device 100 to receive information, such as via user input (e.g., a touch screen, a keyboard, a keypad, a mouse, a stylus, a button, a switch, a microphone, a camera, and the like). Alternatively or additionally, the input component 150 may include a sensor for sensing information (e.g., a global positioning system (GPS) component, an accelerometer, a gyroscope, an actuator, and the like).

The output component 160 of device 100 may include one or more components that may provide output information from the device 100 (e.g., a display, a liquid crystal display (LCD), light-emitting diodes (LEDs), organic light emitting diodes (OLEDs), a haptic feedback device, a speaker, and the like).

The device 100 may further comprise the communication interface 170. The communication interface 170 may include a receiver component, a transmitter component, and/or a transceiver component. The communication interface 170 may enable the device 100 to establish connections and/or transfer communications with other devices (e.g., a server, another device). The communications may be effected via a wired connection, a wireless connection, or a combination of wired and wireless connections. The communication interface 170 may permit the device 100 to receive information from another device and/or provide information to another device. In some embodiments, the communication interface 170 may provide for communications with another device via a network, such as a local area network (LAN), a wide area network (WAN), a metropolitan area network (MAN), a private network, an ad hoc network, an intranet, the Internet, a fiber optic-based network, a cellular network (e.g., a fifth generation (5G) network, a long-term evolution (LTE) network, a third generation (3G) network, a code division multiple access (CDMA) network, and the like), a public land mobile network (PLMN), a telephone network (e.g., the Public Switched Telephone Network (PSTN)), or the like, and/or a combination of these or other types of networks. Alternatively or additionally, the communication interface 170 may provide for communications with another device via a device-to-device (D2D) communication link, such as FlashLinQ, WiMedia, Bluetooth, ZigBee, Wi-Fi, LTE, 5G, and the like. In other embodiments, the communication interface 170 may include an Ethernet interface, an optical interface, a coaxial interface, an infrared interface, a radio frequency (RF) interface, or the like.

In some embodiments, the device 100 may comprise the facility designing component 180 configured to design datacenter facilities. For example, the facility designing component 180 may be configured to receive a request to create a facility, load a set of predefined templates, associate one of more instances of at least one predefined template with the facility, determine cable connectivity information of the facility, display a graphical representation of the facility, generate hostnames for addressable equipment of the facility, submit the facility for approval, and notify whether the facility has been approved.

The device 100 may perform one or more processes described herein. The device 100 may perform operations based on the processor 120 executing computer-readable instructions and/or code that may be stored by a non-transitory computer-readable medium, such as the memory 130 and/or the storage component 140. A computer-readable medium may refer to a non-transitory memory device. A memory device may include memory space within a single physical storage device and/or memory space spread across multiple physical storage devices.

Computer-readable instructions and/or code may be read into the memory 130 and/or the storage component 140 from another computer-readable medium or from another device via the communication interface 170. The computer-readable instructions and/or code stored in the memory 130 and/or storage component 140, if or when executed by the processor 120, may cause the device 100 to perform one or more processes described herein.

Alternatively or additionally, hardwired circuitry may be used in place of or in combination with software instructions to perform one or more processes described herein. Thus, embodiments described herein are not limited to any specific combination of hardware circuitry and software.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally or alternatively, a set of (one or more) components shown in FIG. 1 may perform one or more functions described as being performed by another set of components shown in FIG. 1.

Figure 2:
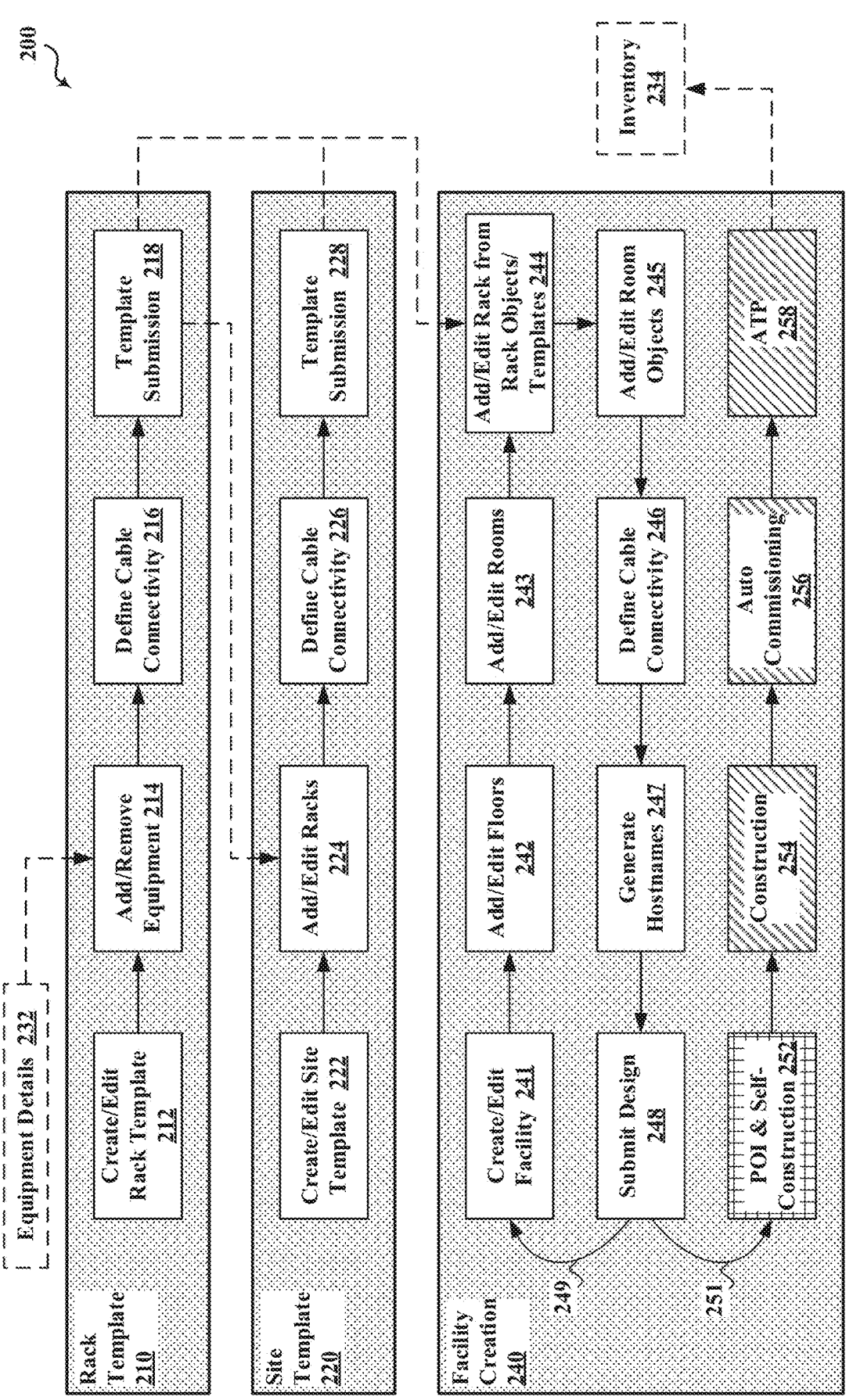
FIG. 2 is an example flow diagram for facility management, in accordance with various embodiments of the present disclosure.

Referring to FIG. 2, the diagram 200 illustrates example flow diagrams for facility management. In particular, FIG. 2 illustrates a rack template management flow 210, a site template management flow 220, and a facility creation flow 240. The example process flows illustrated in FIG. 2 may be performed by the device 100 of FIG. 1, including the facility designing component 180.

In some embodiments, the rack template management flow 210 may provide for creation, modification, and/or management of rack templates. For example, the facility designing component 180 may be configured to implement the rack template management flow 210. A rack template may identify a corresponding rack configuration comprising a set (e.g., one or more) of devices (e.g., network equipment such as switches, routers, hubs, firewalls, servers, and the like). That is, the rack template may comprise a predefined rack design with equipment and/or connectivity design information of a rack. For example, the rack template may indicate one or more corresponding network devices, a location within the rack (e.g., slot number range) of each corresponding network device, and/or connection information (e.g., cabling information) for each corresponding network device.

In other embodiments, the rack template may comprise basic rack information of the corresponding rack. The basic rack information may comprise, but is not limited to, at least one of a name of the rack template, a status of the rack template, a role of the rack template, a type of the rack template, a slot range of the rack template, a dimension of the rack template, a weight of the rack template, and a maximum power consumption of the rack template.

In some embodiments, the name and/or identification (ID) information of the rack template may be provided by a user and/or another device (e.g., a server). Alternatively or additionally, the name and/or ID information may be automatically generated by the facility designing component 180.

In some embodiments, the status of the rack template may indicate a state of a design process of the rack template. That is, the status of the rack template may indicate whether the rack template design is at least one of "not started", "in design", "on hold", "planned" (or "completed"), "awaiting approval", "approved", and the like. The disclosure is not limited in this regard.

In some embodiments, the role of the rack template may indicate a purpose and/or functionality of equipment associated with the rack template. For example, roles may be assigned according to a network layer being managed by equipment installed on a particular rack, such as an application network layer, a session network layer, a transport network layer, an internet network layer, a data link network layer, and/or a physical network layer. That is, a rack comprising network devices that manage a transport network layer (e.g., transmission control protocol (TCP), user datagram protocol (UDP)) may be assigned a "transport rack" role. In other embodiments, the role of the rack template may be assigned other values indicating other purposes and/or functionalities. The disclosure is not limited in this regard.

In some embodiments, the type of the rack template may indicate a type of construction of the rack, such as open frame, 2-post frame, 4-post frame, patch panel, wall-mount, and the like. In other embodiments, the type of the rack template may be assigned other values indicating other construction types. The disclosure is not limited in this regard.

In some embodiments, the slot range of the rack template may indicate a quantity of slots provided by the rack and may be selected from a plurality of predefined slot range values (e.g., 42, 46, 48). Alternatively or additionally, the slot range may be manually entered by a user and/or provided by another device (e.g., a server).

In some embodiments, the dimension of the rack template may indicate one or more physical dimensions of the rack (e.g., length, width, height). Alternatively or additionally, the rack template may indicate clearance information of the rack. For example, the rack template may indicate a minimum distance at which other equipment may be placed from the rack.

In other embodiments, the weight of the rack template may indicate a maximum weight capacity of the rack (e.g., 5,000 kilograms). Alternatively or additionally, the rack template may indicate a maximum weight limitation for the top of the rack.

In some embodiments, the rack template may indicate a maximum power consumption of the rack. For example, the rack template may indicate that a corresponding rack may consume up to 5,000 kilovolt-amps (kVA).

In other embodiments, the rack template may indicate cooling requirements of the rack. For example, the rack template may indicate at least one of a cooling media type (e.g., air, water/liquid), a flow direction (e.g., air flow from back to front, or air flow from left to right), a minimum flow requirement (e.g., a minimum air flow requirement in cubic feet per minute (CFM)), and a temperature requirement (e.g., a maximum temperature of the cooling media).

Alternatively or additionally, the rack template may comprise revision history information of the rack template. For example, the revision history information may comprise one or more datestamps and/or timestamps indicating a date and/or a time at which a revision (e.g., creation, modification) has been made to the rack template. The revision history information may further comprise a name and/or ID of a user that effected each revision to the rack template. The revision history information may further comprise one or more indications corresponding to a change made to the rack template. For example, the revision history information may indicate that the name of the rack template has been changed from "AAA" to "BBB." In such an example, the revision history information may further indicate ID information of a user (e.g., username, email address, telephone number, employee ID number, and the like) that changed the name of the rack template and/or a date and/or time at which the name of the rack template has been changed.

At block 212 of FIG. 2, the rack template management flow 210 may provide for the creation of a new rack template and/or the editing (e.g., modification) of an existing rack template. For example, at block 212, the rack template management flow 210 may provide a user interface for creating and/or editing rack templates. In some embodiments, the user interface may be provided by the facility designing component 180 and/or a device 100 comprising the facility designing component 180. For example, the user interface may display for each existing rack template at least one of a status, a template name, facility type, a slot quantity, and a creation information. Alternatively or additionally, the rack template management flow 210 may provide for other management functionality of rack templates, such as viewing an existing rack template, deleting an existing rack template, copying an existing rack template, and the like.

At block 214 of FIG. 2, the rack template management flow 210 may provide for adding equipment (e.g., network devices) to the rack template and/or editing (e.g., modifying) the equipment configuration of an existing rack template. For example, at block 214, the rack template management flow 210 may provide a user interface for adding and/or editing equipment. In some embodiments, the user interface may be provided by the facility designing component 180 and/or a device 100 comprising the facility designing component 180. For example, the user interface may provide for assignment of one or more slots of the rack template to one or more pieces of equipment.

In some embodiments, the facility designing component 180 and/or the device 100 may obtain equipment detail information 232 from a procurement and commercial (P&C) module and/or database. Alternatively or additionally, the equipment detail information 232 may comprise ID and/or configuration information of equipment (e.g., network devices) available to be added to a rack template. For example, the equipment detail information 232 may indicate for a particular piece of equipment at least one of a name, a type (e.g., switch, hub, router, etc.), a role (e.g., transport), a quantity and/or type of ports, a weight, a dimension (e.g., width, height, length), a power consumption value, and a cooling requirement. In other embodiments, the facility designing component 180 may provide a graphical representation of each piece of equipment according to the equipment detail information 232. Alternatively or additionally, the facility designing component 180 may obtain the equipment detail information 232 from the storage component 140 of the device 100.

At block 216 of FIG. 2, the rack template management flow 210 may provide for defining cable connectivity of the equipment associated with a rack template. For example, at block 216, the rack template management flow 210 may provide a user interface for adding and/or editing cable connections between the one or more pieces of equipment assigned to a rack template. In some embodiments, the user interface may be provided by the facility designing component 180 and/or a device 100 comprising the facility designing component 180. For example, the user interface may provide for determining rack connectivity information identifying one or more cable connections of the one or more pieces of equipment assigned to a rack template. Alternatively or additionally, the facility designing component 180 may be configured to generate, based on the cable connectivity information, a report comprising wiring matrix information indicating physical connection information of first ends of one or more cables, physical connection information of second ends of the one or more cables, and cable information of the one or more cables.

In other embodiments, the cable connections may be defined to be between two or more devices located in a same rack. Alternatively or additionally, the cable connections may be defined to be between two or more devices located in different racks. In other embodiments, the cable connections may be defined to be between one or more ports of a single device. That is, the disclosure is not limited in this regard.

The cable connection information may comprise information related to a type, length, and other characteristics of the wires and/or cables effecting the connection between the one or more devices. For example, the cable connection information may comprise, but is not limited to, a name and/or label identifying the connection, a material used for the connection (e.g., copper, optical fiber, and the like), an overall length, a quantity of conductors (e.g., an integer greater than or equal to one), a direction indication (e.g., inbound, outbound, downlink, uplink, and the like), a connector type for one or more ends of the connection.

At block 218 of FIG. 2, the rack template management flow 210 may provide for submitting a rack template. For example, at block 218, the rack template management flow 210 may provide a user interface for submitting a completed rack template to a collection of completed rack templates. In some embodiments, the user interface may be provided by the facility designing component 180 and/or a device 100 comprising the facility designing component 180. For example, the user interface may provide for submitting a rack template to a set of predefined rack templates.

In some embodiments, the submitting of a particular rack template may cause the particular rack template to become available for use by other facility management process flows (e.g., site template management flow 220, facility creation flow 240). In other embodiments, the particular rack template may be submitted for approval prior to the particular rack template being available for use by other facility management process flows. That is, if or when the particular rack template is approved, the particular rack template may be available for use by the other management process flows. Alternatively or additionally, if or when the particular rack template is not approved, the particular rack template may not be available for use by the other management process flows.

In some embodiments, the submitted (and/or approved) rack templates may be stored in a storage location that may be available to the other facility management process flows, such as, for example, the storage component 140 and/or another storage location (e.g., a server).

Advantageously, and as illustrated in greater detail below, the rack template management flow 210 described herein provides for the creation and management of rack templates that may be used during the design and/or creation of a site template and/or a facility. In addition, the rack templates comprise predefined rack designs with predefined equipment and connectivity information that may be reused in the design and/or creation of multiple sites and/or facilities. As such, the rack templates may allow for increased design efficiency, visibility and approval of designs, and ease of fault detection, when compared to conventional design and/or management of datacenter facilities.

Example user interfaces for creating and/or managing rack templates are described in reference to FIGS. 3-9.

Continuing to refer to FIG. 2, the site template management flow 220 may provide for creation, modification, and/or management of site templates. For example, the facility designing component 180 may be configured to implement the site template management flow 220.

A site template may identify a corresponding site configuration comprising a set (e.g., one or more) of rack configurations. The rack configurations may have been obtained from one or more rack templates, such as the rack templates described above in reference to the rack template management flow 210. That is, the site template may identify one or more instances of rack templates that have been assigned to a particular site. As such, the site template may indicate a quantity of racks associated with a particular site.

Alternatively or additionally, the site template may indicate cable connectivity information (e.g., cable connections) between equipment (e.g., network devices such as switches, routers, hubs, firewalls, servers, and the like) associated with the site template. For example, each rack template may indicate one or more corresponding network devices. In such an example, the site template may indicate one or more connections between two or more network devices that correspond to one rack template and/or one or more other connections between two or more network devices that correspond to multiple rack templates. That is, the site template may indicate a connection between a network device that corresponds to a rack template and another network device that corresponds to another rack template.

In some embodiments, the site template may indicate a type of facility associated with the site template. For example, a site template may be associated with at least one of a centralized datacenter (CDC), regional datacenter (RDC), and general datacenter (GDC). In another example, a site template may be associated with more or fewer facility types. That is, the quantity and/or identity of facility types associated with a site template may vary, and the disclosure is not limited in this regard.

In other embodiments, the site template may indicate a status of the site template. For example, the status of the site template may indicate a state of a design process of the site template. That is, the status of the site template may indicate whether the site template design is at least one of "not started", "in design", "on hold", "planned" (or "completed"), "awaiting approval", "approved", and the like. The disclosure is not limited in this regard.

Alternatively or additionally, the site template may comprise revision history information of the site template. For example, the revision history information may comprise one or more datestamps and/or timestamps indicating a date and/or a time at which a revision (e.g., creation, modification) has been made to the site template. The revision history information may further comprise a name and/or ID of a user that effected the revision. The revision history information may further comprise one or more indications corresponding to a change made to the site template. For example, the revision history information may indicate that the name of the site template was changed from "AAA" to "BBB." In such an example, the revision history information may further indicate ID information of a user (e.g., username, email address, telephone number, employee ID number, and the like) that changed the name of the site template and/or a date and/or time at which the name of the site template has been changed.

In other optional or additional embodiments, a site template may be added to a facility if or when the facility type associated with the site template matches the facility type of the facility to which the site template is being added. For example, a site template for a CDC may be added to a CDC facility. Alternatively or additionally, a site template may not be added to a facility if or when the type of the facility differs from the facility type associated with the site template. For example, a site template for a CDC may not be added to an RDC facility.

In other embodiments, the site template may further indicate a facility sub-type associated with the site template. In some embodiments, each facility type may have a distinct set of facility sub-types. For example, a CDC facility type may have facility subtypes A, B, and C, an RDC facility type may have facility subtypes D and E, and GDC may have no facility subtypes. In other optional or additional embodiments, the facility types may have a same set of facility sub-types. For example, the CDC, RDC, and GDC facility types may have facility subtypes A, B, and C. That is, the quantity and/or identity of facility sub-types associated with each facility type may vary, and the disclosure is not limited in this regard.

In some embodiments, the facility sub-type may indicate a relative size of the corresponding facility type. For example, a facility sub-type may be set to 'Small,' 'Medium,' or 'Large,' to indicate a relative size (e.g., floor space area) of the facility. Alternatively or additionally, the facility sub-type may indicate other measurement metrics of the corresponding facility type. For example, a facility sub-type may indicate a relative data processing capability (e.g., data throughput, data bandwidth), data storage capability, coverage capability (e.g., continent, country, region, city), and the like.

At block 222 of FIG. 2, the site template management flow 220 may provide for the creation of a new site template and/or the editing (e.g., modification) of an existing site template. For example, at block 222, the site template management flow 220 may provide a user interface for creating and/or editing site templates. In some embodiments, the user interface may be provided by the facility designing component 180 and/or a device 100 comprising the facility designing component 180. For example, the user interface may display for each existing site template at least one of a status, a template name, a rack quantity, a facility type, a facility sub-type, and creation information. Alternatively or additionally, the site template management flow 220 may provide for other management functionality of site templates, such as viewing an existing site template, deleting an existing site template, copying an existing site template, and the like.

At block 224 of FIG. 2, the site template management flow 220 may provide for adding one or more rack templates to the site template and/or editing (e.g., modifying) one or more of the rack template configurations of the site template. That is, the site template management flow 220 may allow for assigning one or more instances of one or more rack templates to a site template. For example, at block 224, the site template management flow 220 may provide a user interface for adding rack templates to the site template and/or editing rack templates that are assigned to the site template. In some embodiments, the user interface may be provided by the facility designing component 180 and/or a device 100 comprising the facility designing component 180. In other optional or additional embodiments, the rack templates may have been created and/or modified using the rack template management flow 210. For example, the rack templates may be stored in a data storage location (e.g., storage component 140 of FIG. 1, a remote server) and the facility designing component 180 may provide the stored rack templates for addition and/or modification at block 224. Alternatively or additionally, the site template management flow 220 may provide for other management functionality of rack templates, such as removing a rack template from the site template, copying an existing rack template, renaming and/or relocating equipment associated with a rack template, and the like.

In other embodiments, the facility designing component 180 and/or the device 100 may provide another user interface that displays site information comprising, but not limited to, at least one of a quantity of racks assigned to the site, a total quantity of slots associated with the site, a quantity of available slots associated with the site, a quantity of servers associated with the site, a total quantity of top-of-row (ToR) slots that have been allocated, a total quantity of out-of-band (OOB) devices associated with the site, a total weight of equipment associated with the site, and a total cost of the equipment associated with the site.

At block 226 of FIG. 2, the site template management flow 220 may provide for defining cable connectivity for the site template. That is, the site template management flow 220 may obtain information related to one or more cable connections between two or more devices of the one or more rack templates associated with the site template. For example, at block 226, the site template management flow 220 may provide a user interface for adding and/or editing cable connections between the one or more pieces of equipment and/or racks assigned to a site template. In some embodiments, the user interface may be provided by the facility designing component 180 and/or a device 100 comprising the facility designing component 180. For example, the user interface may provide for determining site connectivity information identifying one or more cable connections of one or more equipment assigned to the site template. Alternatively or additionally, the facility designing component 180 may be configured to generate, based on the cable connectivity information, a report comprising wiring matrix information indicating physical connection information of first ends of one or more cables, physical connection information of second ends of the one or more cables, and cable information of the one or more cables.

In other embodiments, the cable connections may be defined to be between two or more devices located in a same rack. Alternatively or additionally, the cable connections may be defined to be between two or more devices located in different racks. In other embodiments, the cable connections may be defined to be between one or more ports of a single device. That is, the disclosure is not limited in this regard.

The cable connection information may comprise information related to a type, length, and other characteristics of the wires and/or cables effecting the connection between the one or more devices. For example, the cable connection information may comprise, but is not limited to, a name and/or label identifying the connection, a material used for the connection (e.g., copper, optical fiber, and the like), an overall length, a quantity of conductors (e.g., an integer greater than or equal to one), a direction indication (e.g., inbound, outbound, downlink, uplink, and the like), a connector type for one or more ends of the connection.

At block 228 of FIG. 2, the site template management flow 220 may provide for submitting a site template. For example, at block 228, the site template management flow 220 may provide a user interface for submitting a completed site template to a collection of completed site templates. In some embodiments, the user interface may be provided by the facility designing component 180 and/or a device 100 comprising the facility designing component 180. For example, the user interface may provide for submitting a site template to a set of predefined site templates.

In some embodiments, the submitting of a particular site template may cause the particular site template to become available for use by other facility management process flows (e.g., facility creation flow 240). In other embodiments, the particular site template may be submitted for approval prior to the particular site template being available for use by other facility management process flows. That is, if or when the particular site template is approved, the particular site template may be available for use by the other management process flows. Alternatively or additionally, if or when the particular site template is not approved, the particular site template may not be available for use by the other management process flows.

In some embodiments, the submitted (and/or approved) site templates may be stored in a storage location that may be available to the other facility management process flows, such as, for example, the storage component 140 and/or another storage location (e.g., a server).

Advantageously, and as illustrated in greater detail below, the site template management flow 220 described herein provides for the creation and management of site templates that may be used during the design and/or creation of a facility. In addition, the site templates comprise predefined site designs with predefined racks and/or equipment and connectivity information that may be reused in the design and/or creation of multiple facilities. As such, the site templates may allow for increased design efficiency, visibility and approval of designs, and ease of fault detection, when compared to conventional design and/or management of datacenter facilities.

Example user interfaces for creating and/or managing site templates are described in reference to FIGS. 10-13.

Continuing to refer to FIG. 2, the facility creation flow 240 may provide for creation, modification, management, and/or approval of facility objects. For example, the facility designing component 180 may be configured to implement the facility creation flow 240.

A facility object may comprise a set (e.g., one or more) of site configurations and/or rack configurations associated with a facility. The site configurations may have been obtained from one or more site templates, such as the site templates described above in reference to the site template management flow 220. The rack configurations may have been obtained from one or more rack templates, such as the rack templates described above in reference to the rack template management flow 210. That is, the facility object may identify one or more instances of site templates and/or rack templates that have been assigned to the facility object. As such, the facility creation flow 240 may provide for loading a set of predefined templates comprising at least one of a site template and a rack template. For example, the facility creation flow 240 may load the set of predefined templates from a data storage location (e.g., storage component 140 of FIG. 1, a remote server). Alternatively or additionally, the facility creation flow 240 may provide for associating one or more instances of at least one predefined template of the set of predefined templates with a facility object.

In some embodiments, the facility object may comprise basic facility information of the corresponding facility. The basic facility information may comprise, but is not limited to, at least one of a facility name, a facility type, a facility sub-type, a facility provider, location information, a parent datacenter, contact information, and facility connectivity information. Alternatively or additionally, the facility object may comprise connectivity design information of the facility. For example, the facility object may indicate connection information (e.g., cabling information) for each corresponding device of the facility. In another example, the facility object may indicate connection information of the facility such as external network connections of the facility (e.g., ring network information, provider network information).

In other embodiments, the facility name and/or ID information of the facility may be provided by a user and/or another device (e.g., a server). Alternatively or additionally, the name and/or ID information may be automatically generated by the facility designing component 180.

The facility object may be assigned a facility type and/or a facility sub-type. The facility type and the facility sub-type associated with a facility object are similar in many respects to the facility type and the facility sub-type described above with reference to the site template management flow 220 and a detailed description is omitted for the sake of brevity. For example, a facility object may be associated with at least one of a facility type, such as a CDC, an RDC, and a GDC. In another example, a facility object may be associated with at least one of a facility sub-type, such as 'Small,' 'Medium,' and 'Large.' In some embodiments, the facility object may be associated with an instance of a site template if or when the facility type associated with the site template matches the facility type of the facility object. Alternatively or additionally, the facility object may not be associated with an instance of a site template if or when the facility type associated with the site template differs from the facility type of the facility object.

In some embodiments, the facility object may comprise floor information identifying one or more rooms located at a corresponding floor of the facility. Alternatively or additionally, the facility object may comprise layout information corresponding to the set of equipment (e.g., devices, racks) associated with the facility. The layout information may indicate respective locations of the equipment, such as at least one of a physical position, an orientation, a floor, a room, and a geographical region (e.g., continent, country, state, city, neighborhood, street, building) of the respective equipment. In other embodiments, the layout information may indicate respective locations of the equipment according to a grid numbering pattern dividing a layout of a floor into a plurality of regions. Alternatively or additionally, the facility designing component 180 may be configured to generate, based on the layout information of the facility object, a report indicating grid locations of the equipment associated with the facility object.

In other embodiments, the facility object may comprise additional layout information corresponding to structural elements and/or obstructions (e.g., wall, door, column, power outlet, air outlet, and the like) located at one or more floors of the facility.

In other optional or additional embodiments, the facility object may indicate a status of the facility. For example, the status of the facility may indicate whether the facility is at least one of "not started", "in design", "on hold", "planned", "awaiting approval", "approved", "rejected", "under construction", "commissioned", and the like. The disclosure is not limited in this regard.

In some embodiments, the facility object may comprise one or more hostnames for addressable equipment (e.g., devices assigned with internet protocol (IP) addresses) of the equipment associated with the facility. For example, the one or more hostnames (e.g., universal host names (UHN)) may be automatically generated by the facility designing component 180. In other embodiments, the hostnames may be generated based on connectivity information of the facility object. Alternatively or additionally, the one or more hostnames may be provided by a user and/or another device (e.g., a server).

Alternatively or additionally, the facility object may comprise revision history information of the facility object. For example, the revision history information may comprise one or more datestamps and/or timestamps indicating a date and/or a time at which a revision (e.g., creation, modification) has been made to the facility object. The revision history information may further comprise a name and/or ID of a user that effected each revision to the facility object. The revision history information may further comprise one or more indications corresponding to a change made to the facility object. For example, the revision history information may indicate that the name of the facility object has been changed from "AAA" to "BBB." In such an example, the revision history information may further indicate ID information of a user (e.g., username, email address, telephone number, employee ID number, and the like) that changed the name of the facility object and/or a date and/or time at which the name of the facility object has been changed.

At block 241 of FIG. 2, the facility creation flow 240 may provide for the creation of a new facility object and/or the editing (e.g., modification) of an existing facility object. For example, at block 241, the facility creation flow 240 may provide a user interface for creating and/or editing facility objects. In some embodiments, the user interface may be provided by the facility designing component 180 and/or a device 100 comprising the facility designing component 180. For example, the user interface may display for each existing facility object at least one of a status, a facility name, a facility ID, a facility type, a facility sub-type, a phase of the facility (e.g., design, construction, commissioning, and the like), and location information. Alternatively or additionally, the facility creation flow 240 may provide for other management functionality of facility objects, such as viewing an existing facility object, deleting an existing facility object, copying an facility object, and the like.

At block 242 of FIG. 2, the facility creation flow 240 may provide for adding floors to a facility object and/or the editing (e.g., modification) existing floors of the facility object. For example, at block 242, the facility creation flow 240 may provide a user interface for adding and/or editing floors of facility objects. In some embodiments, the user interface may be provided by the facility designing component 180 and/or a device 100 comprising the facility designing component 180. For example, the user interface may allow for adding a floor to a particular location (e.g., building) of the facility object. Alternatively or additionally, the facility creation flow 240 may provide for other management functionality of floors, such as viewing an existing floor, deleting an existing floor, copying a floor (e.g., to a same location or to another location), moving a floor (e.g., from a first location to a second location), and the like.

At block 243 of FIG. 2, the facility creation flow 240 may provide for adding rooms to a facility object and/or the editing (e.g., modification) existing rooms of the facility object. For example, at block 243, the facility creation flow 240 may provide a user interface for adding rooms to floors and/or editing rooms of floors of a facility object. In some embodiments, the user interface may be provided by the facility designing component 180 and/or a device 100 comprising the facility designing component 180. For example, the user interface may allow for adding a room to a floor of the facility object. Alternatively or additionally, the facility creation flow 240 may provide for other management functionality of rooms, such as viewing an existing room, deleting an existing room, copying a room (e.g., to a same floor, to another floor, or to another location), moving a room (e.g., from a first floor/location to a second floor/location), and the like.

At block 244 of FIG. 2, the facility creation flow 240 may provide for adding one or more site templates and/or rack templates to a facility object and/or editing (e.g., modification) existing rack and/or site template configurations of the facility object. For example, at block 244, the facility creation flow 240 may provide a user interface for assigning one or more instances of one or more rack templates and/or site templates to a facility object. In some embodiments, the user interface may be provided by the facility designing component 180 and/or a device 100 comprising the facility designing component 180. For example, the facility designing component 180 may load a set of predefined templates comprising at least one of a site template and a rack template from a data storage location (e.g., storage component 140 of FIG. 1, a remote server). Alternatively or additionally, the user interface may provide for associating one or more instances of at least one predefined template of the set of predefined templates with one or more rooms of a facility object. That is, the user interface may display a graphical representation of a room layout and allow for adding one or more instances of a rack template and/or a site template to the room.

In some embodiments, at block 244, the facility designing component 180 may obtain layout information corresponding to one or more rooms of the facility object. The layout information may indicate respective locations of equipment (e.g., racks, devices) associated with the facility object, such as at least one of a physical position, an orientation, a floor, a room, and a geographical location. Alternatively or additionally, the layout information may indicate a respective positions of the equipment according to a grid numbering pattern that divides a floor layout into a plurality of regions.

At block 245 of FIG. 2, the facility creation flow 240 may provide for adding additional room objects to one or more rooms of a facility object and/or editing (e.g., modification) existing additional room objects of the facility object. For example, at block 244, the facility creation flow 240 may provide a user interface for placing one or more additional room objects to one or more room layouts of the facility object. In some embodiments, the user interface may be provided by the facility designing component 180 and/or a device 100 comprising the facility designing component 180. For example, the user interface may allow for adding additional room objects (e.g., structural elements and/or obstructions, such as a wall, a door, a column, a power outlet, an air vent, and the like) to a room layout. That is, the facility designing component 180 may additional layout information corresponding to the additional room objects to room layout information of the facility object.

At block 246 of FIG. 2, the facility creation flow 240 may provide for defining cable connectivity for the facility object. That is, the facility creation flow 240 may obtain information related to one or more cable connections between equipment associated with the facility object. For example, at block 246, the facility creation flow 240 may provide a user interface for adding and/or editing cable connections between the one or more pieces of equipment and/or racks assigned to a facility object. In some embodiments, the user interface may be provided by the facility designing component 180 and/or a device 100 comprising the facility designing component 180. For example, the user interface may provide for determining facility connectivity information identifying one or more cable connections of one or more equipment assigned to the facility object. In another example, the user interface may provide for determining facility connectivity information identifying external network connections of the facility (e.g., ring network information, provider network information).

In some embodiments, the facility designing component 180 may be configured to generate, based on the cable connectivity information, a report comprising wiring matrix information indicating physical connection information of first ends of one or more cables, physical connection information of second ends of the one or more cables, and cable information of the one or more cables. Alternatively or additionally, the facility designing component 180 may be configured to generate, based on the equipment associated with the facility object, a report comprising material ordering information (e.g., a bill of materials (BOM)) for the facility.

At block 247 of FIG. 2, the facility creation flow 240 may provide for generating and/or assigning hostnames for the facility object. For example, at block 247, the facility creation flow 240 may provide a user interface for generating and/or assigning one or more hostnames (e.g., UHNs) to addressable equipment of the facility object. In some embodiments, the user interface may be provided by the facility designing component 180 and/or a device 100 comprising the facility designing component 180. For example, the user interface may allow for assigning automatically generated hostnames to addressable equipment (e.g., devices assigned with IP addresses) of the equipment associated with the facility. Alternatively or additionally, the hostnames may be generated based on connectivity information of the facility object. In another example, the user interface may allow for assigning hostnames that have been provided by a user and/or another device (e.g., server).

At block 248 of FIG. 2, the facility creation flow 240 may provide for submitting a facility object for approval. For example, at block 248, the facility creation flow 240 may provide a user interface for submitting a completed facility object for approval. In some embodiments, the user interface may be provided by the facility designing component 180 and/or a device 100 comprising the facility designing component 180. For example, the user interface may display a listing of facility objects indicating whether the facility objects are awaiting approval. In such an example, the user interface may allow displaying the facility object for approval and/or obtaining an indication that the facility object has been approved or rejected. Alternatively or additionally, the user interface may allow for obtaining additional information related to the approval and/or rejection of the facility object.

If or when the submitted facility object has been rejected, the facility creation flow 240, at step 249, may return to block 241 to modify the facility object as indicated by the rejection indication of the facility object. Alternatively or additionally, if or when the submitted facility object has been approved, the facility creation flow 240, at step 251, may continue to block 252. In some embodiments, users may be notified whether the facility object has been approved and/or rejected.

At block 252 of FIG. 2, the facility creation flow 240 may provide, if or when the approved facility object is for a GDC, for installation of one or more points of interface (POIs) and/or points of demarcation (DEMARC) between two different carriers (e.g., between a local exchange carrier (LEC) and a wireless carrier, and/or between an LEC and an IntereXchange Carrier (IXC)). For example, the facility creation flow 240 may generate, according to the approved facility object, one or more work orders for approval and installation of one or more POIs at the GDC corresponding to the approved facility object. Alternatively or additionally, at block 252, the facility creation flow 240 may provide, if or when the approved facility object is for a GDC, for a self-construction phase of the facility. For example, once the POIs are submitted and/or approved, self-construction may start. In some embodiments, block 252 may comprise fewer, additional, and/or different steps related to an initial construction phase of a GDC. The disclosure is not limited in this regard.

At block 254 of FIG. 2, the facility creation flow 240 may provide for a construction phase of the facility according to the design information of the approved facility object. For example, at block 254, the facility creation flow 240 may generate, according to the approved facility object, one or more work orders for construction of the facility. That is, the approved facility object may allow for construction of the facility and/or for verification that the facility has been constructed as designed.

At block 256 of FIG. 2, the facility creation flow 240 may provide for auto-commissioning of the facility according to the approved facility object. For example, at block 256, the facility creation flow 240 may generate, according to the approved facility object, one or more work orders for assigning network addresses and/or hostnames to addressable equipment of the facility. Alternatively or additionally, the facility creation flow 240 may provide for configuring the addressable equipment of the facility with the network addresses and/or hostnames indicated by the approved facility object. For example, the facility designing component 180 and/or a device 100 comprising the facility designing component 180 may configure the addressable equipment of the facility with the network addresses and/or hostnames indicated by the approved facility object.

At block 258 of FIG. 2, the facility creation flow 240 may provide for implementation of an acceptance test plan (ATP) at the facility according to the approved facility object. For example, at block 258, the facility creation flow 240 may generate, according to the approved facility object, one or more work orders for implementing ATP at the facility. Alternatively or additionally, the facility creation flow 240 may configure the equipment of the facility to perform ATP as indicated by the approved facility object. For example, the facility designing component 180 and/or a device 100 comprising the facility designing component 180 may configure the equipment of the facility to perform ATP as indicated by the approved facility object. In some embodiments, the approved facility object may be provided to an inventory server 234 for implementation of the equipment associated with the approved facility object using a Bare-Metal-as-a-Service (BMaaS) service.

Advantageously, and as illustrated in greater detail below, the facility creation flow 240 described herein provides for the creation and management of facility objects using rack templates and/or site templates. In addition, the facility creation flow 240 provide for a visual representation of floor layouts, racks, and equipment that allow for designing floors and/or rooms of a facility. As such, the facility creation techniques described herein may allow for increased design efficiency, visibility and approval of designs, and ease of fault detection, when compared to conventional design and/or management of datacenter facilities.

Example user interfaces for creating and/or managing facility objects are described in reference to FIGS. 14-32.

In some embodiments, the facility designing component 180 may provide one or more user personas and/or roles for facility management. The user personas and/or roles may be granted authorization for performing one or more aspects of the facility management processes (e.g., the rack template management flow 210, a site template management flow 220, and a facility creation flow 240). That is, one or more users (e.g., user accounts) may be assigned one or more user personas and/or roles, and, as such, may be granted authorization to perform the one or more aspects of the facility management processes of their assigned personas and/or roles. Alternatively or additionally, a same user persona and/or role may be assigned to one or more users (e.g., user accounts).

In some embodiments, authorization to perform a particular aspect of the facility management processes may be granted to only one user persona and/or role. Alternatively or additionally, every user persona and/or role may be granted authorization to perform the particular aspect of the facility management processes. In other embodiments, each aspect of the facility management processes may be assigned to a different user persona and/or role. That is, there may be a one-to-one relationship between the one or more user personas and the one or more aspects of the facility management processes. In other optional or additional embodiments, each user persona and/or role may be granted authorization to perform every aspect of the facility management processes. That is, the disclosure is not limited in this regard.

For example, in some embodiments, the facility designing component 180 may provide a facility designer role. The facility designer role may be granted permission to perform at least one of creating rack templates, creating site templates, designing floor layouts using rack templates and/or site templates, determining cabling connections within a rack, determining cabling connections between two or more racks, generating and/or assigning hostnames to addressable equipment, and submitting a facility object for approval.

In other optional or additional embodiments, the facility designing component 180 may provide a facility manager role. The facility manager role may be granted permission to perform at least one of approving a facility object, managing scheduling of design activities for a facility, and communicating with one or more users assigned a datacenter construction team role.

In other optional or additional embodiments, the facility designing component 180 may provide a datacenter construction team role. The datacenter construction team role may be granted permission to perform at least one of constructing the site according to the facility object, install cabling according to the facility object, scanning facility equipment according to one or more work orders, execute ATP workflows according to one or more work orders.

In some embodiments, the facility designing component 180 may require a user to provide authentication credentials (e.g., username, password, one-time code, biometric data, and the like) to verify an identity of the user prior to granting permission to the user to perform an aspect of the facility management processes. For example, if or when a user provides authentication credentials that successfully identify the user, the facility designing component 180 may allow the user to perform the requested aspect of the facility management processes if or when the user has been assigned a role that grants authorization to perform the requested aspect of the facility management processes. In another example, if or when a user provides authentication credentials that successfully identify the user, the facility designing component 180 may prevent the user from performing the requested aspect of the facility management processes if or when the user has not been assigned a role that grants authorization to perform the requested aspect of the facility management processes. In yet another example, if or when a user provides authentication credentials that do not successfully identify the user, the facility designing component 180 may prevent the user from performing the requested aspect of the facility management processes. As such, it may be understood by persons of skill in related arts that references to a user throughout the present disclosure may refer to an authenticated user that has been granted authorization to perform the one or more aspects of the facility management processes that the particular user is described as performing.

FIG. 3 is an example of a rack template listing page 300, in accordance with various embodiments of the present disclosure. The rack template listing page 300 may be provided by the facility designing component 180 and/or a device 100 comprising the facility designing component 180. For example, the rack template listing page 300 may be displayed by the output component 160 of the device 100 and/or may receive user inputs via the input component 150 of the device 100. The rack template listing page 300 may include a list of the predefined rack templates. The rack template listing page 300 may display for each predefined rack template 310 at least one of a status, a template name, a facility type, a number of slots, and creation information.

The status of the predefined rack template 310 may indicate a current status of the predefined rack template 310, such as "not started", "in design", "on hold", "planned" (or "completed"), "awaiting approval", "approved", and the like, as described in further detail above in reference to the rack template management flow 210 of FIG. 2.

The template name may uniquely identify the predefined rack template 310. The template name may be automatically generated by the facility designing component 180. Alternatively or additionally, the template name may be provided by a user and/or another device (e.g., a server), as described in further detail above in reference to the rack template management flow 210 of FIG. 2.

The facility type may indicate a type of facility associated with the predefined rack template 310. For example, the predefined rack template 310 may be associated with at least one of a CDC, RDC, and GDC. In some embodiments, the predefined rack template 310 may be added to a site template and/or a facility if or when the facility type associated with the predefined rack template 310 matches the facility type of the site template and/or facility object to which the predefined rack template 310 is being added. Alternatively or additionally, the predefined rack template 310 may not be added to a site template and/or a facility if or when the facility type of the predefined rack template 310 differs from the facility type of the site template and/or facility object to which the predefined rack template 310 is being added.

The creation information may indicate one or more values obtained from the revision history of the predefined rack template 310. For example, as shown in FIG. 3, the creation information may indicate a user that created the predefined rack template 310 and a date and time at which the predefined rack template 310 was created.

In some embodiments, the rack template listing page 300 may display rack template actions 320 if or when a user (e.g., a facility designer) selects a predefined rack template from the list of the predefined rack templates. For example, the user may click on and/or touch the selected predefined rack template and the input component 150 may receive the user selection. The rack template actions 320 may comprise one or more rack template management functions that the user may perform on the selected predefined rack template, such as viewing the selected predefined rack template, deleting the selected predefined rack template, and copying the selected predefined rack template.

In other embodiments, the rack template listing page 300 may comprise an add button 330 that may allow the user to create a new rack template. For example, the user may click on and/or touch the add button 330 to generate a request to create the new rack template. The facility designing component 180 may receive the request to create the new rack template and start a rack template management flow 210 to create the new rack template. For example, the facility designing component 180 may display the rack template creation page 400 of FIG. 4 to initiate the rack template creation process.

In other optional or additional embodiments, the rack template listing page 300 may comprise a filter button 340 that may allow the user to filter the predefined rack templates shown in the list of the predefined rack templates of the rack template listing page 300. For example, the user may click on and/or touch the filter button 340 to provide filtering information to specify a portion of the list of the predefined rack templates that is to be shown and/or specify a portion of the list of the predefined rack templates that is to be hidden. Alternatively or additionally, the rack template listing page 300 may comprise a search input box 350 that may allow the user to search for one or more predefined rack templates that meet the search criteria provided by the user.

Figure 4:
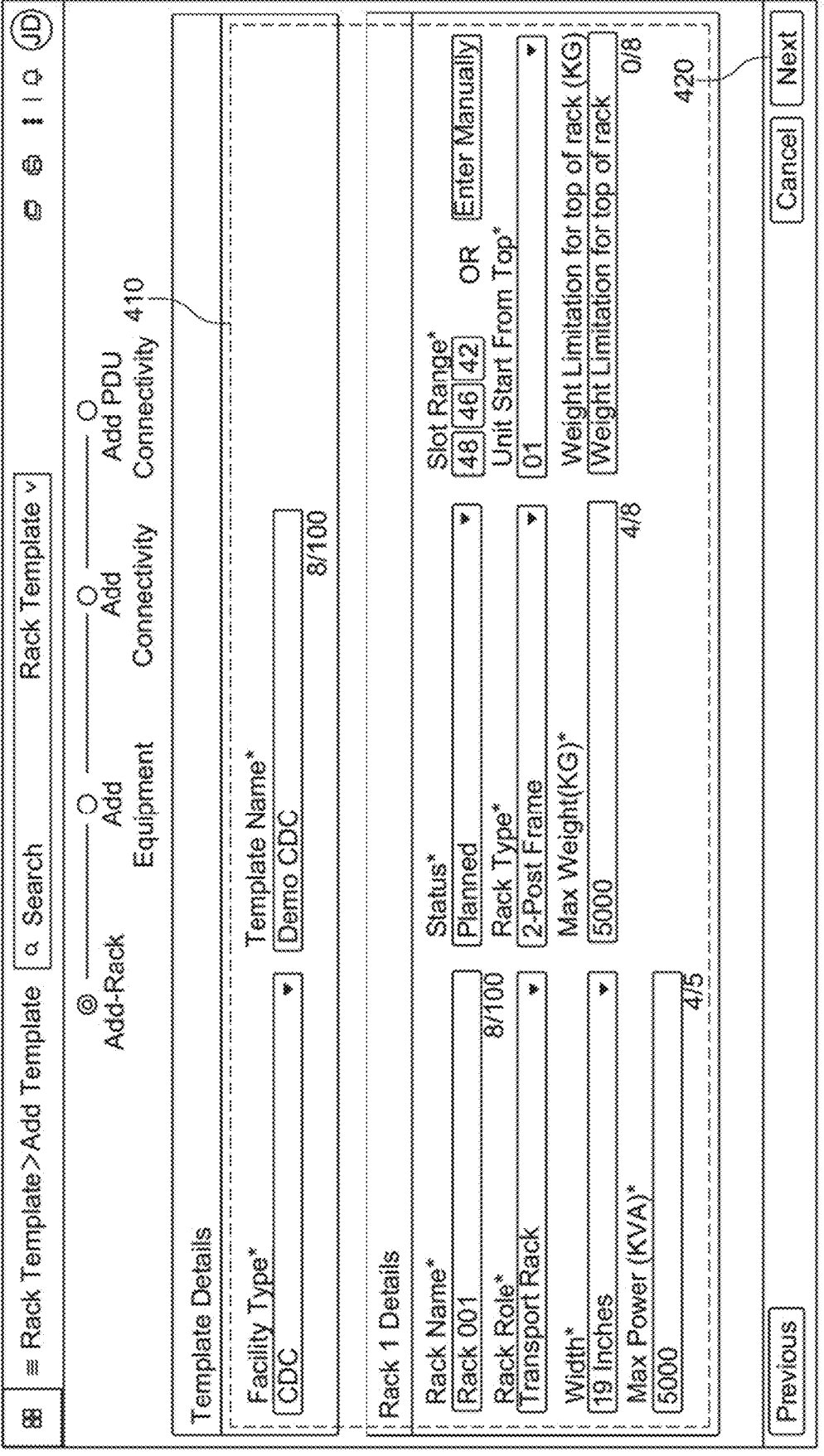
FIG. 4 is an example of a rack template creation page, in accordance with various embodiments of the present disclosure.

FIG. 4 is an example of a rack template creation page 400, in accordance with various embodiments of the present disclosure. The rack template creation page 400 may be provided by the facility designing component 180 and/or a device 100 comprising the facility designing component 180. For example, the rack template creation page 400 may be displayed by the output component 160 of the device 100 and/or may receive user inputs via the input component 150 of the device 100. The rack template creation page 400 may include basic rack information fields 410 for entering the basic rack information of the corresponding rack, such as a facility type field, a rack template name field, a rack name field, a rack status field, a slot range field, a rack role field, a rack type field, a rack dimension (e.g., width) field, a maximum weight capacity field, a field for a weight limitation for the top of rack, and a maximum power consumption field. The basic rack information fields 410 of the rack template creation page 400 are similar in many respects to the basic rack information comprised by the rack template as described above with reference to the rack template management flow 210 and a detailed description is omitted here for the sake of brevity. In some embodiments, the user (e.g., facility designer) may enter one or more values in the basic rack information fields 410 that may be received by the facility designing component 180 via the input component 150, for example. The user may indicate completion and proceed to a next step in the rack template creation process by clicking on and/or touching the next button 420. The facility designing component 180 may display, via the output component 160, a user interface for adding equipment to the rack in response to the next button 420 having been activated.

Figure 5:
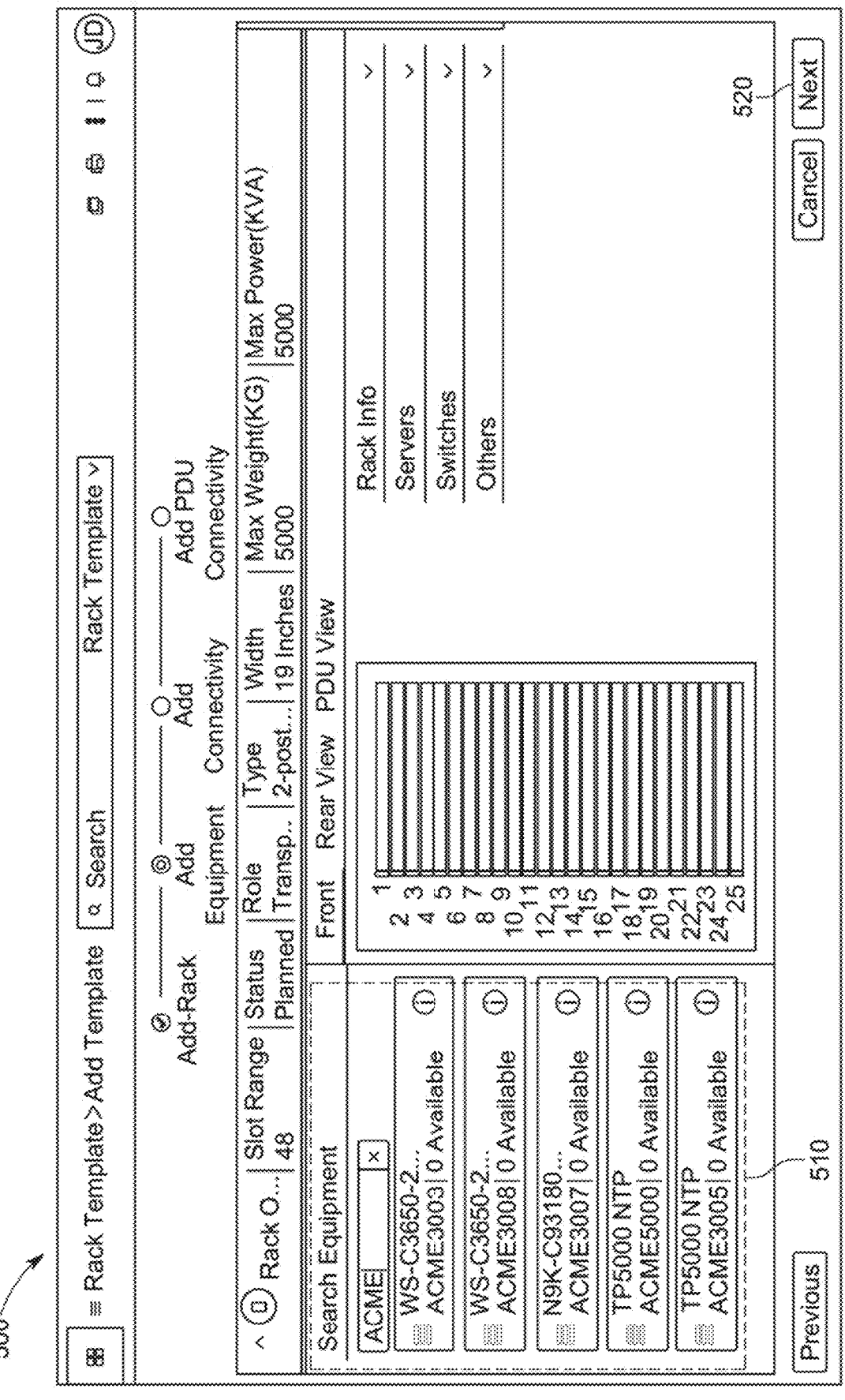
FIG. 5 is an example of a first user interface for adding equipment to a rack template, in accordance with various embodiments of the present disclosure.

FIG. 5 is an example of a first user interface for adding equipment 500 to a rack template, in accordance with various embodiments of the present disclosure. The first user interface for adding equipment 500 may be provided by the facility designing component 180 and/or a device 100 comprising the facility designing component 180. For example, the first user interface for adding equipment 500 may be displayed by the output component 160 of the device 100 and/or may receive user inputs via the input component 150 of the device 100. As shown in FIG. 5, the first user interface for adding equipment 500 may include a searchable list of equipment 510 (e.g., network devices such as switches, routers, hubs, firewalls, servers, and the like) that may be added to the rack. In some embodiments, the equipment listed on the searchable list of equipment 510 may be based on equipment detail information 232 obtained from a P&C module and/or database. Alternatively or additionally, the equipment detail information 232 may have been obtained the storage component 140 of the device 100.

The first user interface for adding equipment 500 may allow the user add one or more pieces of equipment from the searchable list of equipment 510 to a graphical representation of the rack, as shown in FIG. 5. For example, the user may select a device from the searchable list of equipment 510 and "drag and drop" the selected device to the graphical representation of the rack. Alternatively or additionally, the user may provide other user input, via the input component 150, requesting to add a selected device from the searchable list of equipment 510 to the rack. The user request to add the selected device to the rack (e.g., drag and drop operation) may cause a second user interface for adding equipment to be displayed, as shown in FIG. 6.

Figure 6:
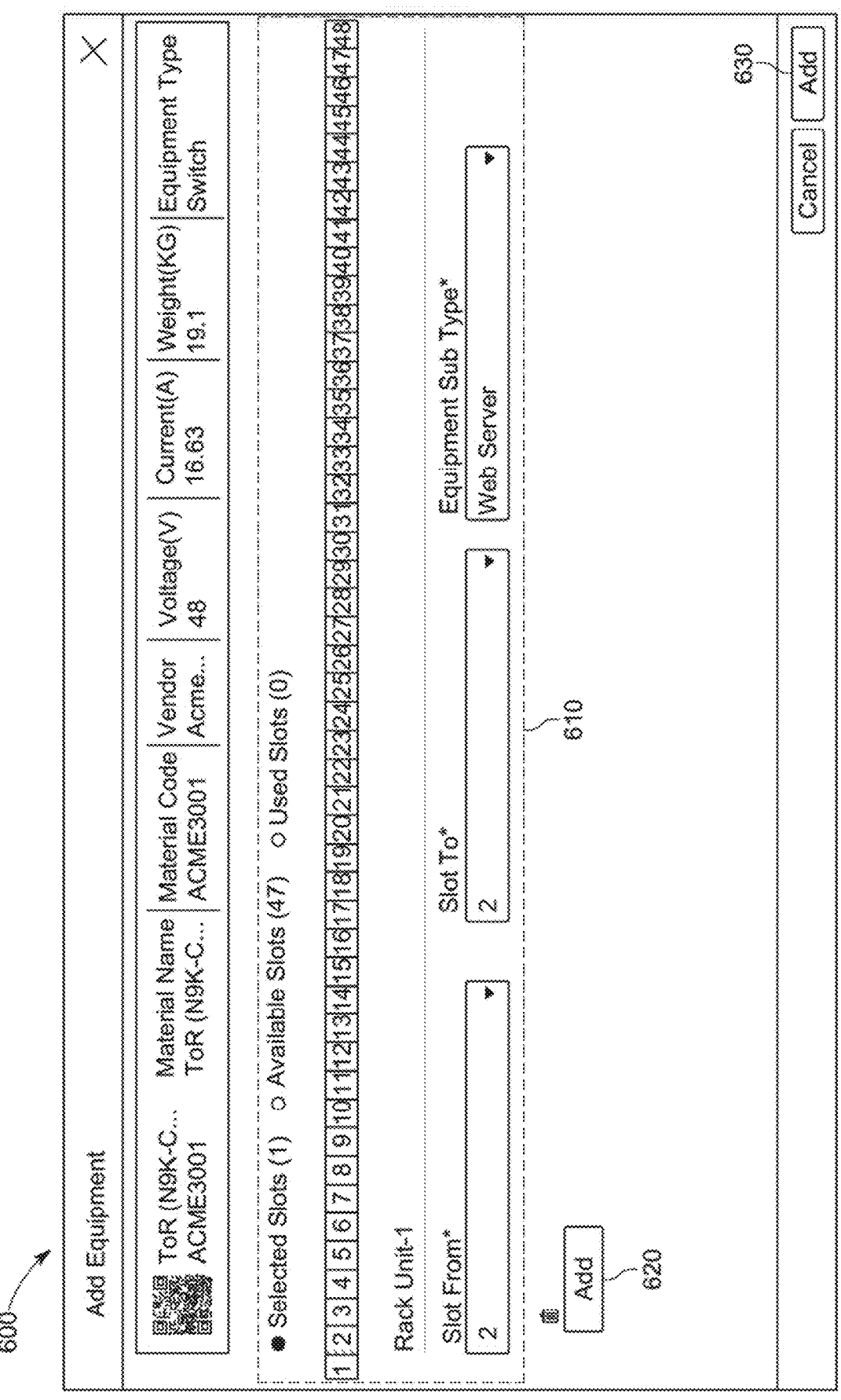
FIG. 6 is an example of a second user interface for adding equipment to a rack template, in accordance with various embodiments of the present disclosure.

FIG. 6 is an example of a second user interface for adding equipment 600 to a rack template, in accordance with various embodiments of the present disclosure. The second user interface for adding equipment 600 may be provided by the facility designing component 180 and/or a device 100 comprising the facility designing component 180. For example, the second user interface for adding equipment 600 may be displayed by the output component 160 of the device 100 and/or may receive user inputs via the input component 150 of the device 100. The second user interface for adding equipment 600 may include fields 610 for indicating the one or more slots of the rack that will be occupied by the selected device. Alternatively or additionally, the fields 610 may further include a field for indicating an equipment sub-type of the selected device. The second user interface for adding equipment 600 may include a first add button 620 for adding multiple instances of the selected device to the rack. The second user interface for adding equipment 600 may include a second add button 630 to add (e.g., commit) the changes made on the second user interface for adding equipment 600 and return to the first user interface for adding equipment 500 of FIG. 5.

Figure 7:
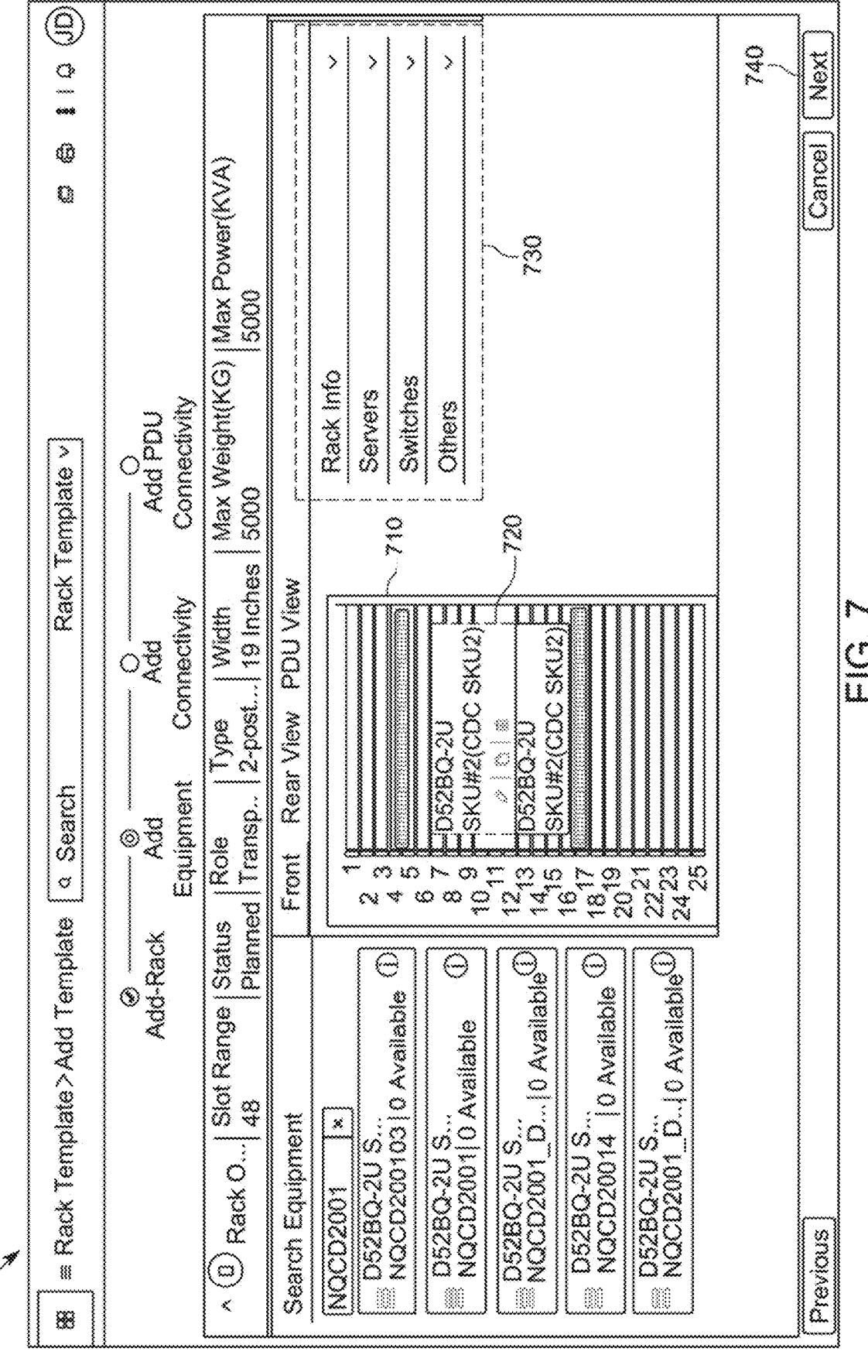
FIG. 7 is an example of a user interface for viewing equipment of a rack template, in accordance with various embodiments of the present disclosure.

FIG. 7 is an example of an equipment viewing page 700 of a rack template, in accordance with various embodiments of the present disclosure. The equipment viewing page 700 may be provided by the facility designing component 180 and/or a device 100 comprising the facility designing component 180. For example, the equipment viewing page 700 may be displayed by the output component 160 of the device 100 and/or may receive user inputs via the input component 150 of the device 100. The equipment viewing page 700 is similar in many respects to the first user interface for adding equipment 500 described above with reference to FIG. 5 and may include additional features not mentioned above.

The equipment viewing page 700 may show a graphical representation 710 of the rack that includes the equipment currently allocated to the rack template. The user may select one of the pieces of equipment shown in the graphical representation 710 by clicking on and/or touching the desired piece of equipment. In response to the user selection, the equipment viewing page 700 may display equipment actions 720. The equipment actions 720 may comprise one or more equipment management functions that the user may perform on the selected equipment, such as editing the selected equipment (e.g., using the second user interface for adding equipment 600), deleting the selected equipment from the rack template, and cloning (e.g., copying) the selected equipment. The equipment viewing page 700 may include a rack information area 730 indicating information about the devices allocated to the rack. The equipment viewing page 700 may include a next button 740 to commit the equipment additions to the rack template and proceed to a next step of the rack template creation process. That is, the user may indicate completion of the adding equipment step and proceed to a next step in the rack template creation process by clicking on and/or touching the next button 740. The facility designing component 180 may display, via the output component 160, a user interface for defining connectivity of the rack template in response to the next button 740 having been activated.

Figure 8:
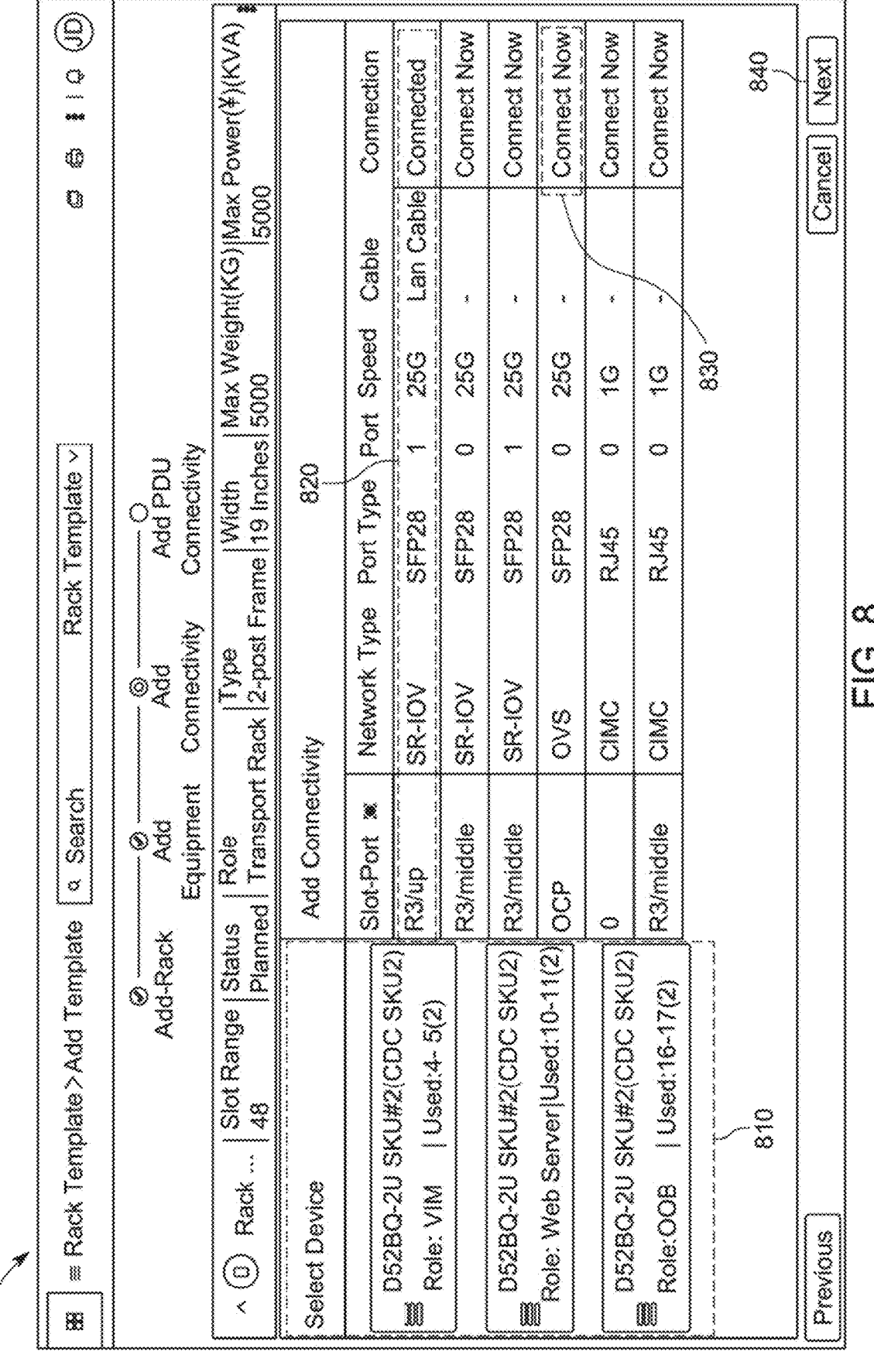
FIG. 8 is an example of a first user interface for defining connectivity of a rack template, in accordance with various embodiments of the present disclosure.

FIG. 8 is an example of a first defining connectivity page 800 of a rack template, in accordance with various embodiments of the present disclosure. The first defining connectivity page 800 may be provided by the facility designing component 180 and/or a device 100 comprising the facility designing component 180. For example, the first defining connectivity page 800 may be displayed by the output component 160 of the device 100 and/or may receive user inputs via the input component 150 of the device 100. The first defining connectivity page 800 may include a list of rack equipment 810 comprising the equipment currently allocated to the rack template. The user may select a device from the list of rack equipment 810 to which connectivity needs to be defined. For example, the user may click on and/or touch the desired equipment from the list of rack equipment 810 and the first defining connectivity page 800 may display a list of connection ports of the selected device. The first defining connectivity page 800 may display for each connection port 820 of the selected device at least one of a slot/port name, a network type, a port type, a port number, a port speed, a cable type, and a connection status. The connection status may indicate that the connection has been defined (e.g., "Connected") and/or may indicate that the connection has not been defined (e.g., "Connect Now"). The "Connect Now" label 830 may be an active label (e.g., hyperlink) that opens a second user interface for defining connectivity. The first defining connectivity page 800 may include a next button 840 to commit the connectivity definitions to the rack template and proceed to a next step of the rack template creation process. That is, the user may indicate completion of the defining connectivity step and proceed to a next step in the rack template creation process by clicking on and/or touching the next button 840. The facility designing component 180 may, in response to the next button 740 having been activated, submit the rack template and cause the particular rack template to become available for use by other facility management process flows, as described in further detail in reference to block 218 of FIG. 2. Alternatively or additionally, the facility designing component 180 may submit the rack template for approval prior to making the rack template available for use.

Figure 9:
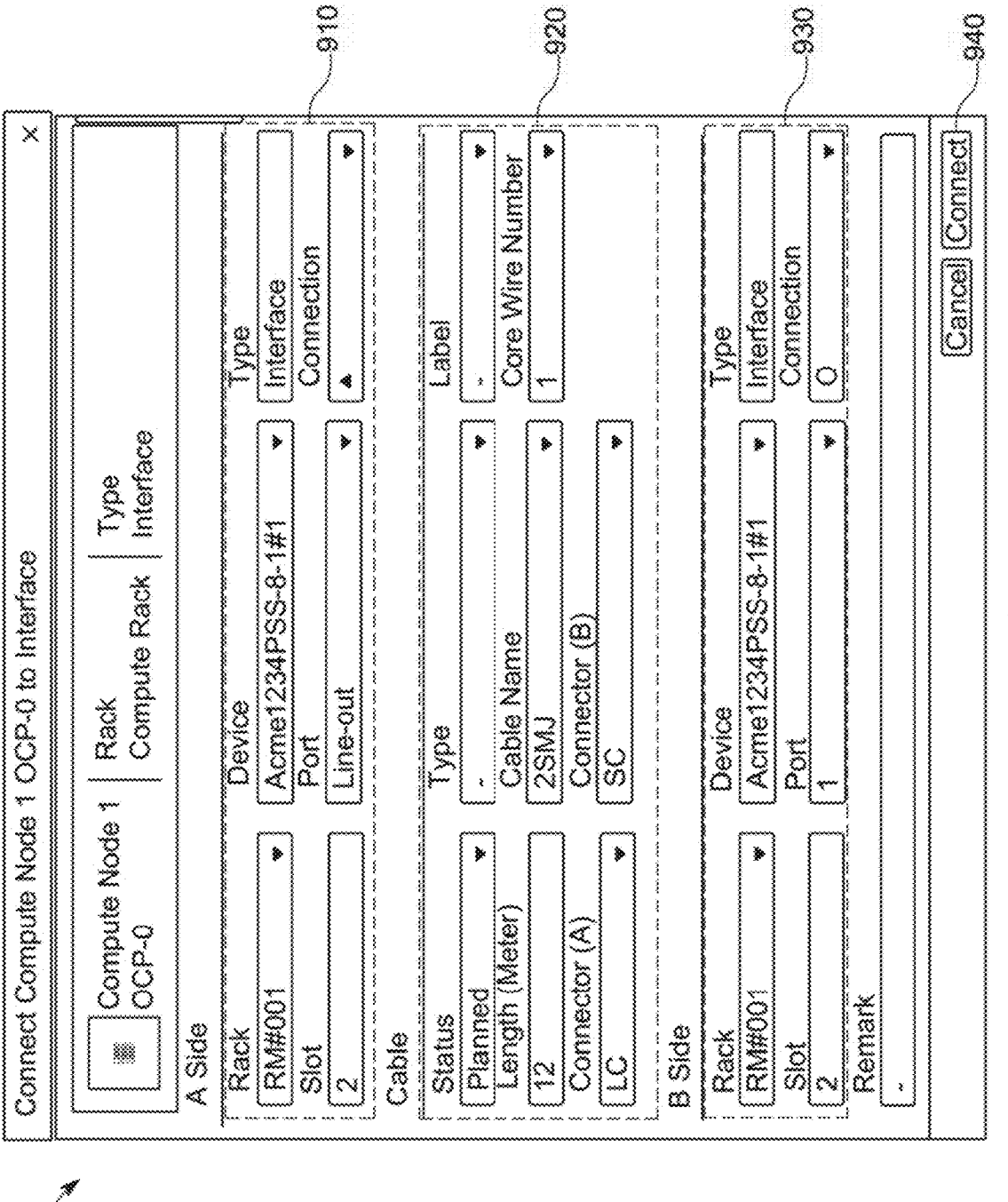
FIG. 9 is an example of a second user interface for defining connectivity of a rack template, in accordance with various embodiments of the present disclosure.

FIG. 9 is an example of a second defining connectivity page 900 of a rack template, in accordance with various embodiments of the present disclosure. The second defining connectivity page 900 may be provided by the facility designing component 180 and/or a device 100 comprising the facility designing component 180. For example, the second defining connectivity page 900 may be displayed by the output component 160 of the device 100 and/or may receive user inputs via the input component 150 of the device 100. The second defining connectivity page 900 may include first (e.g., side A) device input fields 910 for entering information regarding the first device port of the connection. The first device input fields 910 may include fields for entering a rack name, a device name, an equipment type, a slot number of the equipment, a port name, and a connection type. The second defining connectivity page 900 may include cable information input fields 920 for entering information regarding the cable effecting the connection. The cable information input fields 920 may include fields for entering a cable status, a cable type, a cable label, a cable length, a cable name, a core wire number, a first (e.g., side A) connector type, and a second (e.g., side B) connector type. The second defining connectivity page 900 may include second (e.g., side B) device input fields 930 for entering information regarding the first device port of the connection. The second device input fields 930 may include fields for entering a rack name, a device name, an equipment type, a slot number of the equipment, a port name, a connection type, and a remarks field. The second defining connectivity page 900 may include a connect button 940 to add (e.g., commit) the cable connection information made on the second defining connectivity page 900 to the rack template and return to the first defining connectivity page 800 of FIG. 8.

Advantageously, as illustrated in FIGS. 3-9, the rack template management techniques described herein provide for the creation and management of rack templates that may be used during the design and/or creation of a site template and/or a facility. In addition, the rack templates comprise predefined rack designs with predefined equipment and connectivity information that may be reused in the design and/or creation of multiple sites and/or facilities. As such, the rack templates may allow for increased design efficiency, visibility and approval of designs, and ease of fault detection, when compared to conventional design and/or management of datacenter facilities.

FIG. 10 is an example of a site template listing page 1000, in accordance with various embodiments of the present disclosure. The site template listing page 1000 may be provided by the facility designing component 180 and/or a device 100 comprising the facility designing component 180. For example, the site template listing page 1000 may be displayed by the output component 160 of the device 100 and/or may receive user inputs via the input component 150 of the device 100. The site template listing page 1000 may include a list of the predefined site templates. The site template listing page 1000 may display for each predefined site template 1010 at least one of a status, a template name, a number of racks, a facility type, a facility sub-type, and creation information.

The status of the predefined site template 1010 may indicate a current status of the predefined site template 1010, such as "not started", "in design", "on hold", "planned" (or "completed"), "awaiting approval", "approved", and the like, as described in further detail above in reference to the site template management flow 220 of FIG. 2.

The template name may uniquely identify the predefined site template 1010. The template name may be automatically generated by the facility designing component 180. Alternatively or additionally, the template name may be provided by a user and/or another device (e.g., a server), as described in further detail above in reference to the site template management flow 220 of FIG. 2.

The facility type may indicate a type of facility associated with the predefined site template 1010. For example, the predefined site template 1010 may be associated with at least one of a CDC, RDC, and GDC. In some embodiments, the predefined site template 1010 may be added to a facility if or when the facility type associated with the predefined site template 1010 matches the facility type of the facility object to which the predefined site template 1010 is being added. Alternatively or additionally, the predefined site template 1010 may not be added to a facility if or when the facility type of the predefined site template 1010 differs from the facility type of the facility object to which the predefined site template 1010 is being added.

The creation information may indicate one or more values obtained from the revision history of the predefined site template 1010. For example, as shown in FIG. 10, the creation information may indicate a user that created the predefined site template 1010 and a date and time at which the predefined site template 1010 was created.

In some embodiments, the site template listing page 1000 may display site template actions 1020 if or when a user (e.g., a facility designer) selects a predefined site template from the list of the predefined site templates. For example, the user may click on and/or touch the selected predefined site template and the input component 150 may receive the user selection. The site template actions 1020 may comprise one or more site template management functions that the user may perform on the selected predefined site template, such as viewing the selected predefined site template, deleting the selected predefined site template, and copying the selected predefined site template.

In other embodiments, the site template listing page 1000 may comprise an add button 1030 that may allow the user to create a new site template. For example, the user may click on and/or touch the add button 1030 to generate a request to create the new site template. The facility designing component 180 may receive the request to create the new site template and start a site template management flow 220 to create the new site template. For example, the facility designing component 180 may display the site template creation page 1100 of FIG. 11 to initiate the site template creation process.

In other optional or additional embodiments, the site template listing page 1000 may comprise a filter button 1040 that may allow the user to filter the predefined site templates shown in the list of the predefined site templates of the site template listing page 1000. For example, the user may click on and/or touch the filter button 340 to provide filtering information to specify a portion of the list of the predefined site templates that is to be shown and/or specify a portion of the list of the predefined site templates that is to be hidden.

Alternatively or additionally, the site template listing page 1000 may comprise a search input box 1050 that may allow the user to search for one or more predefined site templates that meet the search criteria provided by the user.

Figure 11:
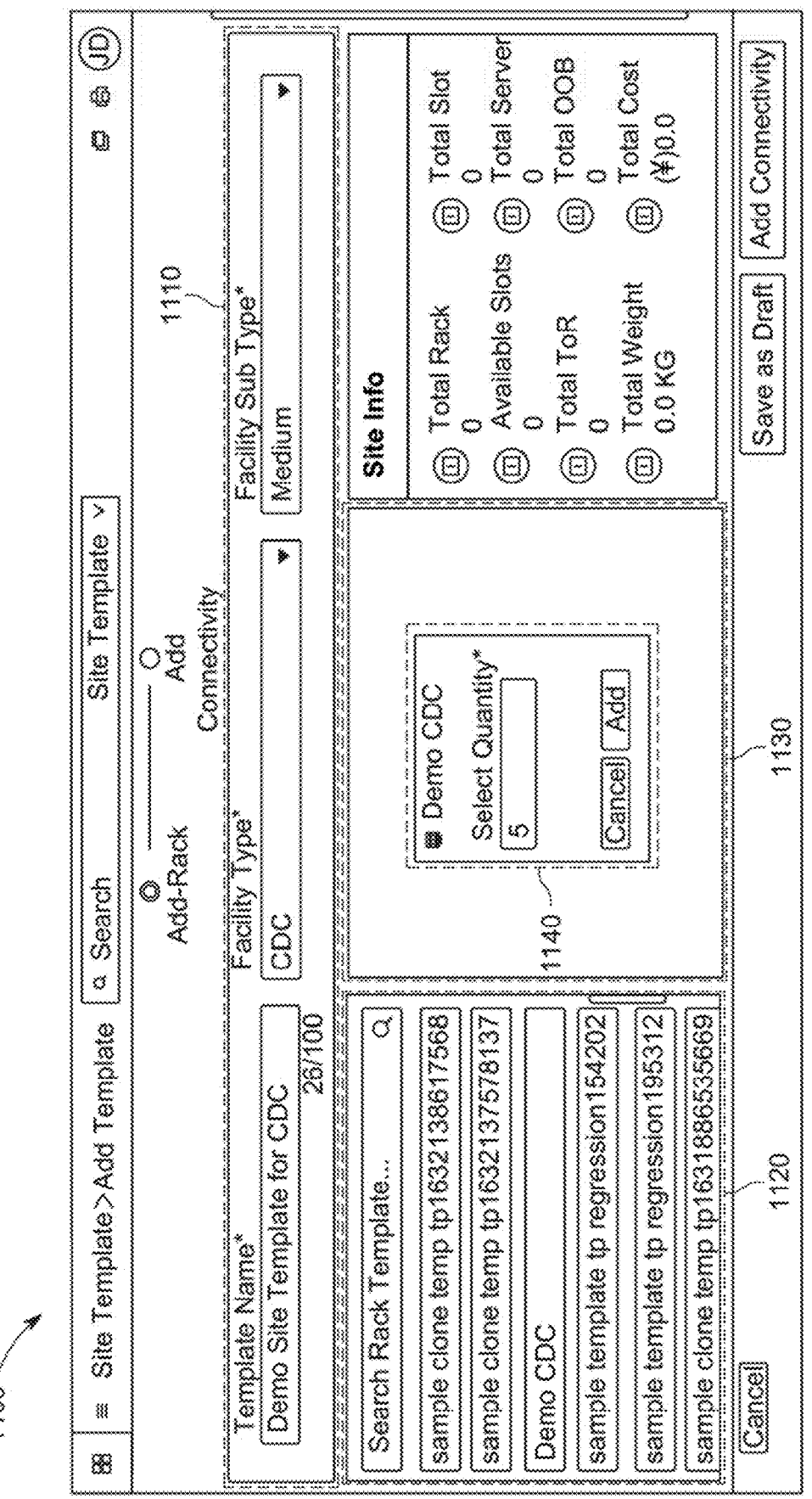
FIG. 11 is an example of a first user interface for adding racks to a site template, in accordance with various embodiments of the present disclosure.

FIG. 11 is an example of a first user interface for adding racks to a site template, in accordance with various embodiments of the present disclosure. The first rack adding page 1100 may be provided by the facility designing component 180 and/or a device 100 comprising the facility designing component 180. For example, the first rack adding page 1100 may be displayed by the output component 160 of the device 100 and/or may receive user inputs via the input component 150 of the device 100. The first rack adding page 1100 may include basic site information fields 1110 for entering the basic site information of the corresponding site, such as a site template name field, a facility type field, and a facility sub-type field.

As shown in FIG. 11, the first rack adding page 1100 may include a searchable list of predefined rack templates 1120 that may be added to the site template. For example, the searchable list of predefined rack templates 1120 may include site templates that have been submitted and/or approved for addition in one or more site templates.

The first rack adding page 1100 may allow the user add one or more instances of one or more rack templates to the site template. For example, the user may select a rack template from the searchable list of predefined rack templates 1120 and "drag and drop" the selected rack template to a region 1130 of the first rack adding page 1100. Alternatively or additionally, the user may provide other user input, via the input component 150, requesting to add a selected rack template from the searchable list of predefined rack templates 1120 to the site template. The user request to add the selected device to the rack (e.g., drag and drop operation) may cause a rack quantity selection window 1140 to be displayed, as shown in FIG. 11. The rack quantity selection window 1140 may include an input field for specifying a quantity of instances of the selected rack template to be added to the site template. The add button of the rack quantity selection window 1140 may add the specified quantity of instances to the selected rack template and close the rack quantity selection window 1140.

Figure 12:
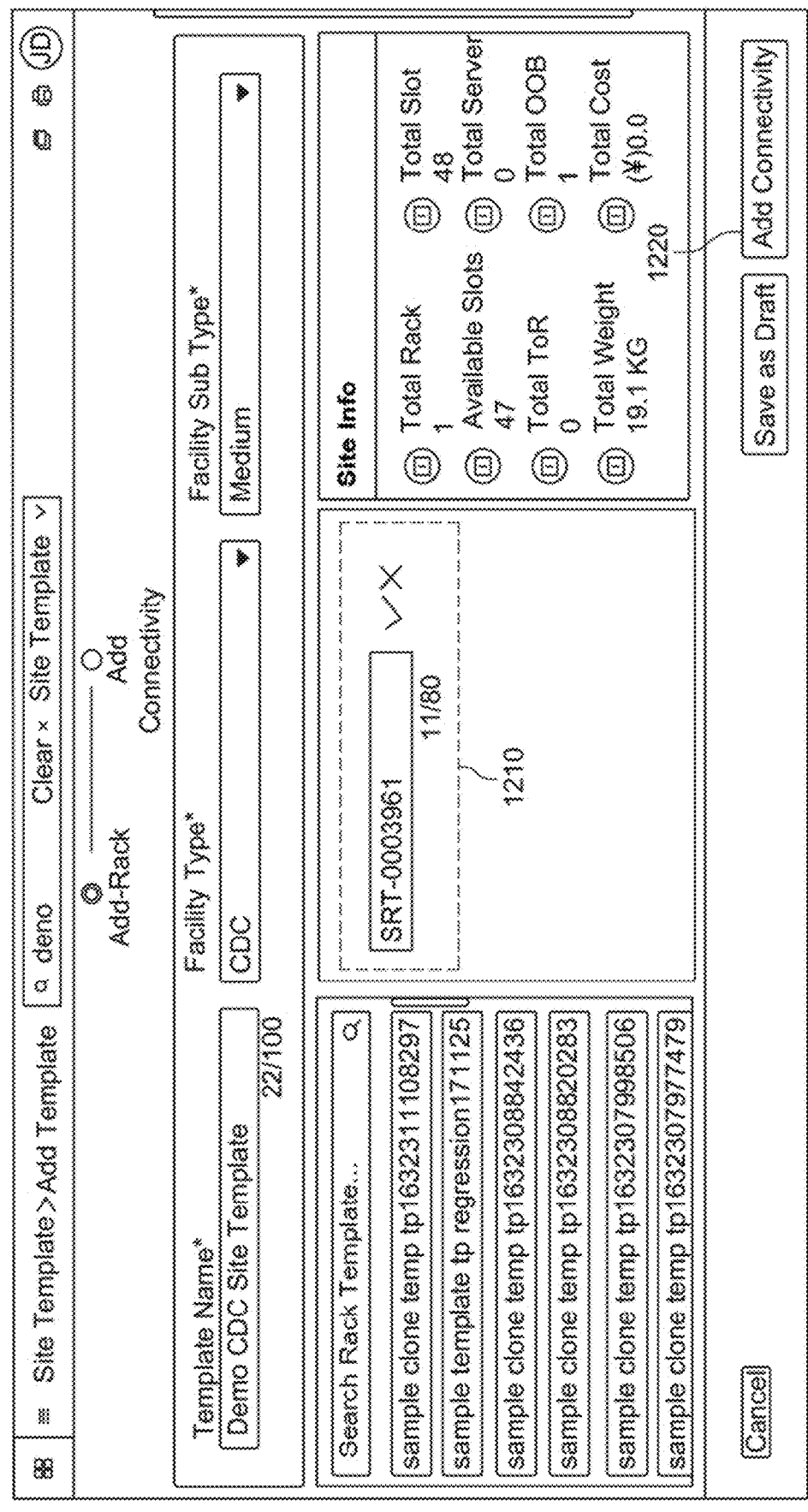
FIG. 12 is an example of a first user interface for adding racks to a site template, in accordance with various embodiments of the present disclosure.

FIG. 12 is an example of a second user interface for adding racks to a site template, in accordance with various embodiments of the present disclosure. The second rack adding page 1200 may be provided by the facility designing component 180 and/or a device 100 comprising the facility designing component 180. For example, the second rack adding page 1200 may be displayed by the output component 160 of the device 100 and/or may receive user inputs via the input component 150 of the device 100. The second rack adding page 1200 is similar in many respects to the first rack adding page 1100 described above with reference to FIG. 11 and may include additional features not mentioned above.

The second rack adding page 1200 may display in region 1210 a list of the rack templates currently associated with the site template. The region 1210 may include, for each rack template listed in the region 1210, one or more actions for performing management functions on the list of associated rack templates, such as editing the rack template information (e.g., quantity of rack template instances), and removing the rack template from the site template.

The second rack adding page 1200 may include site template information about the devices the rack templates associated to the site template. For example, the site template information may include a total number of racks, a total number of slots, a quantity of available slots, a quantity of servers, a total quantity of top-of-row (ToR) slots that have been allocated, a total quantity of out-of-band (OOB) devices associated with the site template, a total weight of equipment associated with the site template, and a total cost of the equipment associated with the site template.

The second rack adding page 1200 may include an add connectivity button 1220 to commit the rack template additions to the site template and proceed to a next step of the site template creation process. That is, the user may indicate completion of the adding rack template step and proceed to a next step in the site template creation process by clicking on and/or touching the add connectivity button 1220. The facility designing component 180 may display, via the output component 160, a user interface for defining connectivity of the site template in response to the add connectivity button 1220 having been activated.

Figure 13:
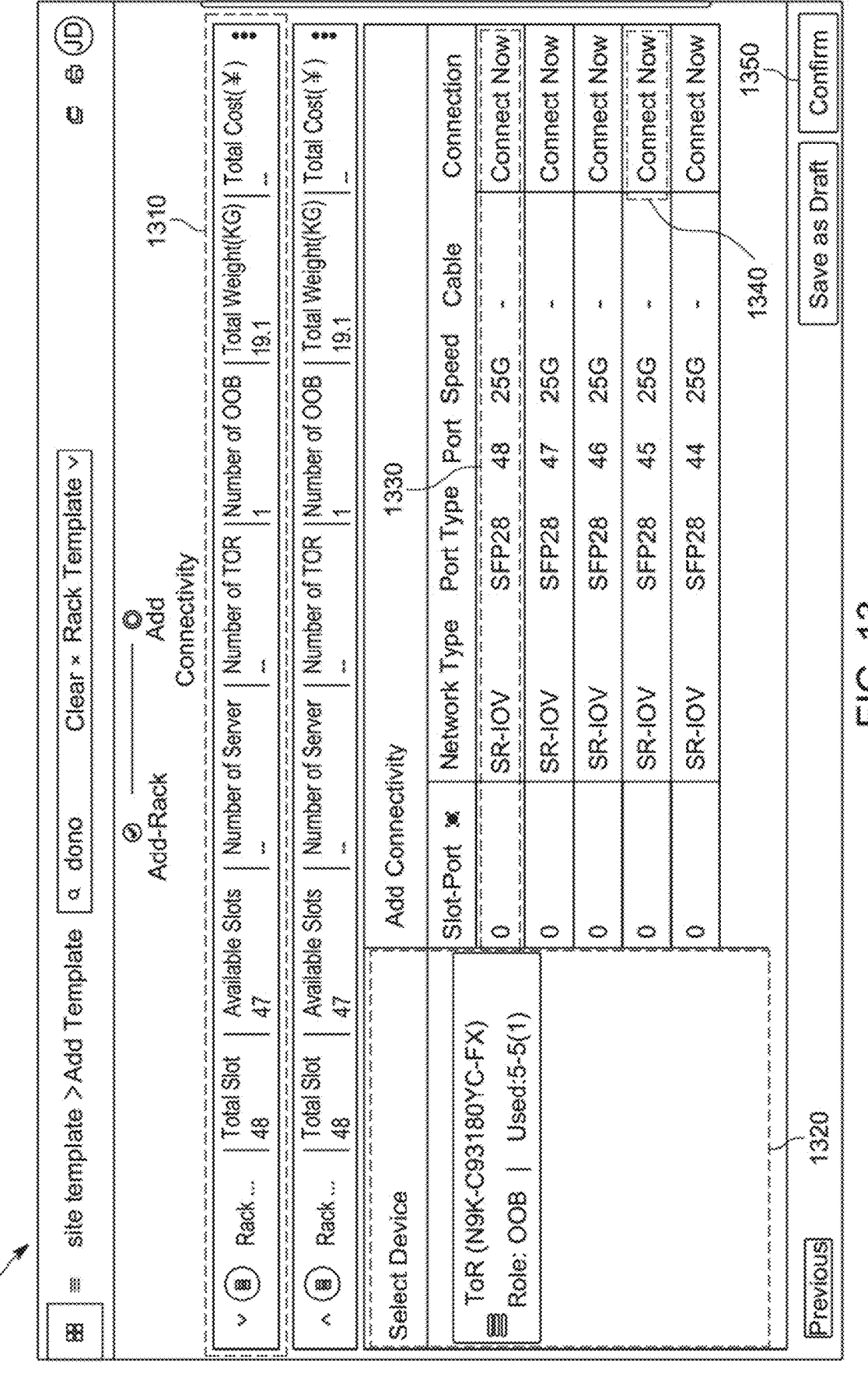
FIG. 13 is an example of a user interface for defining connectivity of a site template, in accordance with various embodiments of the present disclosure.

FIG. 13 is an example of a site connectivity defining page 1300 of a rack template, in accordance with various embodiments of the present disclosure. The site connectivity defining page 1300 may be provided by the facility designing component 180 and/or a device 100 comprising the facility designing component 180. For example, the site connectivity defining page 1300 may be displayed by the output component 160 of the device 100 and/or may receive user inputs via the input component 150 of the device 100.

The site connectivity defining page 1300 may include a list of rack templates associated with the site template. The user may select a rack template 1310 from the list of rack templates to which connectivity needs to be defined. For example, the user may click on and/or touch the desired rack template 1310 from the list of rack templates and the site connectivity defining page 1300 may display a list of rack equipment 1320 of the selected rack template 1310. The user may select a device from the list of rack equipment 1320 to which connectivity needs to be defined. For example, the user may click on and/or touch the desired equipment from the list of rack equipment 1320 and the site connectivity defining page 1300 may display a list of connection ports of the selected device. The site connectivity defining page 1300 may display for each connection port 1330 of the selected device at least one of a slot/port name, a network type, a port type, a port number, a port speed, a cable type, and a connection status. The connection status may indicate that the connection has been defined (e.g., "Connected") and/or may indicate that the connection has not been defined (e.g., "Connect Now"). The "Connect Now" label 1340 may be an active label (e.g., hyperlink) that opens a second user interface for defining connectivity. The second user interface for defining connectivity is similar in many respects to the second defining connectivity page 900 of FIG. 9 and a detailed description is omitted for the sake of brevity.

The site connectivity defining page 1300 may include a confirm button 1350 to commit the connectivity definitions to the site template and proceed to a next step of the site template creation process. That is, the user may indicate completion of the defining connectivity step and proceed to a next step in the site template creation process by clicking on and/or touching the confirm button 1350. The facility designing component 180 may, in response to the confirm button 1350 having been activated, submit the site template and cause the particular site template to become available for use by other facility management process flows, as described in further detail in reference to block 228 of FIG. 2. Alternatively or additionally, the facility designing component 180 may submit the site template for approval prior to making the site template available for use.

Advantageously, as illustrated in FIGS. 10-13, the site template management techniques described herein provides for the creation and management of site templates that may be used during the design and/or creation of a facility. In addition, the site templates comprise predefined site designs with predefined racks and/or equipment and connectivity information that may be reused in the design and/or creation of multiple facilities. As such, the site templates may allow for increased design efficiency, visibility and approval of designs, and ease of fault detection, when compared to conventional design and/or management of datacenter facilities.

FIG. 14 is an example of a facility listing page 1400, in accordance with various embodiments of the present disclosure. The facility listing page 1400 may be provided by the facility designing component 180 and/or a device 100 comprising the facility designing component 180. For example, the facility listing page 1400 may be displayed by the output component 160 of the device 100 and/or may receive user inputs via the input component 150 of the device 100. The facility listing page 1400 may include a list of facility objects. The facility listing page 1400 may display for each facility object 1410 at least one of a status, a facility name, a facility ID, a facility type, a facility sub-type, a phase, and location information (e.g., city).

The status of the facility object 1410 may indicate a current status of the facility object 1410, such as "not started", "in design", "on hold", "planned", "awaiting approval", "approved", "rejected", "under construction", "commissioned", and the like, as described in further detail above in reference to the facility creation flow 240 of FIG. 2.

The facility ID may uniquely identify the facility object 1410. The facility ID may be automatically generated by the facility designing component 180. Alternatively or additionally, the facility ID may be provided by a user and/or another device (e.g., a server), as described in further detail above in reference to the facility creation flow 240 of FIG. 2.

The facility type may indicate a type of facility of the facility object 1410. For example, the facility object 1410 may be associated with at least one of a CDC, RDC, and GDC. In some embodiments, a rack template and/or a site template may be added to the facility object 1410 if or when the facility type associated with the rack template and/or the site template matches the facility type of the facility object. Alternatively or additionally, a rack template and/or a site template may not be added to the facility object 1410 if or when the facility type associated with the rack template and/or the site template differs from the facility type of the facility object.

In some embodiments, the facility listing page 1400 may display facility object actions 1420 if or when a user (e.g., a facility designer) selects a facility object from the list of facility object. For example, the user may click on and/or touch the selected facility object and the input component 150 may receive the user selection. The facility object actions 1420 may comprise one or more facility object management functions that the user may perform on the selected facility object, such as viewing the selected facility object, deleting the selected facility object, and copying the selected facility object.

In other embodiments, the facility listing page 1400 may comprise an add button 1430 that may allow the user to create a facility object. For example, the user may click on and/or touch the add button 1430 to generate a request to create the new facility object. The facility designing component 180 may receive the request to create the new facility object and start a facility creation flow 240 to create the new facility object. For example, the facility designing component 180 may display the facility object creation page 1500 of FIG. 15 to initiate the facility object creation process.

In other optional or additional embodiments, the facility listing page 1400 may comprise a filter button 1440 that may allow the user to filter the facility objects shown in the list of facility objects of the facility listing page 1400. For example, the user may click on and/or touch the filter button 1440 to provide filtering information to specify a portion of the list of facility objects that is to be shown and/or specify a portion of the list of facility objects that is to be hidden. Alternatively or additionally, the facility listing page 1400 may comprise a search input box 1450 that may allow the user to search for one or more facility objects that meet the search criteria provided by the user.

Figure 15:
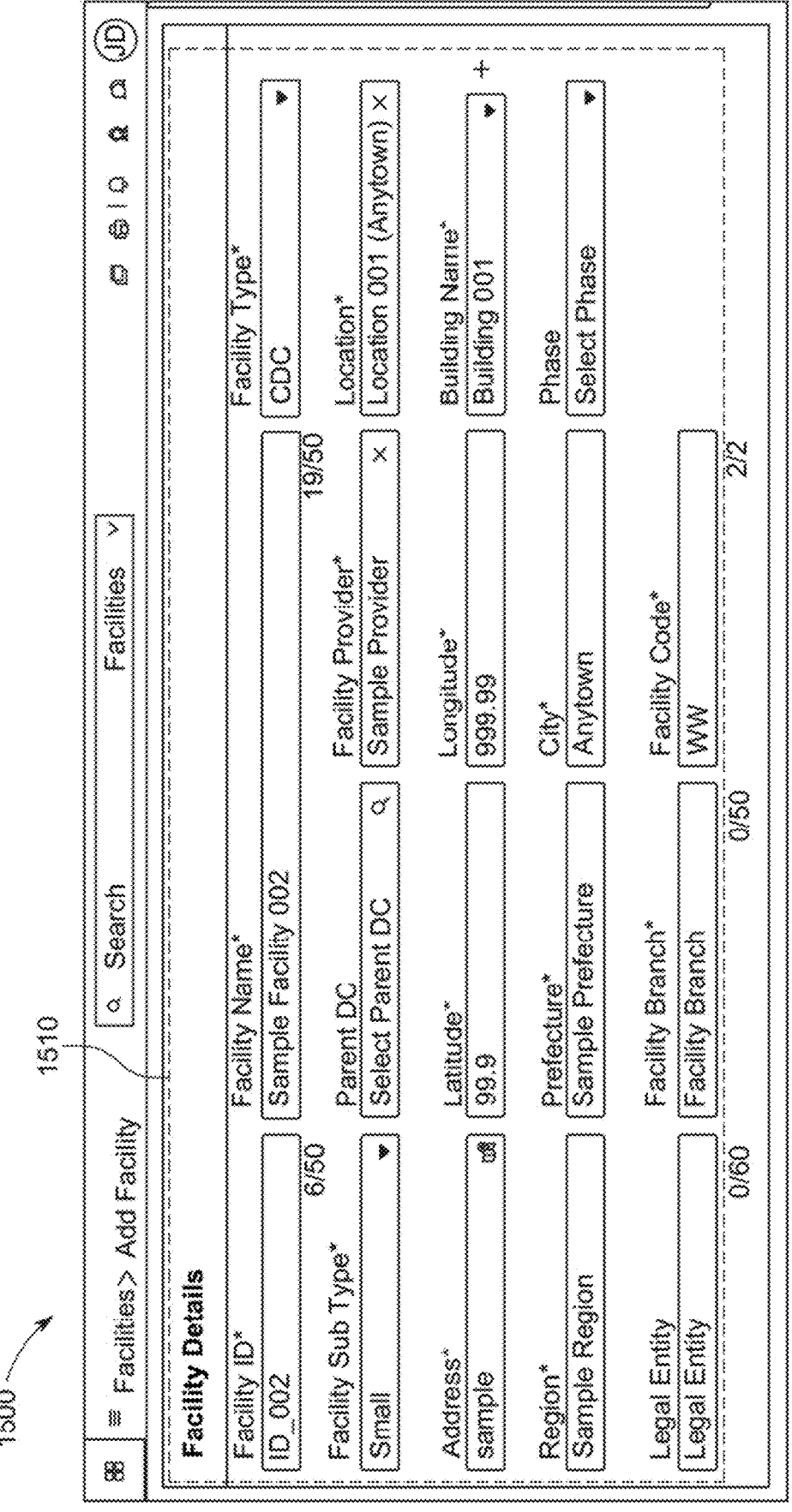
FIG. 15 is an example of a first user interface for adding a facility, in accordance with various embodiments of the present disclosure.

FIG. 15 is an example of a first facility object creation page 1500, in accordance with various embodiments of the present disclosure. The first facility object creation page 1500 may be provided by the facility designing component 180 and/or a device 100 comprising the facility designing component 180. For example, the first facility object creation page 1500 may be displayed by the output component 160 of the device 100 and/or may receive user inputs via the input component 150 of the device 100. The first facility object creation page 1500 may include basic facility information fields 1510 for entering the basic facility information of the corresponding facility, such as a facility ID field, a facility name field, a facility type field, a facility sub-type field, a parent datacenter field, a facility provider field, location information fields (e.g., address, latitude/longitude, building name, region, prefecture, city), a phase field, a legal entity field, a facility branch field, and a facility code field. The basic facility information fields 1510 of the first facility object creation page 1500 are similar in many respects to the basic facility information comprised by the facility object as described above with reference to the facility creation flow 240 and a detailed description is omitted here for the sake of brevity. In some embodiments, the user (e.g., facility designer) may enter one or more values in the basic facility information fields 1510 that may be received by the facility designing component 180 via the input component 150, for example.

Figure 16:
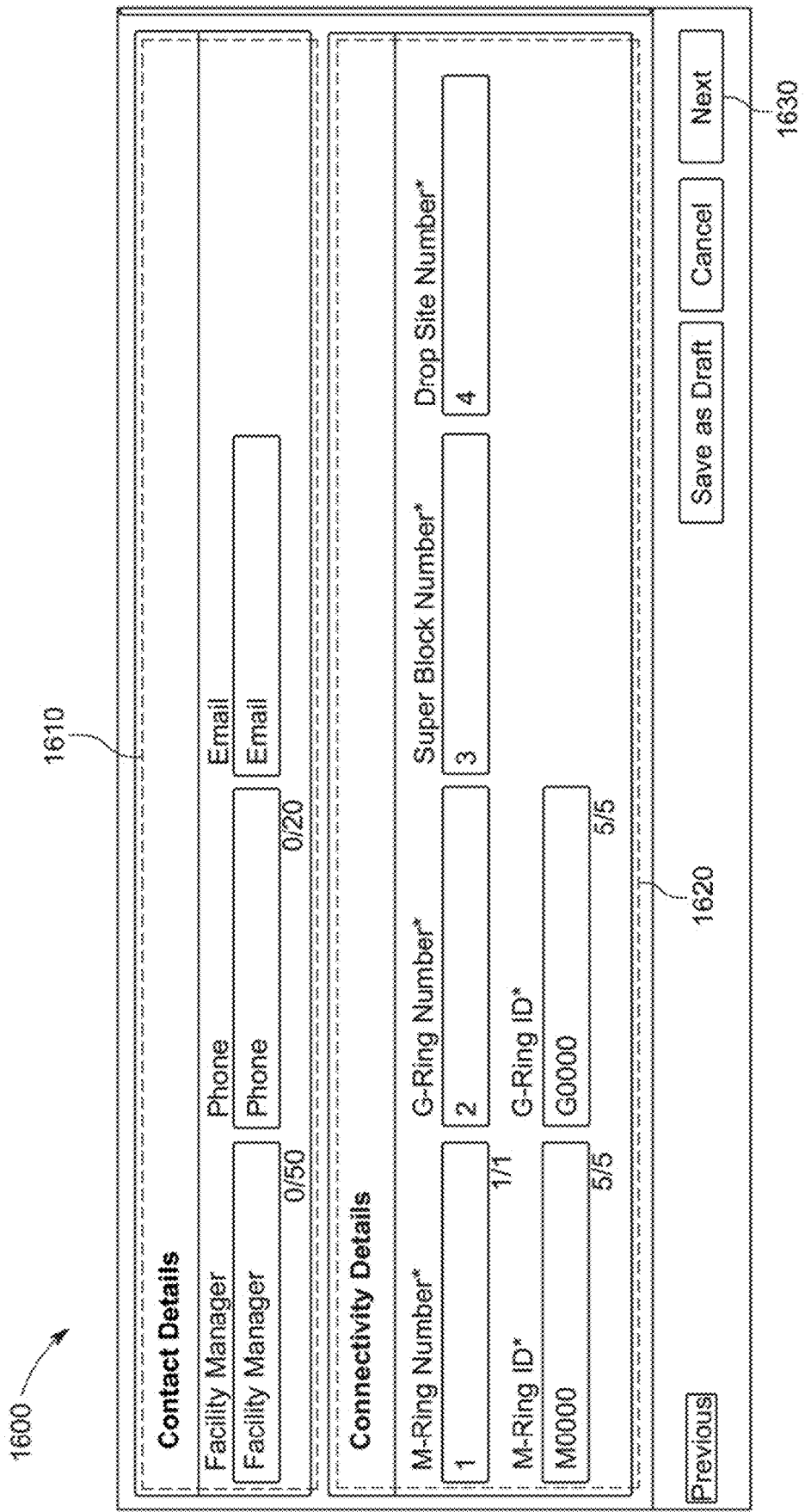
FIG. 16 is an example of a second user interface for adding a facility, in accordance with various embodiments of the present disclosure.

FIG. 16 is an example of a second facility object creation page 1600, in accordance with various embodiments of the present disclosure. The second facility object creation page 1600 may be provided by the facility designing component 180 and/or a device 100 comprising the facility designing component 180. For example, the second facility object creation page 1600 may be displayed by the output component 160 of the device 100 and/or may receive user inputs via the input component 150 of the device 100. The second facility object creation page 1600 may include additional facility information fields for entering additional facility information of the corresponding facility, such as facility contact information fields 1610 (e.g., facility manager, phone, email) and connectivity detail information fields 1620 (e.g., M-ring number, G-Ring number, Super Block number, Drop Site number, M-Ring ID, and G-Ring ID).

The user may indicate completion and proceed to a next step in the facility object creation process by clicking on and/or touching the next button 1630. The facility designing component 180 may display, via the output component 160, a user interface for defining a floor layout of the facility in response to the next button 1630 having been activated.

Figure 17:
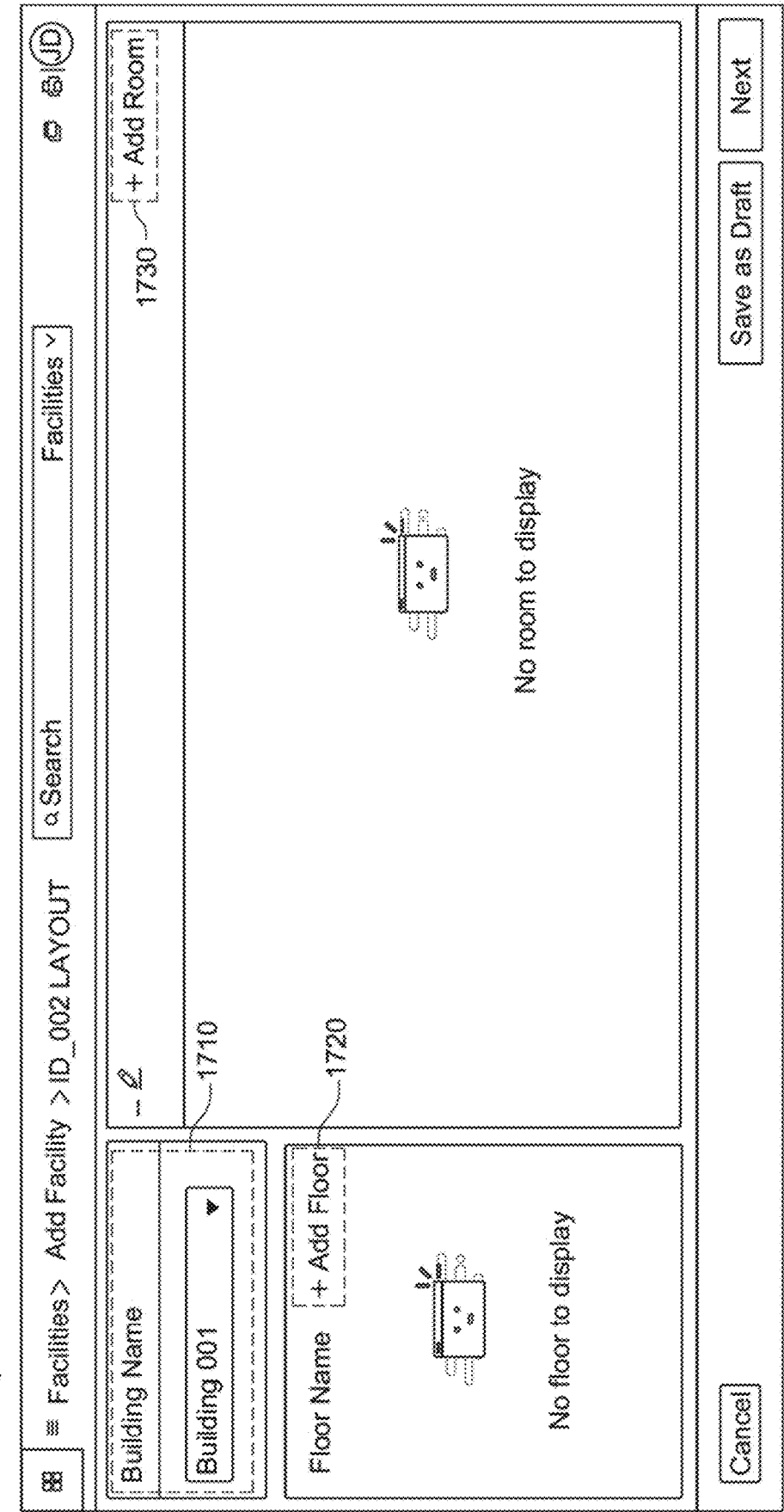
FIG. 17 is an example of a first user interface for defining a floor layout of a facility, in accordance with various embodiments of the present disclosure.

FIG. 17 is an example of a first floor layout page 1700, in accordance with various embodiments of the present disclosure. The first floor layout page 1700 may be provided by the facility designing component 180 and/or a device 100 comprising the facility designing component 180. For example, the first floor layout page 1700 may be displayed by the output component 160 of the device 100 and/or may receive user inputs via the input component 150 of the device 100.

The first floor layout page 1700 may include a drop-down list of buildings and/or locations associated with the facility object. The user may select a building 1710 from the drop-down list of buildings and/or locations to which a floor needs to be added and/or modified. For example, the user may click on and/or touch the desired building 1710 from the drop-down list of buildings and/or locations and the first floor layout page 1700 may display a list of floors of the selected building 1710. In some embodiments, the user may select a floor from the list of floors of the selected building 1710 that needs to be modified. Alternatively or additionally, if or when the selected building 1710 does not have a defined floor (e.g., the list of floors of the selected building 1710 is empty), the first floor layout page 1700 may display an indication that the list of floors of the selected building 1710 is empty, as shown in FIG. 17.

The first floor layout page 1700 may include an add floor active label 1720 (e.g., hyperlink) that adds a new floor to the list of floors of the selected building 1710. The first floor layout page 1700 may include an add room active label 1730 (e.g., hyperlink) that adds a new room to a selected floor of the list of floors of the selected building 1710. The add room active label 1730 may open a second floor layout page 1800, as shown in FIG. 18.

Figure 18:
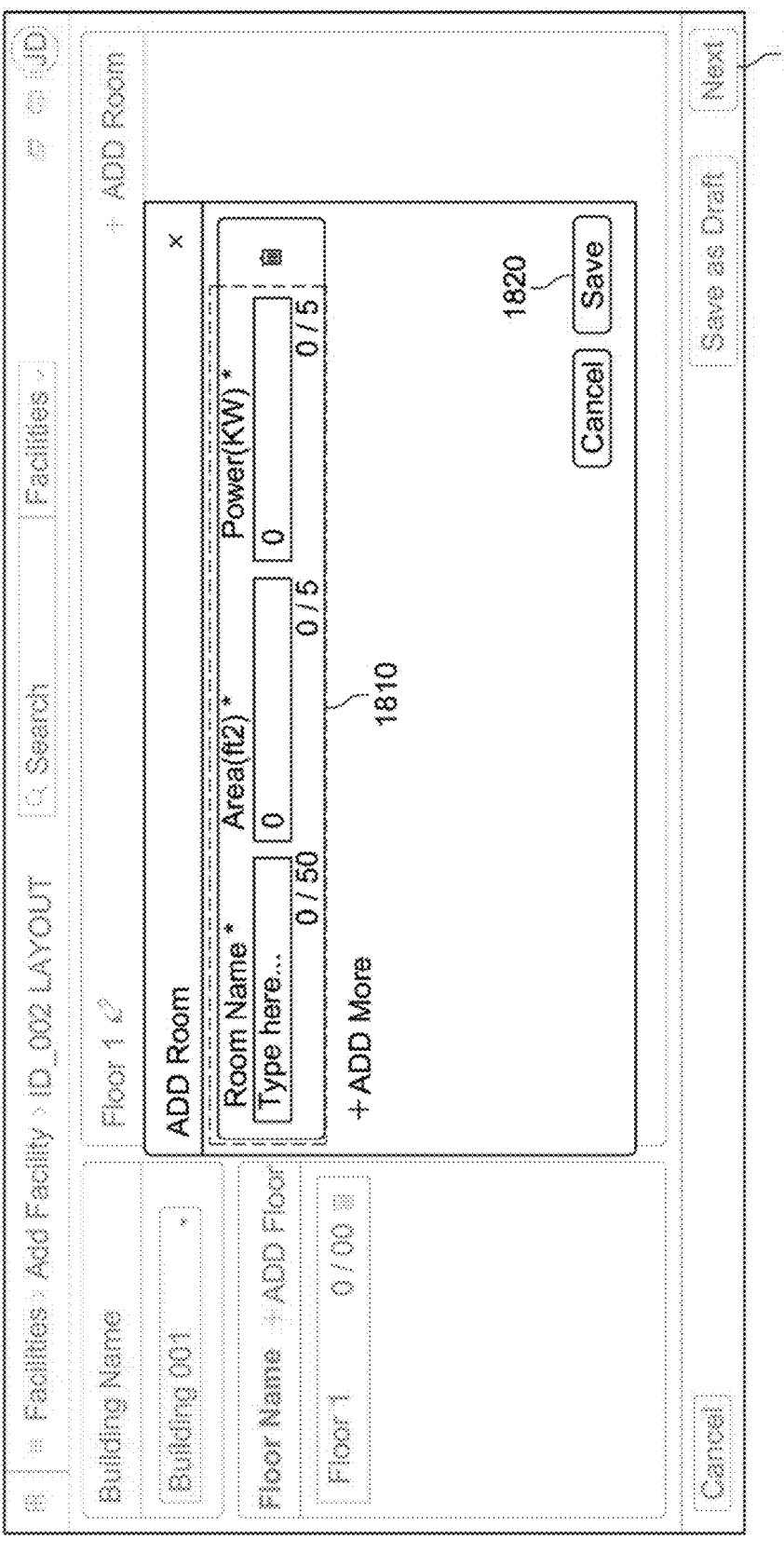
FIG. 18 is an example of a second user interface for defining a floor layout of a facility, in accordance with various embodiments of the present disclosure.

FIG. 18 is an example of a second floor layout page 1800, in accordance with various embodiments of the present disclosure. The second floor layout page 1800 may be provided by the facility designing component 180 and/or a device 100 comprising the facility designing component 180. For example, the second floor layout page 1800 may be displayed by the output component 160 of the device 100 and/or may receive user inputs via the input component 150 of the device 100. The second floor layout page 1800 may include input fields 1810 for defining basic information of the new room, such as a room name field, an area field, and a power field. The second floor layout page 1800 may include a save button 1820 to add (e.g., commit) the changes made on the second floor layout page 1800 and return to the first floor layout page 1700 of FIG. 17.

Figure 19:
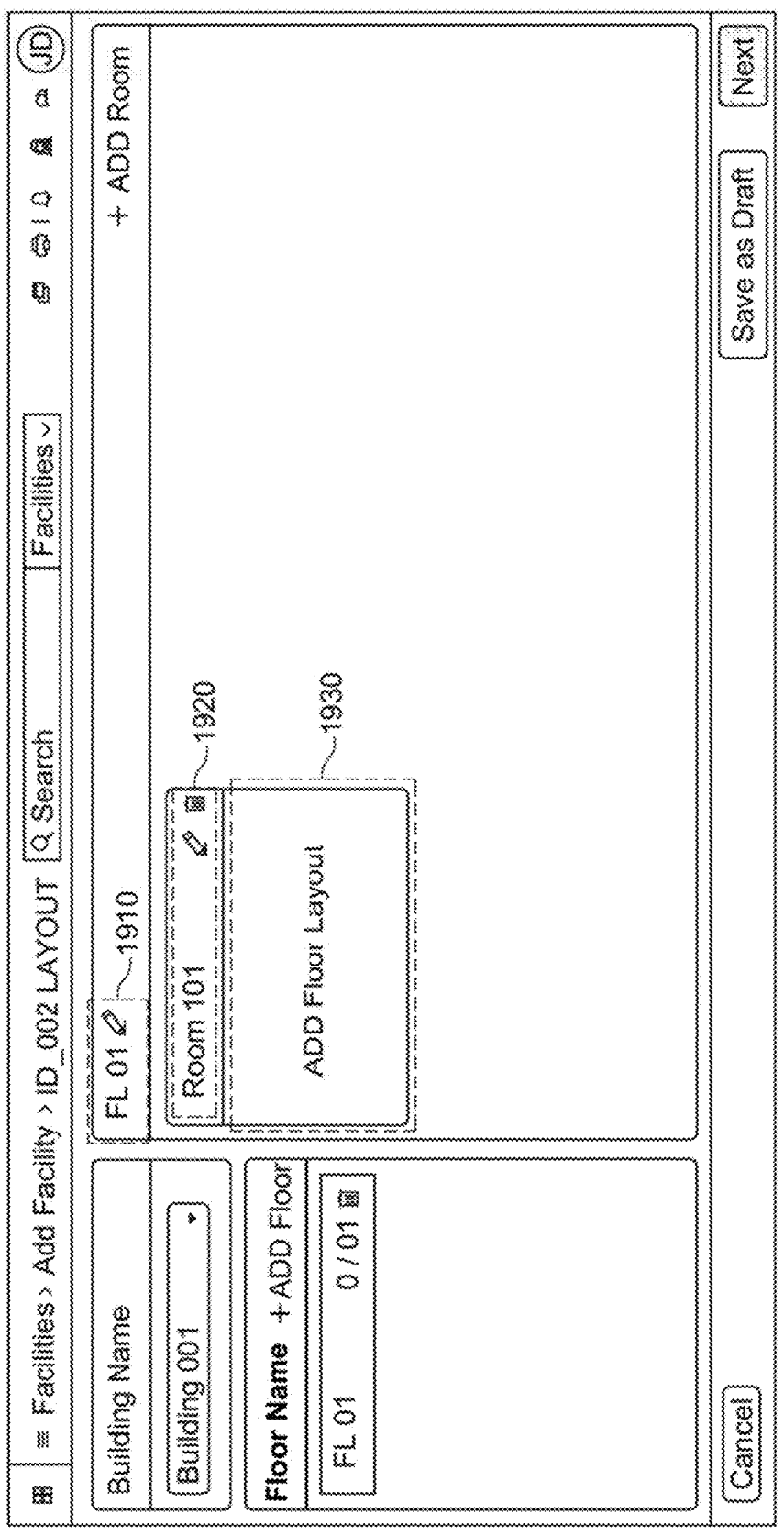
FIG. 19 is an example of a third user interface for defining a floor layout of a facility, in accordance with various embodiments of the present disclosure.

FIG. 19 is an example of a third floor layout page 1900, in accordance with various embodiments of the present disclosure. The third floor layout page 1900 may be provided by the facility designing component 180 and/or a device 100 comprising the facility designing component 180. For example, the third floor layout page 1900 may be displayed by the output component 160 of the device 100 and/or may receive user inputs via the input component 150 of the device 100. The third floor layout page 1900 is similar in many respects to the first floor layout page 1700 described above with reference to FIG. 17 and may include additional features not mentioned above.

The third floor layout page 1900 may include floor management actions 1910 for the selected floor (e.g., the selected floor from the list of floors of the selected building 1710 as described above in reference to FIG. 17). The floor management actions 1910 may comprise one or more floor management functions that the user may perform on the selected floor, such as editing the selected floor, deleting the selected floor, and copying the selected floor.

The third floor layout page 1900 may include room management actions 1920 for each room of the selected floor. The room management actions 1920 may comprise one or more room management functions that the user may perform on the room, such as editing the room, deleting the room, and copying the room.

The third floor layout page 1900 may include a floor layout region 1930 that indicates whether a floor layout has been added and/or defined for the corresponding room. For example, the floor layout region 1930 may indicate that no floor layout has been added and/or defined to Room 101, as shown in FIG. 19. In such an example, the floor layout region 1930 may include an active label that may open a user interface for defining a room layout of a facility.

Figure 20:
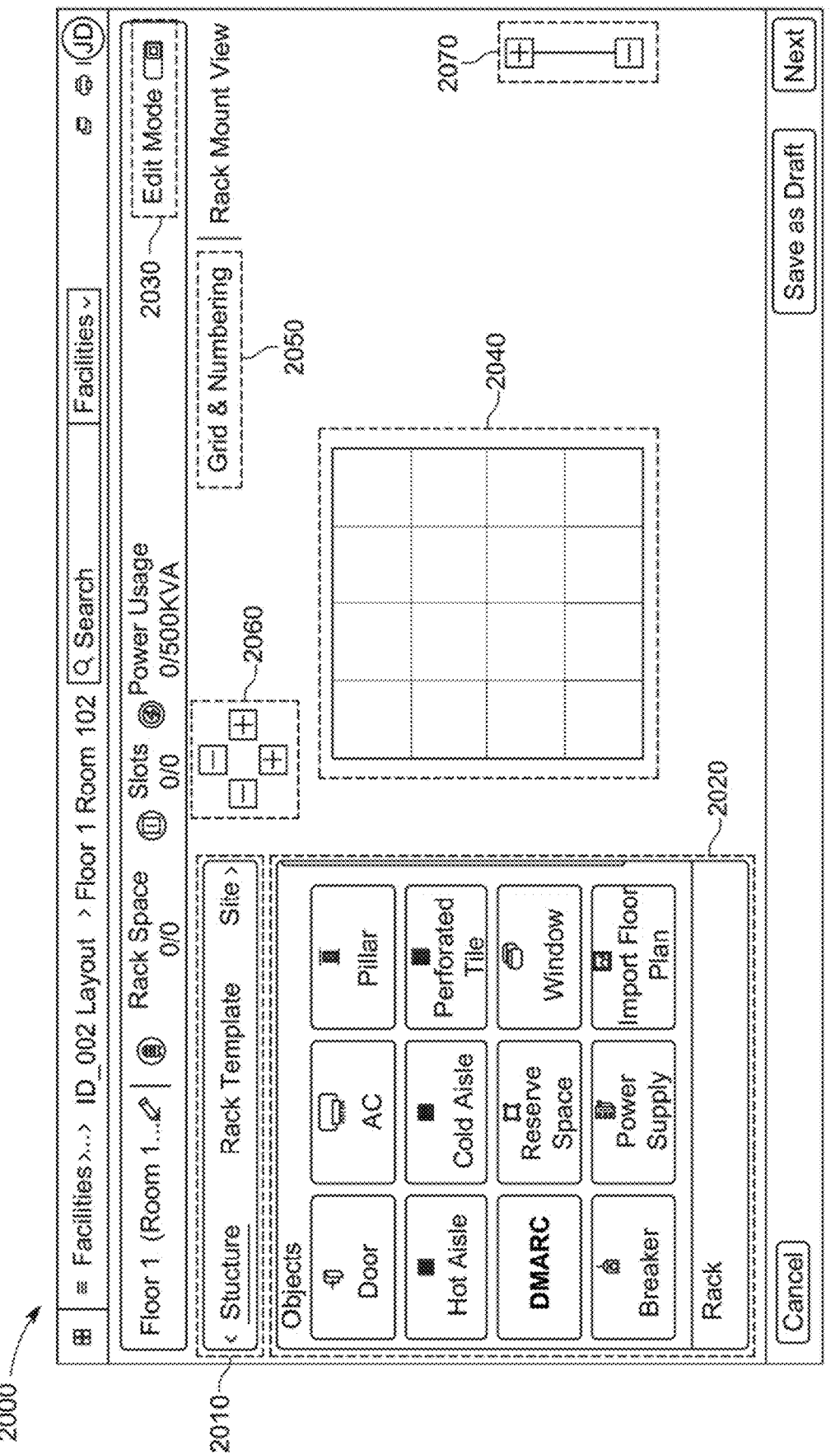
FIG. 20 is an example of a first user interface for defining a room layout of a facility, in accordance with various embodiments of the present disclosure.

FIG. 20 is an example of a first room layout page 2000, in accordance with various embodiments of the present disclosure. The first room layout page 2000 may be provided by the facility designing component 180 and/or a device 100 comprising the facility designing component 180. For example, the first room layout page 2000 may be displayed by the output component 160 of the device 100 and/or may receive user inputs via the input component 150 of the device 100.

The first room layout page 2000 may include one or more categories of objects 2010 that may be added to a room layout area 2040. For example, the one or more categories of objects 2010 may include structural elements, rack templates, and site templates. The user may select a category from the one or more categories of objects 2010. For example, the user may click on and/or touch the desired category from the one or more categories of objects 2010 and the first room layout page 2000 may display a list of objects 2020 corresponding to the selected category. The list of objects 2020 may allow the user add one or more instances of one or more objects to the room layout area 2040. For example, the user may select an object from the list of objects 2020 and "drag and drop" the selected object to the room layout area 2040 of the first room layout page 2000. Alternatively or additionally, the user may provide other user input, via the input component 150, requesting to add a selected object from the list of objects 2020 to the room layout area 2040.

The first room layout page 2000 may include an edit mode button 2030 for enabling and/or disabling an edit mode of the first room layout page 2000. For example, if or when the edit mode button 2030 is in an off position and/or state, the first room layout page 2000 may prevent modifications to the room layout. That is, the first room layout page 2000 may be in a view only mode. Alternatively or additionally, if or when the edit mode button 2030 is in an on position and/or state, the first room layout page 2000 may permit modifications to the room layout.

The first room layout page 2000 may include a grid & numbering active label 2050 (e.g., hyperlink) that may allow the user to define a grid numbering pattern for the room layout. The first room layout page 2000 may include sizing controls 2060 that may allow the user to increase and/or decrease a horizontal and/or vertical size of layout grid tiles on the room layout area 2040. The first room layout page 2000 may include zoom controls 2070 to adjust a zoom level of the room layout area 2040.

Figure 21:
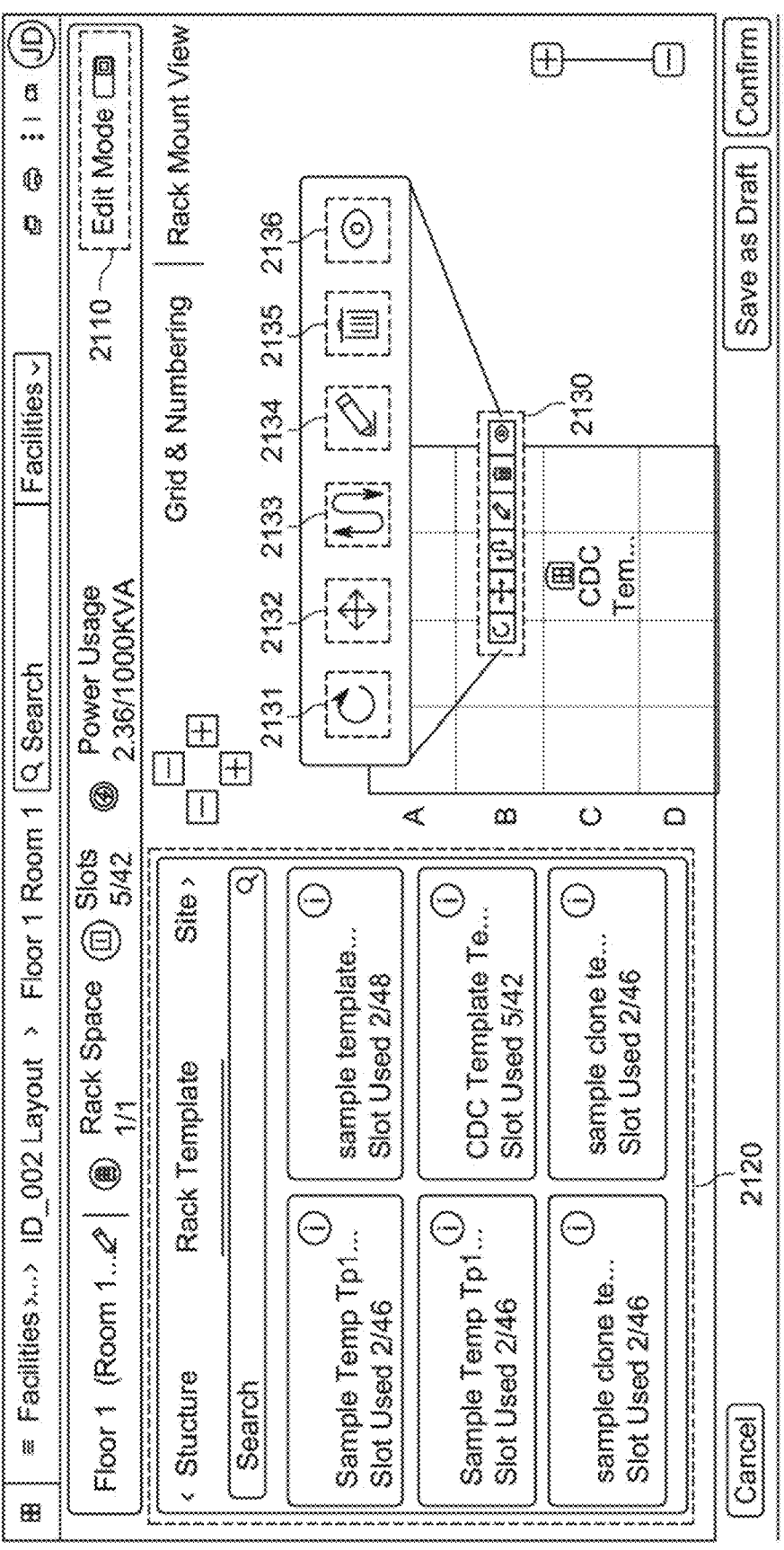
FIG. 21 is an example of a second user interface for defining a room layout of a facility, in accordance with various embodiments of the present disclosure.

FIG. 21 is an example of a second room layout page 2100, in accordance with various embodiments of the present disclosure. The second room layout page 2100 may be provided by the facility designing component 180 and/or a device 100 comprising the facility designing component 180. For example, the second room layout page 2100 may be displayed by the output component 160 of the device 100 and/or may receive user inputs via the input component 150 of the device 100. The second room layout page 2100 is similar in many respects to the first room layout page 2000 described above with reference to FIG. 20 and may include additional features not mentioned above.

In operation, a user (e.g., facility designer) may start a room layout design by setting the edit mode button 2110 to an on (e.g., enabled) state, and, as such, the second room layout page 2100 may permit modifications to the room layout. The user may select one or more objects from the list of objects 2120 and add the selected one or more objects to the room layout area and place the objects within the room according to the layout grid tiles of the room layout area. For example, the user may select a structural element (e.g., a door) and place the structural element on a first position of the room layout. In another example, the user may select a rack template and place the rack on a second position of the room layout. In yet another example, the user may select a site template and place the one or more racks corresponding to the site template in respective positions of the room layout (not shown).

The second room layout page 2100 may include an object management actions window 2130 that is displayed if or when the user selects an object that has been placed on the room layout. The object management actions window 2130 may include one or more actions that may be performed on the selected object, such as a rotate object action 2131, a move object action 2132, a swap object action 2133, an edit object action 2134, a delete object action 2135, and a view object action 2136.

The rotate object action 2131 may change an orientation of the selected object within the room layout. The move object action 2132 may change a location of the selected object within the room layout. The swap object action 2133 may swap the selected object with another object from the list of objects 2120. The edit object action 2134 may open a user interface for editing rack details of the selected rack object, such as rack details editing page 2200 of FIG. 22. The delete object action 2135 may remove the selected object from the room layout. The view object action 2136 may open a user interface for viewing rack details of the selected rack object, such as a rack viewing page 2600 of FIG. 26.

Figure 22:
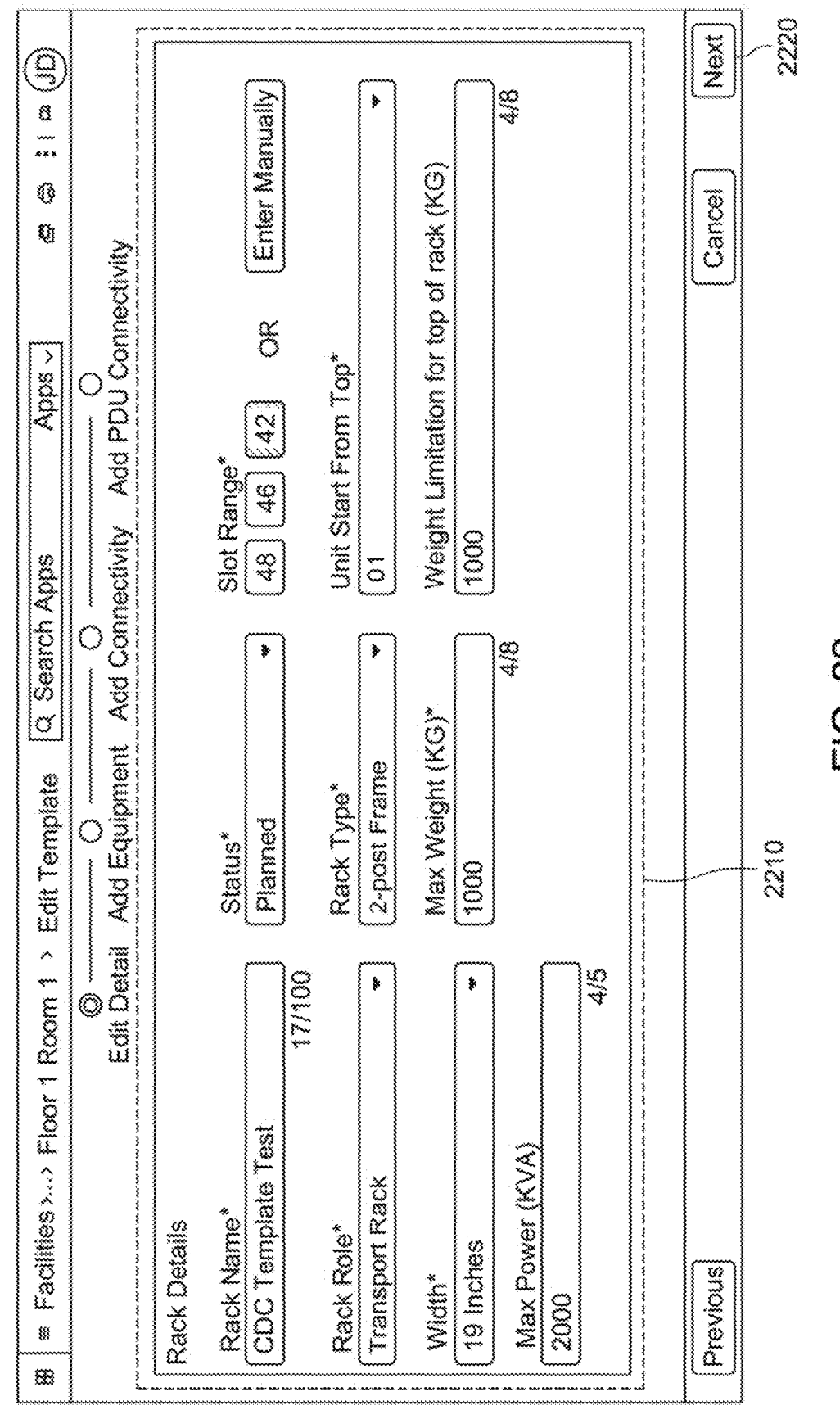
FIG. 22 is an example of a user interface for editing rack details of a facility, in accordance with various embodiments of the present disclosure.

FIG. 22 is an example of a rack details editing page 2200, in accordance with various embodiments of the present disclosure. The rack details editing page 2200 may be provided by the facility designing component 180 and/or a device 100 comprising the facility designing component 180. For example, the rack details editing page 2200 may be displayed by the output component 160 of the device 100 and/or may receive user inputs via the input component 150 of the device 100. The rack details editing page 2200 is similar in many respects to the rack template creation page 400 described above with reference to FIG. 4 and may include additional features not mentioned above.

The rack details editing page 2200 may include basic rack information fields 2210 for entering the basic rack information of the corresponding rack, such as a facility type field, a rack template name field, a rack name field, a rack status field, a slot range field, a rack role field, a rack type field, a rack dimension (e.g., width) field, a maximum weight capacity field, a field for a weight limitation for the top of rack, and a maximum power consumption field. The basic rack information fields 2210 of the rack details editing page 2200 are similar in many respects to the basic rack information comprised by the rack template as described above with reference to the rack template management flow 210 and a detailed description is omitted here for the sake of brevity.

In some embodiments, the user (e.g., facility designer) may enter one or more values in the basic rack information fields 2210 that may be received by the facility designing component 180 via the input component 150, for example. The user may indicate completion and proceed to a next step in the rack editing process by clicking on and/or touching the next button 2220. The facility designing component 180 may display, via the output component 160, a user interface for adding equipment to a facility, such as a facility equipment adding page of FIG. 23, in response to the next button 2220 having been activated.

Figure 23:
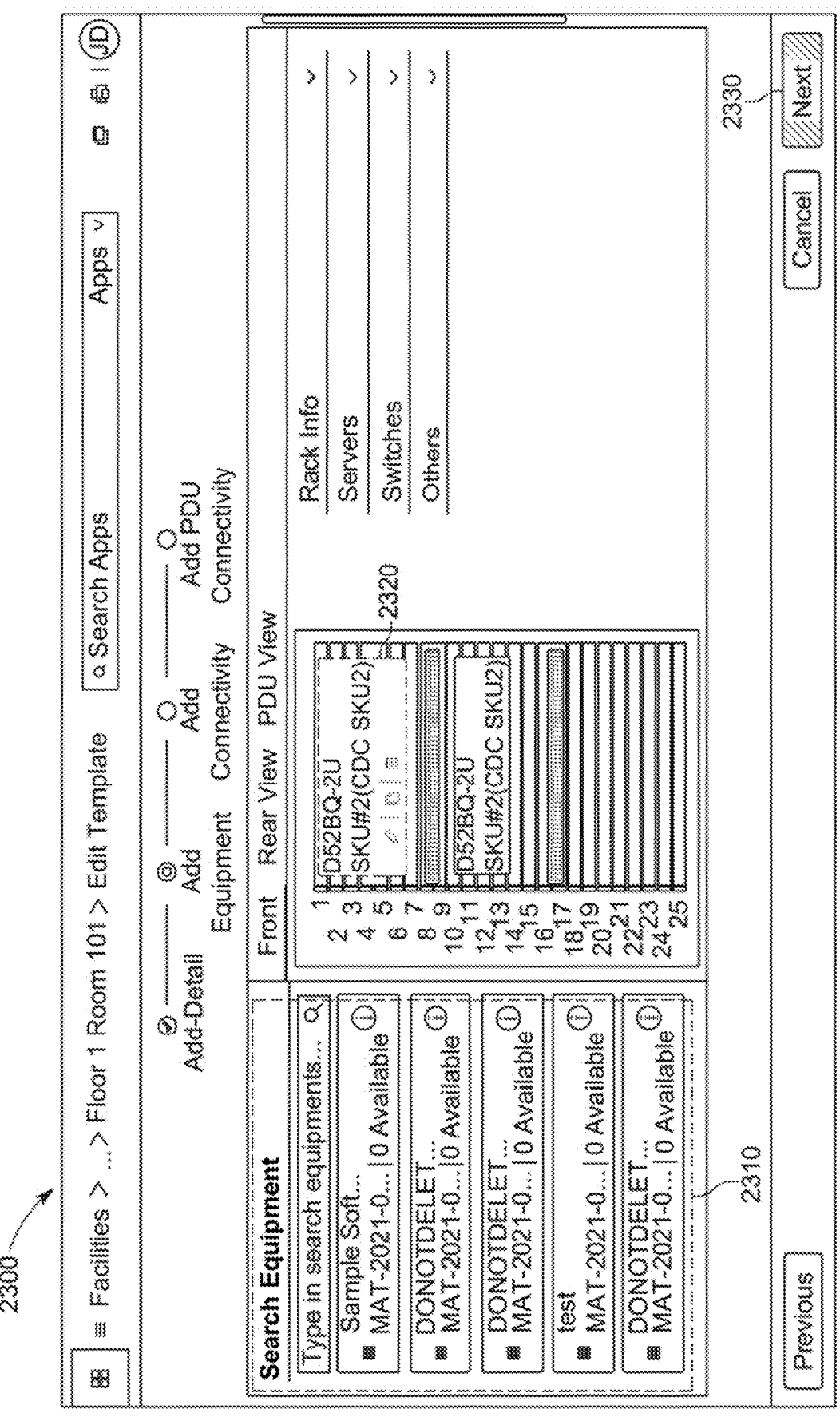
FIG. 23 is an example of a first user interface for adding equipment to a facility, in accordance with various embodiments of the present disclosure.

FIG. 23 is an example of a facility equipment page 2300, in accordance with various embodiments of the present disclosure. The facility equipment page 2300 may be provided by the facility designing component 180 and/or a device 100 comprising the facility designing component 180. For example, the facility equipment page 2300 may be displayed by the output component 160 of the device 100 and/or may receive user inputs via the input component 150 of the device 100. The facility equipment adding page 2300 is similar in many respects to the first user interface for adding equipment 500 of FIG. 5 and the equipment viewing page 700 described above with reference to FIG. 7 and may include additional features not mentioned above.

The facility equipment page 2300 may include a searchable list of equipment 2310 (e.g., network devices such as switches, routers, hubs, firewalls, servers, and the like) that may be added to the selected rack. In some embodiments, the equipment listed on the searchable list of equipment 2310 may be based on equipment detail information 232 obtained from a P&C module and/or database. Alternatively or additionally, the equipment detail information 232 may have been obtained the storage component 140 of the device 100.

The facility equipment page 2300 may show a graphical representation of the selected rack that includes the equipment currently allocated to the rack. The user may select one of the pieces of equipment shown in the graphical representation by clicking on and/or touching the desired piece of equipment. In response to the user selection, the facility equipment page 2300 may display equipment actions 2320. The equipment actions 2320 may comprise one or more equipment management functions that the user may perform on the selected equipment, such as editing the selected equipment (e.g., facility equipment modification page 2400), deleting the selected equipment from the rack, and cloning (e.g., copying) the selected equipment. The facility equipment page 2300 may include a rack information area indicating information about the devices allocated to the rack.

The facility equipment page 2300 may include a next button 2330 to commit the equipment modifications to the rack and proceed to a next step of the facility creation process. That is, the user may indicate completion of the adding equipment step and proceed to a next step in the facility creation process by clicking on and/or touching the next button 2330. The facility designing component 180 may display, via the output component 160, a user interface for defining connectivity of the facility, such as facility connectivity page 2500 of FIG. 25, in response to the next button 2330 having been activated.

Figure 24:
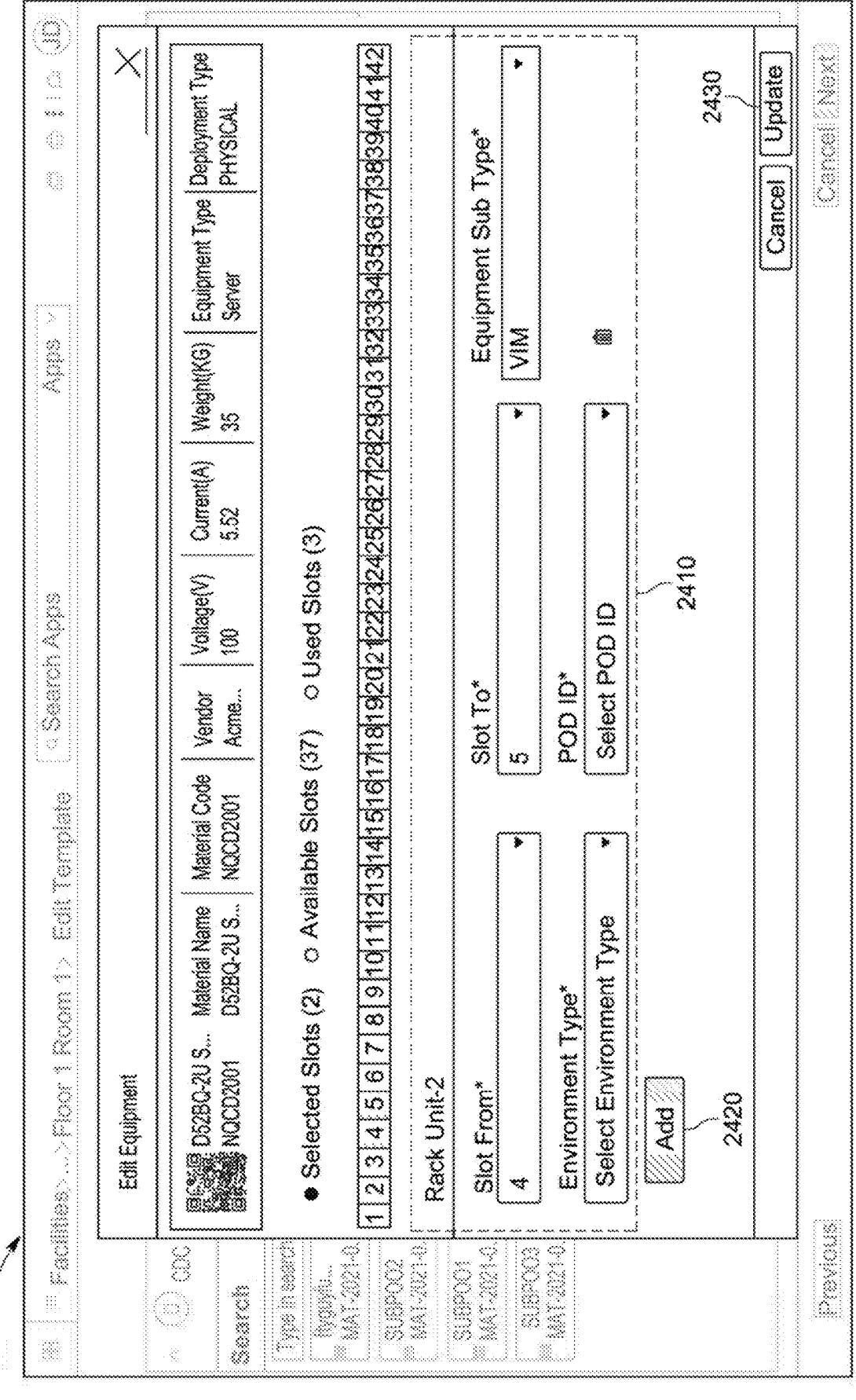
FIG. 24 is an example of a second user interface for adding equipment to a facility, in accordance with various embodiments of the present disclosure.

FIG. 24 is an example of a facility equipment modification page 2400 to a rack template, in accordance with various embodiments of the present disclosure. The facility equipment modification page 2400 may be provided by the facility designing component 180 and/or a device 100 comprising the facility designing component 180. For example, the facility equipment modification page 2400 may be displayed by the output component 160 of the device 100 and/or may receive user inputs via the input component 150 of the device 100. The facility equipment modification page 2400 is similar in many respects to the second user interface for adding equipment 600 described above with reference to FIG. 6 and may include additional features not mentioned above.

The facility equipment modification page 2400 may include fields 2410 for indicating the one or more slots of the rack that will be occupied by the selected device. Alternatively or additionally, the fields 2410 may further include an equipment sub-type field, an environment type field, and a point-of-delivery (POD) ID field. The facility equipment modification page 2400 may include an add button 2420 for adding multiple instances of the selected device to the rack. The facility equipment modification page 2400 may include an update button 2430 to add (e.g., commit) the changes made on the facility equipment modification page 2400 and return to the facility equipment page 2300 of FIG. 23.

Figure 25:
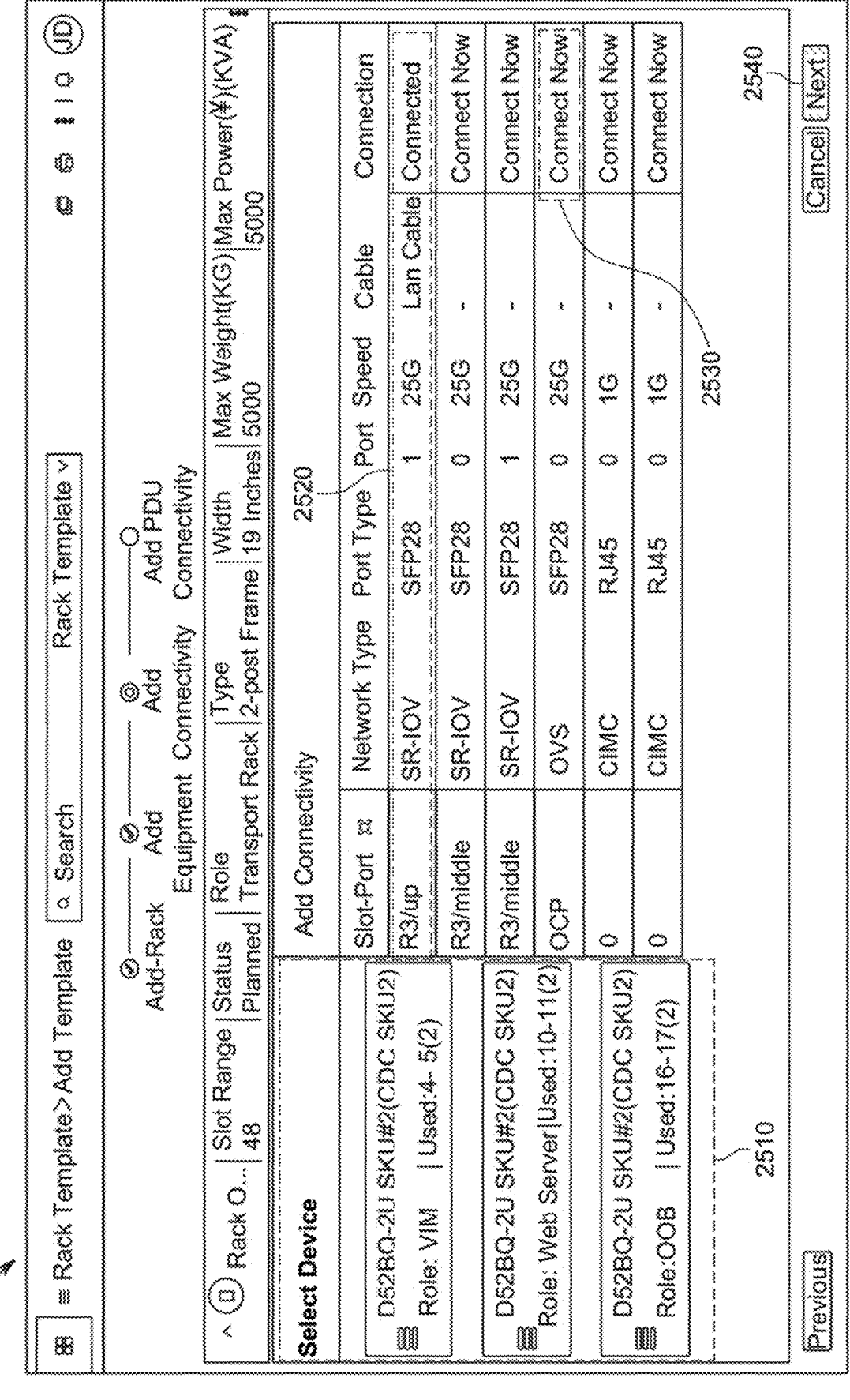
FIG. 25 is an example of a user interface for defining connectivity of a facility, in accordance with various embodiments of the present disclosure.

FIG. 25 is an example of a facility connectivity page 2500, in accordance with various embodiments of the present disclosure. The facility connectivity page 2500 may be provided by the facility designing component 180 and/or a device 100 comprising the facility designing component 180. For example, the facility connectivity page 2500 may be displayed by the output component 160 of the device 100 and/or may receive user inputs via the input component 150 of the device 100. The facility connectivity page 2500 is similar in many respects to the first defining connectivity page 800 described above with reference to FIG. 8 and may include additional features not mentioned above.

The facility connectivity page 2500 may include a list of rack equipment 2510 comprising the equipment currently allocated to the rack. The user may select a device from the list of rack equipment 2510 to which connectivity needs to be defined. For example, the user may click on and/or touch the desired equipment from the list of rack equipment 2510 and the facility connectivity page 2500 may display a list of connection ports of the selected device. The facility connectivity page 2500 may display for each connection port 2520 of the selected device at least one of a slot/port name, a network type, a port type, a port number, a port speed, a cable type, and a connection status. The connection status may indicate that the connection has been defined (e.g., "Connected") and/or may indicate that the connection has not been defined (e.g., "Connect Now"). The "Connect Now" label 2530 may be an active label (e.g., hyperlink) that opens a second user interface for defining connectivity. The second user interface for defining connectivity is similar in many respects to the second defining connectivity page 900 of FIG. 9 and a detailed description is omitted for the sake of brevity.

The facility connectivity page 2500 may include a next button 2540 to commit the connectivity definitions to the rack and proceed to a next step of the facility creation process. That is, the user may indicate completion of the defining connectivity step and proceed to a next step in the facility creation process by clicking on and/or touching the next button 2540. The facility designing component 180 may, in response to the next button 2540 having been activated, display a third room layout page 2700 as described below in reference to FIG. 27.

Figure 26:
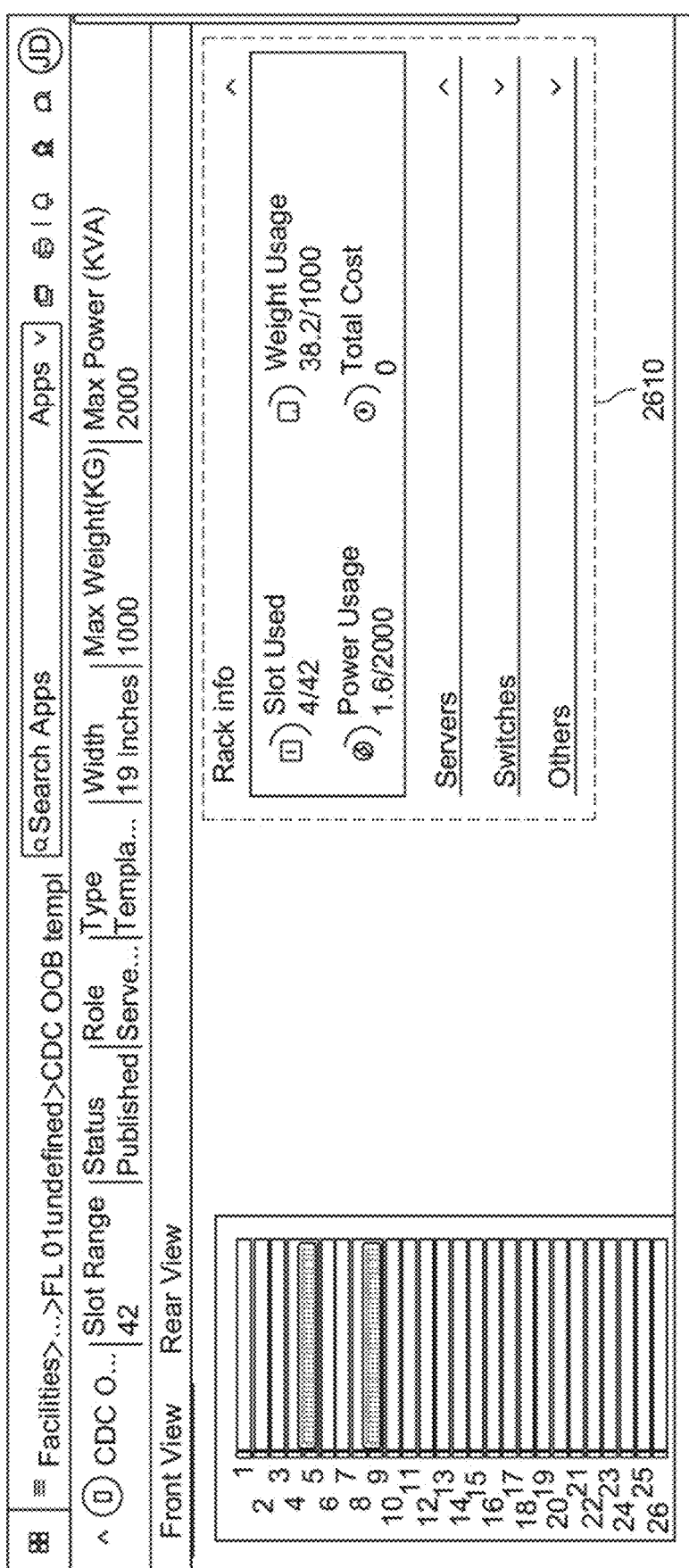
FIG. 26 is an example of a user interface for viewing equipment of a facility, in accordance with various embodiments of the present disclosure.

FIG. 26 is an example of a rack viewing page 2600, in accordance with various embodiments of the present disclosure. The rack viewing page 2600 may be provided by the facility designing component 180 and/or a device 100 comprising the facility designing component 180. For example, the rack viewing page 2600 may be displayed by the output component 160 of the device 100 and/or may receive user inputs via the input component 150 of the device 100. The rack viewing page 2600 is similar in many respects to the equipment viewing page 700 described above with reference to FIG. 7 and may include additional features not mentioned above. The rack viewing page 2600 may include a rack information area 730 indicating information about the devices allocated to the rack.

FIG. 27 is an example of a third room layout page 2700, in accordance with various embodiments of the present disclosure. The third room layout page 2700 may be provided by the facility designing component 180 and/or a device 100 comprising the facility designing component 180. For example, the third room layout page 2700 may be displayed by the output component 160 of the device 100 and/or may receive user inputs via the input component 150 of the device 100. The third room layout page 2700 is similar in many respects to the first room layout page 2000 described above with reference to FIG. 20 and to the second room layout page 2100 described above with reference to FIG. 21 and may include additional features not mentioned above.

The third room layout page 2700 may include a confirm button 2710 to commit the room layout modifications to the facility object and proceed to a next step of the facility creation process. That is, the user may indicate completion of the room layout step and proceed to a next step in the facility creation process by clicking on and/or touching the confirm button 2710. The facility designing component 180 may display, via the output component 160, a user interface for generating hostnames, such as a first hostname generation page 2800 of FIG. 28, in response to the confirm button 2710 having been activated.

FIG. 28 is an example of a first hostname generation page 2800, in accordance with various embodiments of the present disclosure. The first hostname generation page 2800 may be provided by the facility designing component 180 and/or a device 100 comprising the facility designing component 180. For example, the first hostname generation page 2800 may be displayed by the output component 160 of the device 100 and/or may receive user inputs via the input component 150 of the device 100. The first hostname generation page 2800 is similar in many respects to the first floor layout page 1700 of FIG. 17 and the third floor layout page 1900 of FIG. 19 and may include additional features not mentioned above.

The first hostname generation page 2800 may include a generate hostname button 2810 that may open a second hostname generation page 2900 as described below in reference to FIG. 29.

FIG. 29 is an example of a second hostname generation page 2900, in accordance with various embodiments of the present disclosure. The second hostname generation page 2900 may be provided by the facility designing component 180 and/or a device 100 comprising the facility designing component 180. For example, the second hostname generation page 2900 may be displayed by the output component 160 of the device 100 and/or may receive user inputs via the input component 150 of the device 100.

The second hostname generation page 2900 may include a list of equipment associated with a selected floor of the facility object. The second hostname generation page 2900 may for each piece of equipment at least one of an equipment type, an equipment sub-type, a deployment type, an environment type, a location, a POD ID, a UHN, and a status.

The second hostname generation page 2900 may include options for selecting one or more of the equipment listed in the second hostname generation page 2900, such as checkboxes 2910. The second hostname generation page 2900 may include a generate hostname button 2920 that may automatically generate hostnames (e.g., UHNs) for the selected pieces of equipment. In some embodiments, the hostnames may be generated based on the connectivity information of the facility object.

The second hostname generation page 2900 may include a "Generate Now" label 2930 if or when a corresponding piece of equipment does not have an assigned hostname. The "Generate Now" label 2930 may be an active label (e.g., hyperlink) that causes the facility designing component 180 to automatically generate a hostname for the corresponding piece of equipment. Alternatively or additionally, the Generate Now" label 2930 may open a user interface (not shown) for manually entering a hostname for the corresponding equipment.

The second hostname generation page 2900 may include a hostname label 2940 if or when a corresponding piece of equipment has an assigned hostname. The hostname label 2940 may be an active label (e.g., hyperlink) that causes the facility designing component 180 to automatically re-generate a hostname for the corresponding piece of equipment. That is, the current hostname may be replaced by a newly generated hostname. Alternatively or additionally, the hostname label 2940 may open a user interface (not shown) for manually entering and/or editing a hostname for the corresponding equipment.

The second hostname generation page 2900 may include a save button 2950 to commit the equipment hostname assignments to the facility object and proceed to a next step of the facility creation process. That is, the user may indicate completion of the hostname generation step and proceed to a next step in the facility creation process by clicking on and/or touching the save button 2950. The facility designing component 180 may, in response to the save button 2950 having been activated, display a first facility approval page 3000 as described below in reference to FIG. 30.

FIG. 30 is an example of a first facility approval page 3000, in accordance with various embodiments of the present disclosure. The first facility approval page 3000 may be provided by the facility designing component 180 and/or a device 100 comprising the facility designing component 180. For example, the first facility approval page 3000 may be displayed by the output component 160 of the device 100 and/or may receive user inputs via the input component 150 of the device 100. The first facility approval page 3000 is similar in many respects to the first floor layout page 1700 of FIG. 17, the third floor layout page 1900 of FIG. 19, and the first hostname generation page 2800 of FIG. 28, and may include additional features not mentioned above.

The first facility approval page 3000 may include a submit button 3010 to commit the floor layout and hostname information of the corresponding room to the facility object and proceed to a next step of the facility creation process. That is, the user may indicate completion of the floor layout and hostname generation steps and proceed to submit the facility object for approval by clicking on and/or touching the submit button 3010. The first facility approval page 3000 may include a next button 3020 to submit the facility object design for approval and proceed to the approval phase of the facility creation process. That is, the user may indicate completion of the facility design and proceed to submit the facility object for approval by clicking on and/or touching the next button 3020.

The facility designing component 180 may, in response to the next button 3020 having been activated, submit the facility object for approval. Alternatively or additionally, the facility designing component 180 may stop display of the first facility approval page 3000 and return to the facility listing page 1400 described above in reference to FIG. 14.

FIG. 31 is an example of a second facility approval page 3100, in accordance with various embodiments of the present disclosure. The second facility approval page 3100 may be provided by the facility designing component 180 and/or a device 100 comprising the facility designing component 180. For example, the second facility approval page 3100 may be displayed by the output component 160 of the device 100 and/or may receive user inputs via the input component 150 of the device 100. The second facility approval page 3100 is similar in many respects to the facility listing page 1400 of FIG. 14 and may include additional features not mentioned above.

The second facility approval page 3100 may include a list of facility objects. The list of facility objects may comprise facility objects that are awaiting approval and/or facility objects that are in a design phase. That is, the second facility approval page 3100 may list all or a portion of the facility objects created by the facility designing component 180.

The second facility approval page 3100 may open a design approval page 3200 of FIG. 32 in response to a user (e.g., facility manager) selecting a facility object 3110 from the list of facility objects. That is, the user may indicate an intent to review the selected facility object 3110 for approval by clicking on and/or touching the facility object 3110. Alternatively or additionally, the user may provide other user input, via the input component 150, requesting to review the selected facility object 3110 for approval.

FIG. 32 is an example of a design approval page 3200, in accordance with various embodiments of the present disclosure. The design approval page 3200 may be provided by the facility designing component 180 and/or a device 100 comprising the facility designing component 180. For example, the design approval page 3200 may be displayed by the output component 160 of the device 100 and/or may receive user inputs via the input component 150 of the device 100.

The design approval page 3200 may include a list of floors and/or rooms of the selected facility object. The design approval page 3200 may display for each item in the list of floor and/or rooms at least one of a status, a design ID, a floor name, and a room name.

The design approval page 3200 may approval actions 3210 if or when a user (e.g., a facility manager) selects an item from the list of floor and/or rooms. For example, the user may click on and/or touch the selected item and the input component 150 may receive the user selection. The approval actions 3210 may comprise one or more approval functions that the user may perform on the selected item, such as approving the selected item, and rejecting the selected item.

In some embodiments, the facility designing component 180 may notify one or more other users (e.g., a facility designer) whether the selected design has been accepted or rejected. For example, facility designing component 180 may transmit a message (e.g., email, short message service (SMS), automated phone call) to the one or more other users comprising an indication of whether the selected design has been accepted or rejected. Alternatively or additionally, the notification may include remarks provided by the user (e.g., facility manager) regarding the approval and/or rejection of the selected design.

Advantageously, as illustrated in FIGS. 14-32, the facility creation techniques described herein provides for the creation and management of facility objects using rack templates and/or site templates. In addition, the facility creation techniques provide for a visual representation of floor layouts, racks, and equipment that allow for designing floors and/or rooms of a facility. As such, the facility creation techniques described herein may allow for increased design efficiency, visibility and approval of designs, and ease of fault detection, when compared to conventional design and/or management of datacenter facilities.

FIG. 33 is a block diagram of an example apparatus 3300 for designing datacenter facilities. The apparatus 3300 may be a computing device (e.g., device 100 of FIG. 1) or a computing device may include the apparatus 3300. In some embodiments, the apparatus 3300 may include a reception component 3302 configured to receive communications (e.g., wired, wireless) from another apparatus (e.g., apparatus 3308), a facility designing component 180 configured to design datacenter facilities, and a transmission component 3306 configured to transmit communications (e.g., wired, wireless) to another apparatus (e.g., apparatus 3308). The components of the apparatus 3300 may be in communication with one another (e.g., via one or more buses or electrical connections). As shown in FIG. 33, the apparatus 3300 may be in communication with another apparatus 3308 (such as an inventory server, or another computing device) using the reception component 3302 and/or the transmission component 3306.

In some embodiments, the apparatus 3300 may be configured to perform one or more operations described herein in connection with FIGS. 1-32. Alternatively or additionally, the apparatus 3300 may be configured to perform one or more processes described herein, such as method 3400 of FIG. 34. In some embodiments, the apparatus 3300 may include one or more components of the device 100 described above in connection with FIG. 1.

The reception component 3302 may receive communications, such as control information, data communications, or a combination thereof, from the apparatus 3308. The reception component 3302 may provide received communications to one or more other components of the apparatus 3300, such as the facility designing component 180. In some aspects, the reception component 3302 may perform signal processing on the received communications, and may provide the processed signals to the one or more other components. In some embodiments, the reception component 3302 may include one or more antennas, a receive processor, a controller/processor, a memory, or a combination thereof, of the device 100 described above in reference to FIG. 1.

The transmission component 3306 may transmit communications, such as control information, data communications, or a combination thereof, to the apparatus 3308. In some embodiments, the facility designing component 180 may generate communications and may transmit the generated communications to the transmission component 3306 for transmission to the apparatus 3308. In some embodiments, the transmission component 3306 may perform signal processing on the generated communications, and may transmit the processed signals to the apparatus 3308. In other embodiments, the transmission component 3306 may include one or more antennas, a transmit processor, a controller/processor, a memory, or a combination thereof, of the device 100 described above in reference to FIG. 1. In some embodiments, the transmission component 3306 may be co-located with the reception component 3302 such as in a transceiver and/or a transceiver component.

The facility designing component 180 may be configured to design datacenter facilities. In some embodiments, the facility designing component 180 may include a set of components, such as a receiving component 3310 configured to receive a request to create a facility, a loading component 3315 configured to load a set of predefined templates, an associating component 3320 configured to associate one of more instances of at least one predefined template with the facility, a determining component 3325 configured to determine cable connectivity information of the facility, a displaying component 3330 configured to display a graphical representation of the facility, a generating component 3335 configured to generate hostnames for addressable equipment of the facility, a submitting component 3340 configured to submit the facility for approval, and a notifying component 3345 configured to notify whether the facility has been approved.

Alternatively or additionally, the facility designing component 180 may further include an obtaining component 3350 configured to obtain basic facility information of the facility, an adding component 3355 configured to add floor information to the facility, an assigning component 3360 configured to assign slots of a rack template to equipment, and a selecting component 3365 configured to select devices from rack templates.

In other optional or additional embodiments, the set of components may be separate and distinct from the facility designing component 180. In other embodiments, one or more components of the set of components may include or may be implemented within a controller/processor (e.g., the processor 120), a memory (e.g., the memory 130), or a combination thereof, of the device 100 described above in reference to FIG. 1. Alternatively or additionally, one or more components of the set of components may be implemented at least in part as software stored in a memory, such as the memory 130. For example, a component (or a portion of a component) may be implemented as computer-executable instructions or code stored in a computer-readable medium (e.g., a non-transitory computer-readable medium) and executable by a controller or a processor to perform the functions or operations of the component.

The number and arrangement of components shown in FIG. 33 are provided as an example. In practice, there may be additional components, fewer components, different components, or differently arranged components than those shown in FIG. 33. Furthermore, two or more components shown in FIG. 33 may be implemented within a single component, or a single component shown in FIG. 33 may be implemented as multiple, distributed components. Additionally or alternatively, a set of (one or more) components shown in FIG. 33 may perform one or more functions described as being performed by another set of components shown in FIG. 1.

Referring to FIGS. 34-39, in operation, a device 100 may perform a method 3400 of designing a datacenter facility. The method 3400 may be performed by the device 100 (which may include the memory 130 and which may be the entire device 100 and/or one or more components of the device 100, such as the processor 120, the input component 150, the output component 160, the communication interface 170, and/or the facility designing component 180). The method 3400 may be performed by the facility designing component 180 in communication with the apparatus 3308.

At block 3402 of FIG. 34, the method 3400 may include receiving, from a facility designer, a first request to create a first facility. For example, in an embodiment, the device 100, the facility designing component 180, and/or the receiving component 3310 may be configured to or may comprise means for receiving, from a facility designer, a first request to create a first facility.

For example, the receiving at block 3402 may include receiving, via the input component 150, user input from a facility designer activating a user interface control, as described above in reference to FIG. 14. Further, for example, the receiving at block 3402 may be performed to initiate design of the facility.

At block 3404 of FIG. 34, the method 3400 may include loading a set of predefined templates comprising at least one of a site template and a rack template. For example, in an embodiment, the device 100, the facility designing component 180, and/or the loading component 3315 may be configured to or may comprise means for loading a set of predefined templates comprising at least one of a site template and a rack template.

For example, the loading at block 3404 may include loading a site template identifying a corresponding site configuration comprising a set of rack configurations. Alternatively or additionally, the loading at block 3404 may include loading a rack template identifying a corresponding rack configuration comprising a set of equipment. In some embodiments, the loading at block 3404 may include loading the set of predefined templates from a data storage location (e.g., storage component 140 of FIG. 1, a remote server), as described in reference to the facility creation flow 240 of FIG. 2.

Further, for example, the loading at block 3404 may be performed to provide predefined rack templates and/or site templates to aid in the design of the facility. Thus, aspects presented herein may allow for increased design efficiency, visibility and approval of designs, and ease of fault detection, when compared to conventional datacenter design techniques.

At block 3406 of FIG. 34, the method 3400 may include associating, with the first facility, one or more instances of at least one predefined template of the set of predefined templates. For example, in an embodiment, the device 100, the facility designing component 180, and/or the associating component 3320 may be configured to or may comprise means for associating, with the first facility, one or more instances of at least one predefined template of the set of predefined templates.

For example, the associating at block 3406 may include obtaining respective locations of the one or more instances, as described above in reference to FIGS. 20-21. The respective locations of the one or more instances may indicate at least one of a physical position and an orientation within the facility of the respective instance.

Further, for example, the associating at block 3406 may be performed in response to design a facility using predefined rack templates and/or site templates. Thus, aspects presented herein may allow for increased design efficiency, visibility and approval of designs, and ease of fault detection, when compared to conventional datacenter design techniques.

At block 3408 of FIG. 34, the method 3400 may include determining, based on input from the facility designer, cable connectivity information of the first facility. For example, in an embodiment, the device 100, the facility designing component 180, and/or the determining component 3325 may be configured to or may comprise means for determining, based on input from the facility designer, cable connectivity information of the first facility.

For example, the determining at block 3408 may include determining cable connectivity information that identifies one or more cable connections between the set of equipment associated with the first facility, as described above in reference to FIG. 13.

Further, for example, the determining at block 3408 may be performed to obtain cabling information of the facility and determine materials that need to be obtained to construct the facility.

At block 3410 of FIG. 34, the method 3400 may include displaying, via a user interface to the facility designer, a first graphical representation of the first facility indicating the respective locations of the set of equipment associated with the first facility. For example, in an embodiment, the device 100, the facility designing component 180, and/or the displaying component 3330 may be configured to or may comprise means for displaying, via a user interface to the facility designer, a first graphical representation of the first facility indicating the respective locations of the set of equipment associated with the first facility.

For example, the displaying at block 3410 may include displaying, via the output component 160, a room layout user interface, such as the first room layout page 2000 of FIG. 20 and the second room layout page 2100 of FIG. 21.

Further, for example, the displaying at block 3410 may be performed to provide a visual representation of floors and/or rooms in the datacenter facility, as well as, layout of racks and equipment within the datacenter facility. Thus, aspects presented herein may allow for increased design efficiency, visibility and approval of designs, and ease of fault detection, when compared to conventional datacenter design techniques.

At block 3412 of FIG. 34, the method 3400 may include generating, based on the cable connectivity information, one or more hostnames for addressable equipment of the set of equipment associated with the first facility. For example, in an embodiment, the device 100, the facility designing component 180, and/or the generating component 3335 may be configured to or may comprise means for generating, based on the cable connectivity information, one or more hostnames for addressable equipment of the set of equipment associated with the first facility. For example, the generating at block 3412 may include generating one or more UHNs, as described in reference to FIG. 29.

At block 3414 of FIG. 34, the method 3400 may include submitting, to a facility manager, the first facility for approval. For example, in an embodiment, the device 100, the facility designing component 180, and/or the submitting component 3340 may be configured to or may comprise means for submitting, to a facility manager, the first facility for approval. For example, the submitting at block 3414 may include submitting the first facility for approval, as described above in reference to FIG. 30. Further, for example, the submitting at block 3414 may be performed to obtain approval of the facility design prior to initiating construction of the facility. Thus, the facility creation techniques described herein may allow for increased design efficiency, visibility and approval of designs, and ease of fault detection, when compared to conventional design and/or management of datacenter facilities.

At block 3416 of FIG. 34, the method 3400 may include notifying the facility designer whether the first facility has been approved by the facility manager. For example, in an embodiment, the device 100, the facility designing component 180, and/or the notifying component 3345 may be configured to or may comprise means for notifying the facility designer whether the first facility has been approved by the facility manager.

For example, the notifying at block 3416 may include transmitting a message (e.g., email, SMS, automated phone call) to the facility designer comprising an indication of whether the first facility has been approved by the facility manager, as described in reference to FIG. 32. Alternatively or additionally, the message may include remarks provided by the facility manager regarding the approval and/or rejection of the selected design.

Further, for example, the notifying at block 3416 may be performed to notify interested parties (e.g., facility designer) whether the facility design has been approved or rejected. Thus, the facility creation techniques described herein may allow for increased design efficiency, visibility and approval of designs, and ease of fault detection, when compared to conventional design and/or management of datacenter facilities.

Referring to FIG. 35, in an optional or additional embodiments that may be combined with any other embodiment, at block 3502, the method 3400 may further include obtaining, from the facility designer, basic facility information of the first facility. For example, in an embodiment, the device 100, the facility designing component 180, and/or the obtaining component 3350 may be configured to or may comprise means for obtaining, from the facility designer, basic facility information of the first facility. For example, the obtaining at block 3502 may include displaying, via the output component 160, a facility object creation user interface, such as the first facility object creation page 1500 of FIG. 15 and the second facility object creation page 1600 of FIG. 16.

Referring to FIG. 35, in an optional or additional embodiments that may be combined with any other embodiment, at block 3504, the method 3400 may further include adding floor information to the first facility identifying one or more rooms located at a first floor of the first facility. For example, in an embodiment, the device 100, the facility designing component 180, and/or the adding component 3355 may be configured to or may comprise means for adding floor information to the first facility identifying one or more rooms located at a first floor of the first facility. For example, the adding at block 3504 may include displaying, via the output component 160, a floor layout user interface, such as the first floor layout page 1700 of FIG. 17.

In this optional or additional embodiment, at block 3506, the method 3400 may further include displaying, via the user interface to the facility designer, a second graphical representation of a layout of the first floor, according to the floor information. For example, in an embodiment, the device 100, the facility designing component 180, and/or the displaying component 3330 may be configured to or may comprise means for displaying, via the user interface to the facility designer, a second graphical representation of a layout of the first floor, according to the floor information.

For example, the displaying at block 3506 may include displaying, via the output component 160, a room layout user interface, such as the first room layout page 2000 of FIG. 20 and the second room layout page 2100 of FIG. 21. Alternative or additionally, the second graphical representation may indicate a grid numbering pattern dividing the layout of the first floor into a plurality of regions.

In this optional or additional embodiment, at block 3508, the method 3400 may further include receiving, from the facility designer via the user interface, layout information corresponding to the set of equipment associated with the first facility. For example, in an embodiment, the device 100, the facility designing component 180, and/or the receiving component 3310 may be configured to or may comprise means for receiving, from the facility designer via the user interface, layout information corresponding to the set of equipment associated with the first facility.

For example, the receiving at block 3508 may include receiving, via the input component 150, user inputs requesting to add and/or place objects to the room layout area 2040, as described above in reference to FIGS. 20 and 21. Alternatively or additionally, the respective locations may indicate at least one of a floor, a room, and a region of the plurality of regions at which respective equipment is located.

In this optional or additional embodiment, at block 3510, the method 3400 may further include adding the layout information to the first facility. For example, in an embodiment, the device 100, the facility designing component 180, and/or the adding component 3355 may be configured to or may comprise means for adding the layout information to the first facility.

For example, the adding at block 3510 may include receiving, via the input component 150 from the facility designer, an indication of completion of the room layout, as described above in reference to FIG. 27.

In some embodiments, the adding at block 3510 may include receiving, from the facility designer via the user interface, additional layout information corresponding to structural elements located at the first floor of the first facility, and adding the additional layout information to the first facility.

In other optional or additional embodiments, the adding at block 3510 may include generating, based on the layout information of the first facility, a report indicating grid locations of the set of equipment associated with the first facility.

Referring to FIG. 36, in an optional or additional embodiments that may be combined with any other embodiment, at block 3602, the method 3400 may further include displaying, via the user interface to the facility designer, a rack template listing page indicating a set of predefined rack templates. For example, in an embodiment, the device 100, the facility designing component 180, and/or the displaying component 3330 may be configured to or may comprise means for displaying, via the user interface to the facility designer, a rack template listing page indicating a set of predefined rack templates.

For example, the displaying at block 3602 may include displaying, via the output component 160, a rack template listing page 300, as described in reference to FIG. 3.

In this optional or additional embodiment, at block 3604, the method 3400 may further include receiving, from the facility designer, a second request to create a first rack template. For example, in an embodiment, the device 100, the facility designing component 180, and/or the receiving component 3310 may be configured to or may comprise means for receiving, from the facility designer, a second request to create a first rack template.

For example, the receiving at block 3604 may include receiving, via the input component 150, user input from a facility designer activating a user interface control, as described above in reference to FIG. 3. Further, for example, the receiving at block 3604 may be performed to initiate creation of a rack template.

In this optional or additional embodiment, at block 3606, the method 3400 may further include obtaining, from the facility designer, basic rack information of the first rack template. For example, in an embodiment, the device 100, the facility designing component 180, and/or the obtaining component 3350 may be configured to or may comprise means for obtaining, from the facility designer, basic rack information of the first rack template.

For example, the obtaining at block 3606 may include displaying, via the output component 160, a rack template creation user interface, such as the rack template creation page 400 of FIG. 4. The basic rack information may comprise at least one of a name of the first rack template, a status of the first rack template, a role of the first rack template, a type of the first rack template, a slot range of the first rack template, a dimension of the first rack template, a weight of the first rack template, and a maximum power consumption of the first rack template.

In this optional or additional embodiment, at block 3608, the method 3400 may further include assigning one or more slots of the first rack template to one or more equipment from a plurality of equipment. For example, in an embodiment, the device 100, the facility designing component 180, and/or the assigning component 3360 may be configured to or may comprise means for assigning one or more slots of the first rack template to one or more equipment from a plurality of equipment. For example, the assigning at block 3608 may include displaying, via the output component 160, a user interface for adding equipment, such as the first user interface for adding equipment 500 of FIG. 5 and the second user interface for adding equipment 600 of FIG. 6.

In this optional or additional embodiment, at block 3610, the method 3400 may further include determining, based on input from the facility designer, rack connectivity information of the first rack template. For example, in an embodiment, the device 100, the facility designing component 180, and/or the determining component 3325 may be configured to or may comprise means for determining, based on input from the facility designer, rack connectivity information of the first rack template.

For example, the determining at block 3610 may include displaying, via the output component 160, a user interface for defining connectivity, such as the first defining connectivity page 800 of FIG. 8 and the second defining connectivity page 900 of FIG. 9. Alternatively or additionally, the rack connectivity information may identify one or more cable connections of the one or more equipment assigned to the first rack template.

In this optional or additional embodiment, at block 3612, the method 3400 may further include submitting the first rack template to the set of predefined rack templates. For example, in an embodiment, the device 100, the facility designing component 180, and/or the submitting component 3340 may be configured to or may comprise means for submitting the first rack template to the set of predefined rack templates.

For example, the submitting at block 3612 may include submitting the first rack template to the set of predefined rack templates, as described above in reference to FIG. 8.

In some embodiments, the submitting at block 3612 may include displaying, using the rack template listing page, for each predefined rack template of the set of predefined rack templates at least one of a status, a template name, facility type, a slot quantity, and a creation information.

In other optional or additional embodiments, the submitting at block 3612 may include obtaining, from a server, configuration information of the plurality of equipment.

In other optional or additional embodiments, the submitting at block 3612 may include generating second graphical representations of the one or more equipment, according to the configuration information of the plurality of equipment.

Referring to FIG. 37, in an optional or additional embodiments that may be combined with any other embodiment, at block 3702, the method 3400 may further include displaying, via the user interface to the facility designer, a site template listing page indicating a set of predefined site templates. For example, in an embodiment, the device 100, the facility designing component 180, and/or the displaying component 3330 may be configured to or may comprise means for displaying, via the user interface to the facility designer, a site template listing page indicating a set of predefined site templates.

For example, the displaying at block 3702 may include displaying, via the output component 160, a site template listing page 1000, as described in reference to FIG. 10.

In some embodiments, the displaying at block 3702 may include displaying, using the site template listing page 1000, for each predefined site template of the set of predefined site templates at least one of a status, a template name, a rack quantity, a facility type, a facility sub-type, and a creation information.

In this optional or additional embodiment, at block 3704, the method 3400 may further include receiving, from the facility designer, a second request to create a first site template. For example, in an embodiment, the device 100, the facility designing component 180, and/or the receiving component 3310 may be configured to or may comprise means for receiving, from the facility designer, a second request to create a first site template.

For example, the receiving at block 3704 may include receiving, via the input component 150, user input from a facility designer activating a user interface control, as described above in reference to FIG. 10. Further, for example, the receiving at block 3704 may be performed to initiate creation of a site template.

In this optional or additional embodiment, at block 3706, the method 3400 may further include assigning one or more instances of one or more rack templates to the first site template. For example, in an embodiment, the device 100, the facility designing component 180, and/or the assigning component 3360 may be configured to or may comprise means for assigning one or more instances of one or more rack templates to the first site template.

For example, the assigning at block 3706 may include displaying, via the output component 160, a user interface for adding racks to a site template, such as the first rack adding page 1100 of FIG. 11 and the second rack adding page 1200 of FIG. 12.

In this optional or additional embodiment, at block 3708, the method 3400 may further include determining, based on input from the facility designer, site connectivity information of the first site template. For example, in an embodiment, the device 100, the facility designing component 180, and/or the determining component 3325 may be configured to or may comprise means for determining, based on input from the facility designer, site connectivity information of the first site template.

For example, the determining at block 3708 may include displaying, via the output component 160, a user interface for defining connectivity, such as the site connectivity defining page 1300 of FIG. 13. Alternatively or additionally, the site connectivity information may identify one or more cable connections of one or more equipment assigned to the first site template.

In this optional or additional embodiment, at block 3710, the method 3400 may further include submitting the first site template to the set of predefined site templates. For example, in an embodiment, the device 100, the facility designing component 180, and/or the submitting component 3340 may be configured to or may comprise means for submitting the first site template to the set of predefined site templates. For example, the submitting at block 3710 may include causing the first site template to become available for use by other facility management process flows, as described in reference to block 228 of FIG. 2 and FIG. 13.

Referring to FIG. 38, in an optional or additional embodiments that may be combined with any other embodiment, at block 3802, the method 3400 may further include selecting a first rack template of the set of predefined templates. For example, in an embodiment, the device 100, the facility designing component 180, and/or the selecting component 3365 may be configured to or may comprise means for selecting a first rack template of the set of predefined templates. For example, the selecting at block 3802 may include displaying, via the output component 160, a user interface for defining connectivity, such as the first defining connectivity page 800 of FIG. 8.

In this optional or additional embodiment, at block 3804, the method 3400 may further include selecting a first device from one or more devices associated with the first rack template. For example, in an embodiment, the device 100, the facility designing component 180, and/or the selecting component 3365 may be configured to or may comprise means for selecting a first device from one or more devices associated with the first rack template. For example, the selecting at block 3804 may include displaying, via the output component 160, a user interface for defining connectivity, such as the first defining connectivity page 800 of FIG. 8.

In this optional or additional embodiment, at block 3806, the method 3400 may further include displaying, via the user interface to the facility designer, connectivity options for the first device. For example, in an embodiment, the device 100, the facility designing component 180, and/or the displaying component 3330 may be configured to or may comprise means for displaying, via the user interface to the facility designer, connectivity options for the first device. For example, the displaying at block 3806 may include displaying, via the output component 160, a user interface for defining connectivity, such as the first defining connectivity page 800 of FIG. 8.

In this optional or additional embodiment, at block 3808, the method 3400 may further include obtaining first connectivity information of the first device. For example, in an embodiment, the device 100, the facility designing component 180, and/or the obtaining component 3350 may be configured to or may comprise means for obtaining first connectivity information of the first device.

For example, the obtaining at block 3808 may include displaying, via the output component 160, a user interface for defining connectivity, such as the second defining connectivity page 900 of FIG. 9. Alternatively or additionally, the first connectivity information of the first device may comprise at least one of connection information of the first device, connection information of a second device, and configuration information of a cable connecting the first device with the second device.

In this optional or additional embodiment, at block 3810, the method 3400 may further include adding the first connectivity information to the first rack template. For example, in an embodiment, the device 100, the facility designing component 180, and/or the adding component 3355 may be configured to or may comprise means for adding the first connectivity information to the first rack template.

For example, the adding at block 3810 may include displaying, via the output component 160, a user interface for defining connectivity, such as the second defining connectivity page 900 of FIG. 9.

Referring to FIG. 39, in an optional or additional embodiments that may be combined with any other embodiment, at block 3902, the method 3400 may further include displaying, via the user interface to the facility designer, site information of a site associated with the first facility. For example, in an embodiment, the device 100, the facility designing component 180, and/or the displaying component 3330 may be configured to or may comprise means for displaying, via the user interface to the facility designer, site information of a site associated with the first facility.

For example, the displaying at block 3902 may include displaying, via the output component 160, a user interface for adding racks to a site template, such as the second rack adding page 1200 of FIG. 12. Alternatively or additionally, the site information may comprise at least one of a first quantity of racks associated with the site, a second quantity of slots associated with the site, a third quantity of available slots associated with the site, a fourth quantity of servers associated with the site, a total quantity of top-of-row (ToR) slots that have been allocated, a total quantity of out-of-band (OOB) devices associated with the site, a total weight of equipment associated with the site, and a total cost of the equipment associated with the site.

Referring to FIG. 39, in an optional or additional embodiments that may be combined with any other embodiment, at block 3904, the method 3400 may further include generating, based on the cable connectivity information of the first facility, a first report. For example, in an embodiment, the device 100, the facility designing component 180, and/or the generating component 3335 may be configured to or may comprise means for generating, based on the cable connectivity information of the first facility, a first report.

For example, the generating at block 3904 may include generating the first report as described in reference to block 246 of FIG. 2. Alternatively or additionally, the first report may comprise wiring matrix information indicating first physical connection information of first ends of one or more cables, second physical connection information of second ends of the one or more cables, and cable information of the one or more cables In this optional or additional embodiment, at block 3906, the method 3400 may further include generating, based on the set of equipment associated with the first facility, a second report. For example, in an embodiment, the device 100, the facility designing component 180, and/or the generating component 3335 may be configured to or may comprise means for generating, based on the set of equipment associated with the first facility, a second report.

For example, the generating at block 3906 may include generating the second report as described in reference to block 246 of FIG. 2. Alternatively or additionally, the second report may comprise material ordering information, such as a BOM.

The foregoing disclosure provides illustration and description, but is not intended to be exhaustive or to limit the implementations to the precise form disclosed. Modifications and variations are possible in light of the above disclosure or may be acquired from practice of the implementations.

It is understood that the specific order or hierarchy of blocks in the processes/flowcharts disclosed herein is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

Some embodiments may relate to a system, a method, and/or a computer readable medium at any possible technical detail level of integration. Further, one or more of the above components described above may be implemented as instructions stored on a computer readable medium and executable by at least one processor (and/or may include at least one processor). The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

What is claimed is:

1. A method of designing a datacenter facility by an apparatus, the method comprising:

receiving, by a processor of the apparatus from a facility designer, a first request to create a first facility;

loading, by the processor, a set of predefined templates comprising at least one of a site template and a rack template, the site template identifying a corresponding site configuration comprising a set of rack configurations, and the rack template identifying a corresponding rack configuration comprising a set of equipment;

associating, by the processor, with the first facility, one or more instances of at least one predefined template of the set of predefined templates, the one or more instances indicating respective locations of at least one of the corresponding site configuration and the corresponding rack configuration, the respective locations indicating at least one of a physical position and an orientation within the first facility;

determining, by the processor, based on input from the facility designer, cable connectivity information of the first facility, the cable connectivity information identifying one or more cable connections between the set of equipment associated with the first facility;

displaying, by the processor, via a user interface to the facility designer, a first graphical representation of the first facility indicating the respective locations of the set of equipment associated with the first facility;

generating, by the processor, based on the cable connectivity information, one or more hostnames for addressable equipment of the set of equipment associated with the first facility;

submitting, by the processor, to a facility manager, the first facility for approval; and notifying, by the processor, the facility designer whether the first facility has been approved by the facility manager.

2. The method of claim 1, further comprising:

obtaining, from the facility designer, basic facility information of the first facility, the basic facility information comprising at least one of a facility name, a facility type, a facility sub-type, a facility provider, location information, a parent datacenter, contact information, and facility connectivity information.

3. The method of claim 1, further comprising:

adding floor information to the first facility identifying one or more rooms located at a first floor of the first facility;

displaying, via the user interface to the facility designer, a second graphical representation of a layout of the first floor, according to the floor information, the second graphical representation indicating a grid numbering pattern dividing the layout of the first floor into a plurality of regions;

receiving, from the facility designer via the user interface, layout information corresponding to the set of equipment associated with the first facility, the respective locations indicating at least one of a floor, a room, and a region of the plurality of regions at which respective equipment is located; and adding the layout information to the first facility.

4. The method of claim 3, further comprising:

receiving, from the facility designer via the user interface, additional layout information corresponding to structural elements located at the first floor of the first facility; and adding the additional layout information to the first facility.

5. The method of claim 3, further comprising:

generating, based on the layout information of the first facility, a report indicating grid locations of the set of equipment associated with the first facility.

6. The method of claim 1, further comprising:

displaying, via the user interface to the facility designer, a rack template listing page indicating a set of predefined rack templates;

receiving, from the facility designer, a second request to create a first rack template;

obtaining, from the facility designer, basic rack information of the first rack template, the basic rack information comprising at least one of a name of the first rack template, a status of the first rack template, a role of the first rack template, a type of the first rack template, a slot range of the first rack template, a dimension of the first rack template, a weight of the first rack template, and a maximum power consumption of the first rack template;

assigning one or more slots of the first rack template to one or more equipment from a plurality of equipment;

determining, based on input from the facility designer, rack connectivity information of the first rack template, the rack connectivity information identifying one or more cable connections of the one or more equipment assigned to the first rack template; and submitting the first rack template to the set of predefined rack templates.

7. The method of claim 6, further comprising:

displaying, using the rack template listing page, for each predefined rack template of the set of predefined rack templates at least one of a status, a template name, facility type, a slot quantity, and a creation information.

8. The method of claim 6, further comprising:

obtaining, from a server, configuration information of the plurality of equipment; and generating second graphical representations of the one or more equipment, according to the configuration information of the plurality of equipment.

9. The method of claim 1, further comprising:

displaying, via the user interface to the facility designer, a site template listing page indicating a set of predefined site templates;

receiving, from the facility designer, a second request to create a first site template;

assigning one or more instances of one or more rack templates to the first site template;

determining, based on input from the facility designer, site connectivity information of the first site template, the site connectivity information identifying one or more cable connections of one or more equipment assigned to the first site template; and submitting the first site template to the set of predefined site templates.

10. The method of claim 9, further comprising:

displaying, using the site template listing page, for each predefined site template of the set of predefined site templates at least one of a status, a template name, a rack quantity, a facility type, a facility sub-type, and a creation information.

11. The method of claim 1, further comprising:

selecting a first rack template of the set of predefined templates;

selecting a first device from one or more devices associated with the first rack template;

displaying, via the user interface to the facility designer, connectivity options for the first device;

obtaining first connectivity information of the first device comprising at least one of connection information of the first device, connection information of a second device, and configuration information of a cable connecting the first device with the second device; and adding the first connectivity information to the first rack template.

12. The method of claim 1, further comprising:

displaying, via the user interface to the facility designer, site information of a site associated with the first facility, the site information comprising at least one of a first quantity of racks associated with the site, a second quantity of slots associated with the site, a third quantity of available slots associated with the site, a fourth quantity of servers associated with the site, a total top-of-row (ToR) slots associated with the site, a total out-of-band (OOB) devices associated with the site, a total weight of equipment associated with the site, and a total cost of the equipment associated with the site.

13. The method of claim 1, further comprising:

generating, based on the cable connectivity information of the first facility, a first report comprising wiring matrix information indicating first physical connection information of first ends of one or more cables, second physical connection information of second ends of the one or more cables, and cable information of the one or more cables; and generating, based on the set of equipment associated with the first facility, a second report comprising material ordering information.

14. The method of claim 1, wherein the associating, with the first facility, of the one or more instances of the at least one predefined template of the set of predefined templates comprises:

determining whether a first facility type of the first facility matches a second facility type of the at least one predefined template; and associating, based on determining that the first facility type matches the second facility type, the one or more instances of the at least one predefined template with the first facility.

15. An apparatus for designing a datacenter facility, the apparatus comprising:

a memory storage storing computer-executable instructions; and a processor communicatively coupled to the memory storage, wherein the processor is configured to execute the computer-executable instructions and cause the apparatus to:

receive, from a facility designer, a first request to create a first facility;

load a set of predefined templates comprising at least one of a site template and a rack template, the site template identifying a corresponding site configuration comprising a set of rack configurations, and the rack template identifying a corresponding rack configuration comprising a set of equipment;

associate, with the first facility, one or more instances of at least one predefined template of the set of predefined templates, the one or more instances indicating respective locations of at least one of the corresponding site configuration and the corresponding rack configuration, the respective locations indicating at least one of a physical position and an orientation within the first facility;

determine, based on input from the facility designer, cable connectivity information of the first facility, the cable connectivity information identifying one or more cable connections between the set of equipment associated with the first facility;

display, via a user interface to the facility designer, a first graphical representation of the first facility indicating the respective locations of the set of equipment associated with the first facility;

generate, based on the cable connectivity information, one or more hostnames for addressable equipment of the set of equipment associated with the first facility;

submit, to a facility manager, the first facility for approval; and notify the facility designer whether the first facility has been approved by the facility manager.

16. The apparatus of claim 15, wherein the computer-executable instructions, when executed by the processor, further cause the apparatus to:

add floor information to the first facility identifying one or more rooms located at a first floor of the first facility;

display, via the user interface to the facility designer, a second graphical representation of a layout of the first floor, according to the floor information, the second graphical representation indicating a grid numbering pattern dividing the layout of the first floor into a plurality of regions;

receive, from the facility designer via the user interface, layout information corresponding to the set of equipment associated with the first facility, the respective locations indicating at least one of a floor, a room, and a region of the plurality of regions at which respective equipment is located; and add the layout information to the first facility.

17. The apparatus of claim 15, wherein the computer-executable instructions, when executed by the processor, further cause the apparatus to:

display, via the user interface to the facility designer, a rack template listing page indicating a set of predefined rack templates;

receive, from the facility designer, a second request to create a first rack template;

obtain, from the facility designer, basic rack information of the first rack template, the basic rack information comprising at least one of a name of the first rack template, a status of the first rack template, a role of the first rack template, a type of the first rack template, a slot range of the first rack template, a dimension of the first rack template, a weight of the first rack template, and a maximum power consumption of the first rack template;

assign one or more slots of the first rack template to one or more equipment from a plurality of equipment;

determine, based on input from the facility designer, rack connectivity information of the first rack template, the rack connectivity information identifying one or more cable connections of the one or more equipment assigned to the first rack template; and submit the first rack template to the set of predefined rack templates.

18. The apparatus of claim 15, wherein the computer-executable instructions, when executed by the processor, further cause the apparatus to:

display, via the user interface to the facility designer, a site template listing page indicating a set of predefined site templates;

receive, from the facility designer, a second request to create a first site template;

assigning one or more instances of one or more rack templates to the first site template;

determine, based on input from the facility designer, site connectivity information of the first site template, the site connectivity information identifying one or more cable connections of one or more equipment assigned to the first site template; and submit the first site template to the set of predefined site templates.

19. The apparatus of claim 15, wherein the computer-executable instructions, when executed by the processor, further cause the apparatus to:

select a first rack template of the set of predefined templates;

select a first device from one or more devices associated with the first rack template;

display, via the user interface to the facility designer, connectivity options for the first device;

obtain first connectivity information of the first device comprising at least one of connection information of the first device, connection information of a second device, and configuration information of a cable connecting the first device with the second device; and add the first connectivity information to the first rack template.

20. A non-transitory computer-readable medium comprising computer-executable instructions for designing a data-center facility by an apparatus, wherein the computer-executable instructions, when executed by at least one processor of the apparatus, cause the apparatus to:

receive, from a facility designer, a first request to create a first facility;

load a set of predefined templates comprising at least one of a site template and a rack template, the site template identifying a corresponding site configuration comprising a set of rack configurations, and the rack template identifying a corresponding rack configuration comprising a set of equipment;

associate, with the first facility, one or more instances of at least one predefined template of the set of predefined templates, the one or more instances indicating respective locations of at least one of the corresponding site configuration and the corresponding rack configuration, the respective locations indicating at least one of a physical position and an orientation within the first facility;

determine, based on input from the facility designer, cable connectivity information of the first facility, the cable connectivity information identifying one or more cable connections between the set of equipment associated with the first facility;

display, via a user interface to the facility designer, a first graphical representation of the first facility indicating the respective locations of the set of equipment associated with the first facility;

generate, based on the cable connectivity information, one or more hostnames for addressable equipment of the set of equipment associated with the first facility;

submit, to a facility manager, the first facility for approval; and notify the facility designer whether the first facility has been approved by the facility manager.

* * * * *